US011028251B2

United States Patent
Samejima et al.

(10) Patent No.: US 11,028,251 B2
(45) Date of Patent: Jun. 8, 2021

(54) RESIN COMPOSITION, FILM, INFRARED CUT FILTER, METHOD OF MANUFACTURING INFRARED CUT FILTER, SOLID IMAGE PICKUP ELEMENT, INFRARED SENSOR, AND CAMERA MODULE

(71) Applicant: FUJIFILM Corporation, Tokyo (JP)

(72) Inventors: Suguru Samejima, Shizuoka (JP); Kyohei Arayama, Shizuoka (JP); Kazutaka Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 27 days.

(21) Appl. No.: 16/547,902

(22) Filed: Aug. 22, 2019

(65) Prior Publication Data

US 2019/0375914 A1 Dec. 12, 2019

Related U.S. Application Data

(63) Continuation of application No. PCT/JP2018/004066, filed on Feb. 6, 2018.

(30) Foreign Application Priority Data

Feb. 27, 2017 (JP) .............................. JP2017-035149

(51) Int. Cl.
*C08K 5/3415* (2006.01)
*C08F 220/06* (2006.01)
(Continued)

(52) U.S. Cl.
CPC .......... *C08K 5/3415* (2013.01); *C08F 212/32* (2013.01); *C08F 220/06* (2013.01);
(Continued)

(58) Field of Classification Search
CPC . C08K 5/0041; C08K 5/3415; C08F 220/365; C08F 2/44; C08F 220/1807;
(Continued)

(56) References Cited

U.S. PATENT DOCUMENTS 6,541,181 B1 * 4/2003 Levanon ............... B41C 1/1008
430/270.1
2014/0151615 A1 6/2014 Hitomi et al.
(Continued)

FOREIGN PATENT DOCUMENTS

JP 2011-246649 A 12/2011
JP 201328764 A 2/2013
(Continued)

OTHER PUBLICATIONS

Japanese Office Action, dated Mar. 17, 2020, for corresponding Japanese Application No. 2019-501196, with an English translation.
(Continued)

*Primary Examiner* — William K Cheung
(74) *Attorney, Agent, or Firm* — Birch, Stewart, Kolasch & Birch, LLP

(57) ABSTRACT

Provided is a resin composition including: an infrared absorbing pigment; and a resin having an infrared absorbing group. In addition, provided are a film that is formed using the resin composition, an infrared cut filter, a method of manufacturing an infrared cut filter, a solid image pickup element, an infrared sensor, and a camera module.

29 Claims, 1 Drawing Sheet

(51) Int. Cl.
*C08K 5/41* (2006.01)
*C08K 5/00* (2006.01)
*G03F 7/033* (2006.01)
*C08F 220/36* (2006.01)
*C08F 265/06* (2006.01)
*C08F 212/32* (2006.01)
*C08F 222/10* (2006.01)

(52) U.S. Cl.
CPC .... *C08F 220/365* (2020.02); *C08F 222/1006* (2013.01); *C08F 265/06* (2013.01); *C08K 5/0041* (2013.01); *G03F 7/033* (2013.01)

(58) Field of Classification Search
CPC .................. C08F 220/06; C08F 265/06; C08F 222/1006; C08F 212/32; C08F 220/20; G03F 7/007; G03F 7/033; G03F 7/032; G03F 7/105; G03F 7/027; G02B 5/22; C09D 4/06; C08L 101/12; H01L 27/146
USPC ......................................................... 524/105
See application file for complete search history.

(56) References Cited

U.S. PATENT DOCUMENTS

2017/0012072 A1  1/2017  Tsuruta et al.
2017/0120662 A1* 5/2017  Kokkelenberg ....... B42D 25/00
2017/0137444 A1  5/2017  Sasaki et al.
2018/0136379 A1  5/2018  Takishita et al.

FOREIGN PATENT DOCUMENTS

| JP | 2013-72030 A | 4/2013 |
| KR | 10-1639223 B1 | 7/2016 |
| WO | WO 2015/151999 A1 | 10/2015 |
| WO | WO 2016/031810 A1 | 3/2016 |
| WO | WO 2017/018004 A1 | 2/2017 |

OTHER PUBLICATIONS

International Preliminary Report on Patentability and Written Opinion of the International Searching Authority (Forms PCT/IB/326, PCT/IB/373, and PCT/ISA/210) for International Application No. PCT/JP2018/004066, dated Sep. 6, 2019, with English translation.
International Search Report (Form PCT/ISA/210) for International Application No. PCT/JP2018/004066, dated May 15, 2018, with English translation.
Korean Office Action, dated Jun. 29, 2020, for corresponding Korean Application No. 10-2019-7024584, with an English machine translation.

* cited by examiner

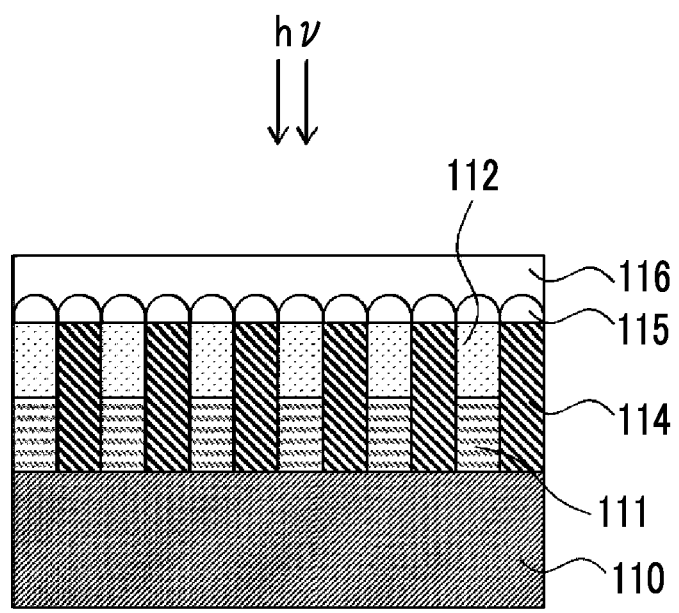

RESIN COMPOSITION, FILM, INFRARED CUT FILTER, METHOD OF MANUFACTURING INFRARED CUT FILTER, SOLID IMAGE PICKUP ELEMENT, INFRARED SENSOR, AND CAMERA MODULE

CROSS-REFERENCE TO RELATED APPLICATIONS

This application is a Continuation of International Application No. PCT/JP2018/004066 filed on Feb. 6, 2018, which claims priority to Japanese Patent Application No. 2017-035149 filed on Feb. 27, 2017. The entire contents of these applications are incorporated herein by reference.

BACKGROUND OF THE INVENTION

1. Field of the Invention

The present disclosure relates to a resin composition, a film, an infrared cut filter, a method of manufacturing an infrared cut filter, a solid image pickup element, an infrared sensor, and a camera module.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using an infrared cut filter.

In addition, JP2011-246649A discloses a pigment dispersion including a pigment (A) and a pigment derivative (B), in which the pigment derivative (B) includes a compound represented by the following Formula (I).

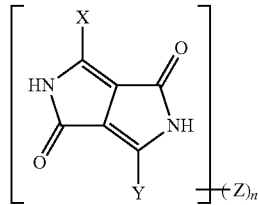

(In Formula (I), X and Y each independently represent an aromatic group which may have a substituent, an alkyl group having 1 to 5 carbon atoms which may have a substituent, an alkoxy group having 1 to 5 carbon atoms which may have a substituent, or an alkylthio group having 1 to 5 carbon atoms which may have a substituent; Z represents a sulfo group, a sulfonamide group, a sulfonate group, a phthalimidomethyl group, a dialkylaminoalkyl group having 3 to 7 carbon atoms, a hydroxyl group, a carboxy group, or a carboxylate group; and n represents 0.01 to 10.)

SUMMARY OF THE INVENTION

In the related art, an infrared cut filter has been used as a flat film. Recently, it has also been considered to form a pattern on an infrared cut filter. For example, the use of a laminate in which each pixel (for example, a red pixel, a blue pixel, or a green pixel) of a color filter is formed on a pattern of an infrared cut filter has been considered.

JP2011-246649A neither describes nor implies formation of a pattern using a resin composition including an infrared absorbing pigment.

However, according to an investigation by the present inventors, it was found that, in a resin composition of the related art including an infrared absorbing pigment, the dispersibility and the transparency in a wavelength range of 400 nm to 650 nm are insufficient in many cases.

An object to be achieved by an embodiment of the present invention is to provide a resin composition with which a film having excellent dispersibility and excellent transparency in a wavelength range of 400 nm to 650 nm can be formed.

In addition, another object to be achieved by another embodiment of the present invention is to provide a film that is formed using the resin composition, an infrared cut filter, a method of manufacturing an infrared cut filter, a solid image pickup element, an infrared sensor, and a camera module.

Means for achieving the objects include the following aspects.

<1> A resin composition comprising:
an infrared absorbing pigment; and
a resin having an infrared absorbing group.

<2> The resin composition according to <1>,
in which the infrared absorbing pigment is at least one pigment selected from the group consisting of a pyrrolopyrrole compound, a diimmonium compound, a rylene compound, a dithiol complex compound, a triarylmethane compound, an azomethine compound, an anthraquinone compound, a dibenzofuranone compound, an oxonol compound, a squarylium compound, a croconium compound, a phthalocyanine compound, a naphthalocyanine compound, a pyrylium compound, an azulenium compound, a pyrromethene compound, and a cyanine compound.

<3> The resin composition according to <1> or <2>,
in which the resin having an infrared absorbing group further includes a steric repulsive group.

<4> The resin composition according to any one of <1> to <3>,
in which a weight-average molecular weight of the resin having an infrared absorbing group is 5,000 to 100,000.

<5> The resin composition according to any one of <1> to <4>, further comprising:
a curable compound.

<6> The resin composition according to <5>, further comprising:
a photopolymerization initiator.

<7> The resin composition according to <5> or <6>, further comprising:
an alkali-soluble resin.

<8> A film which is formed using the resin composition according to any one of <1> to <7>.

<9> A film which is formed by curing the resin composition according to any one of <5> to <7>.

<10> An infrared cut filter comprising:
a film that includes an infrared absorbing pigment and a resin having an infrared absorbing group.

<11> A method of manufacturing an infrared cut filter comprising:
a step of applying the resin composition according to any one of <5> to <7> to a support to form a composition layer;
a step of exposing the composition layer in a pattern shape; and a step of forming a pattern by removing a portion that is not exposed during the exposure by development.

<12> A method of manufacturing an infrared cut filter comprising:

a step of forming a layer that includes an infrared absorbing pigment and a resin having an infrared absorbing group on a support;

a step of forming a photoresist layer on the layer;

a step of obtaining a resist pattern by patterning the photoresist layer by exposure and development; and a step of dry-etching the colored layer by using the resist pattern as an etching mask.

<13> A solid image pickup element comprising:

a film that includes an infrared absorbing pigment and a resin having an infrared absorbing group.

<14> An infrared sensor comprising:

a film that includes an infrared absorbing pigment and a resin having an infrared absorbing group.

<15> A camera module comprising:

a solid image pickup element; and the infrared cut filter according to <10>.

According to the embodiment of the present invention, it is possible to provide a resin composition with which a film having excellent dispersibility and excellent transparency in a wavelength range of 400 nm to 650 nm can be formed.

In addition, according to another embodiment of the present invention it is possible to provide a film that is formed using the resin composition, an infrared cut filter, a method of manufacturing an infrared cut filter, a solid image pickup element, an infrared sensor, and a camera module.

BRIEF DESCRIPTION OF THE DRAWINGS

FIG. 1 is a schematic diagram showing an embodiment of an infrared sensor according to the present disclosure.

DESCRIPTION OF THE PREFERRED EMBODIMENTS

Hereinafter, the details of the present disclosure will be described.

In this specification, "total solid content" denotes the total mass of all the components of a composition excluding a solvent. In addition, "solid content" refers to a component excluding a solvent as described above and, for example, may be solid or liquid at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light generally used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, Ac represents an acetyl group, Bn represents a benzyl group, and Ph represents a phenyl group.

In this specification, the term "step" denotes not only an individual step but also a step which is not clearly distinguishable from another step as long as an effect expected from the step can be achieved.

In addition, in the present disclosure, "mass %" has the same definition as "wt %", and "part(s) by mass" has the same definition as "part(s) by weight".

Further, in the present disclosure, a combination of two or more preferable aspects is a more preferable aspect.

In the present disclosure, "main chain" denotes the longest bonding chain in a molecule of a polymer compound constituting a resin, and "side chain" denotes a molecular chain branched from the main chain.

In this specification, a weight-average molecular weight and a number-average molecular weight are defined as values in terms of polystyrene measured by gel permeation chromatography (GPC).

<Resin Composition>

A resin composition according to an embodiment of the present disclosure (also simply referred to as "composition") includes an infrared absorbing pigment and a resin having an infrared absorbing group.

The present inventors conducted an investigation on the composition including the infrared absorbing pigment and found that the dispersibility of the infrared absorbing pigment is improved by adding a well-known dispersant or adding a well-known dispersant and a well-known dispersing auxiliary agent (synergist). However, a sufficient result was not able to be obtained.

As a result of a thorough investigation by the present inventors, it was found that a resin composition with which a film having excellent dispersibility and excellent transparency in a wavelength range of 400 nm to 650 nm can be obtained can be provided.

The action mechanism of the excellent effect is not clear but is presumed to be as follows.

By using the infrared absorbing pigment and the resin having an infrared absorbing group in combination, the resin having an infrared absorbing group adsorbs to the infrared absorbing pigment through the infrared absorbing group, and the resin chain suppresses aggregation with another infrared absorbing pigment. As a result, it was presumed that the effects of a combination of a dispersant and a dispersing auxiliary agent can be obtained and the dispersibility is excellent.

In addition, the infrared absorbing pigment and the resin having an infrared absorbing group have a small absorption in a wavelength range of 400 nm to 650 nm, the aggregation of the pigment is further suppressed as described above, the dispersibility is excellent, and the particle size of the pigment is reduced. Therefore, it is presumed that the transparency of the obtained film in a wavelength range of 400 nm to 650 nm is also excellent.

Hereinafter, each of the components of the resin composition according to the present disclosure will be described.

(Infrared Absorbing Pigment)

The resin composition according to the embodiment of the present disclosure comprises the infrared absorbing pigment.

The infrared absorbing pigment denotes a material having an absorption at least in an infrared range and has a maximum absorption wavelength preferably in a wavelength range of 650 nm to 1,200 nm, more preferably in a wavelength range of 680 nm to 1,200 nm, and still more preferably in a range of 700 nm to 1,000 nm.

The infrared absorbing pigment may be an organic pigment or an inorganic pigment and is preferably an organic pigment from the viewpoint of spectral characteristics.

From the viewpoints of dispersibility and transparency, the infrared absorbing pigment is preferably at least one pigment selected from the group consisting of a pyrrolopyrrole compound, a diimmonium compound, a rylene compound, a dithiol complex compound, a triarylmethane compound, an azomethine compound, an anthraquinone compound, a dibenzofuranone compound, an oxonol compound, a squarylium compound, a croconium compound, a phthalocyanine compound, a naphthalocyanine compound, a pyrylium compound, an azulenium compound, a pyromethene compound, and a cyanine compound, more preferably at least one pigment selected from the group consisting of a pyrrolopyrrole compound, a diimmonium compound, a squarylium compound, a phthalocyanine compound, a naphthalocyanine compound, an oxonol compound, and a cyanine compound, still more preferably at least one pigment selected from the group consisting of a pyrrolopyrrole compound, a squarylium compound, and a cyanine compound, still more preferably at least one pigment selected from the group consisting of a pyrrolopyrrole compound and a squarylium compound, and most preferably a pyrrolopyrrole compound.

From the viewpoints of dispersibility and transparency, it is preferable that the pyrrolopyrrole compound is a pyrrolopyrrole compound having at least one ring selected from the group consisting of a benzoxazole ring, a benzothiazole ring, and a quinoxaline ring.

In addition, from the viewpoints of dispersibility and transparency, the pyrrolopyrrole compound is preferably a pyrrolopyrrole compound having a diarylborane structure and more preferably a pyrrolopyrrole compound having at least one ring selected from the group consisting of a benzoxazole ring, a benzothiazole ring, and a quinoxaline ring and a diarylborane structure.

Examples of the pyrrolopyrrole compound include a compound described in paragraphs "0016" to "0058" of JP2009-263614A, a compound described in paragraphs "0037" to "0052" of JP2011-068731A, a compound described in paragraphs "0022" to "0053" of WO2015/166,779A, and a compound described in paragraphs "0010" to "0033" of WO2015/166,873A, the contents of which are incorporated herein by reference. Examples of the squarylium compound include a compound described in paragraphs "0044" to "0049" of JP2011-208,101A, the content of which is incorporated herein by reference. Examples of the cyanine compound include a compound described in paragraphs "0044" and "0045" of JP2009-108267A and a compound described in paragraphs "0026" to "0030" of JP2002-194040A, the contents of which are incorporated herein by reference. Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference. Examples of the oxonol compound include a compound described in paragraphs "0039" to "0066" of JP2006-001875A, the content of which is incorporated herein by reference. In addition, as the cyanine compound, the phthalocyanine compound, the diiminium compound, the squarylium compound, or the croconium compound, for example, a compound described in paragraphs "0010" to "0081" of JP2010-111750A may be used, the content of which is incorporated herein by reference. In addition the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

As the pyrrolopyrrole compound, a compound represented by Formula (PP) is preferable. According to this aspect, a cured film having excellent heat resistance and light fastness can be easily obtained.

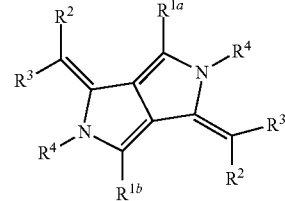

(PP)

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a substituent. The details of Formula (PP) can be found in paragraphs "0017" to "0047" of JP2009-263614A, paragraphs "0011" to "0036" of JP2011-068731A, and paragraphs "0010" to "0024" of WO2015/166873A, the contents of which are incorporated herein by reference.

$R^{1a}$ and $R^{1b}$ each independently represent preferably an aryl group or a heteroaryl group, and more preferably an aryl group. In addition, the alkyl group, the aryl group, and the heteroaryl group represented by $R^{1a}$ to $R^{1b}$ may have a substituent or may be unsubstituted. Examples of the substituent include substituents described in paragraphs "0020" to "0022" of 2009-263614A. Among these, an alkoxy group or a hydroxy group is preferable. The alkoxy group is preferably an alkoxy group having a branched alkyl group. The group represented by $R^{1a}$ and $R^{1b}$ is preferably an aryl group which has an alkoxy group having a branched alkyl group as a substituent, or an aryl group which has a hydroxy group as a substituent. The number of carbon atoms in the branched alkyl group is preferably 3 to 30 and more preferably 3 to 20.

It is preferable that at least one of $R^2$ or $R^3$ represents an electron-withdrawing group, and it is more preferable that $R^2$ represents an electron-withdrawing group (preferably a cyano group) and $R^3$ represents a heteroaryl group. It is preferable that the heteroaryl group includes a 5-membered or 6-membered heteroaryl ring. The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms.

It is preferable that $R^4$ represents a hydrogen atom or a group represented by $-BR^{4A}R^{4B}$. As the substituent represented by $R^{4A}$ and $R^{4B}$, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by $-BR^{4A}R^{4B}$ include a difluoroborane group, a diphenylboronic group, a dibutylboron group, a dinaphthylboron group, and a catecholborane group. In particular, a diphenylboronic group is preferable.

As the squarylium compound, a compound represented by the following Formula (SQ) is preferable.

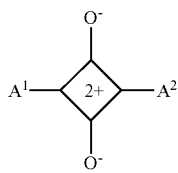

(SQ)

In Formula (SQ), $A^1$ and $A^2$ each independently represent an aryl group, a heteroaryl group, or a group represented by Formula (A-1).

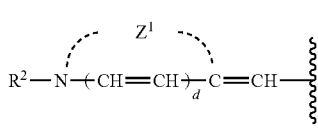

(A-1)

In Formula (A-1), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond.

The details of Formula (SQ) can be found in paragraphs "0020" to "0049" of JP2011-208101A, the content of which is incorporated herein by reference.

As shown below, cations in Formula (SQ) are present without being localized.

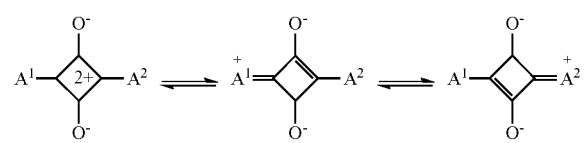

It is preferable that the squarylium compound is a compound represented by the following Formula (SQ-1). This compound has excellent heat resistance.

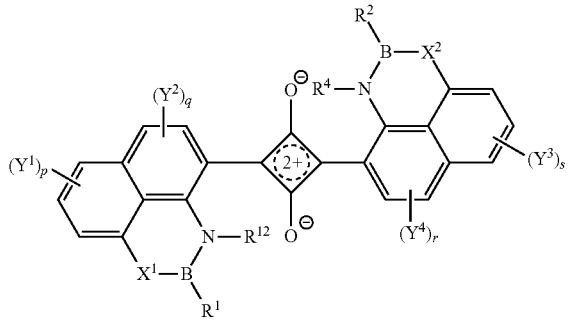

(SQ-1)

In the formula, $R^1$ and $R^2$ each independently represent a substituent, $R^3$ and $R^4$ each independently represent a hydrogen atom or an alkyl group, $X^1$ and $X^2$ each independently $-O-$ or $-N(R^5)-$, $R^5$ represents a hydrogen atom, an alkyl group, an aryl group, or a heteroaryl group, $Y^1$ to $Y^4$ each independently represent a substituent, $Y^1$ and $Y^2$, and $Y^3$ and $Y^4$ may be bonded to each other to form a ring, in a case where a plurality of $Y^1$'s, a plurality of $Y^2$'s, a plurality of $Y^3$'s, and a plurality of $Y^4$'s are present, $Y^1$'s, $Y^2$'s, $Y^3$'s, or $Y^4$'s may be bonded to each other to form a ring, p and s each independently represent an integer of 0 to 3, and q and r each independently represent an integer of 0 to 2.

The details of Formula (SQ-1) can be found in paragraphs "0020" to "0040" of JP2011-208101A, the content of which is incorporated herein by reference. Examples of the squarylium compound include a compound described in paragraphs "0044" to "0049" of JP2011-208101A, the content of which is incorporated herein by reference.

As the cyanine compound, a compound represented by Formula (C) is preferable.

$$R^{101}-N\overset{\oplus}{\underset{\|}{\underset{(CH-CH)_a}{}}}\overset{Z^1}{C}-L^1=C\overset{Z^2}{\underset{\|}{\underset{(CH=CH)_b}{}}}N-R^{102} \quad (X^1)_c$$

$$\underbrace{\hspace{5cm}}_{Cy}$$

(C)

In the formula, $Z^1$ and $Z^2$ each independently represent a non-metal atomic group for forming a 5-membered or 6-membered nitrogen-containing heterocycle which may be fused, $R^{101}$ and $R^{102}$ each independently represent an alkyl group, an alkenyl group, an alkynyl group, an aralkyl group, or an aryl group, $L^1$ represents a methine chain including an odd number of methine groups, a and b each independently represent 0 or 1, in a case where a represents 0, a carbon atom and a nitrogen atom bonded to $Z^1$ are bonded through a double bond, in a case where b represents 0, a carbon atom and a nitrogen atom bonded to $Z^2$ are bonded through a single bond, $X^1$ represents a counter ion, and c represents the number of $X^1$'s for neutralizing charge, and in a case where charge of a site represented by Cy in the formula is neutralized in a molecule, c represents 0.

In addition, examples of the cyanine compound include a compound described in paragraphs "0044" and "0045" of JP2009-108267A, a compound described in paragraphs "0026" to "0030" of JP2002-194040, a compound described in JP2015-172004A, and a compound described in JP2015-172102A, the contents of which are incorporated herein by reference.

In addition, preferable examples of the infrared absorbing pigment used in the present disclosure include the following compounds. However, it is needless to say that the present disclosure is not limited to these examples.
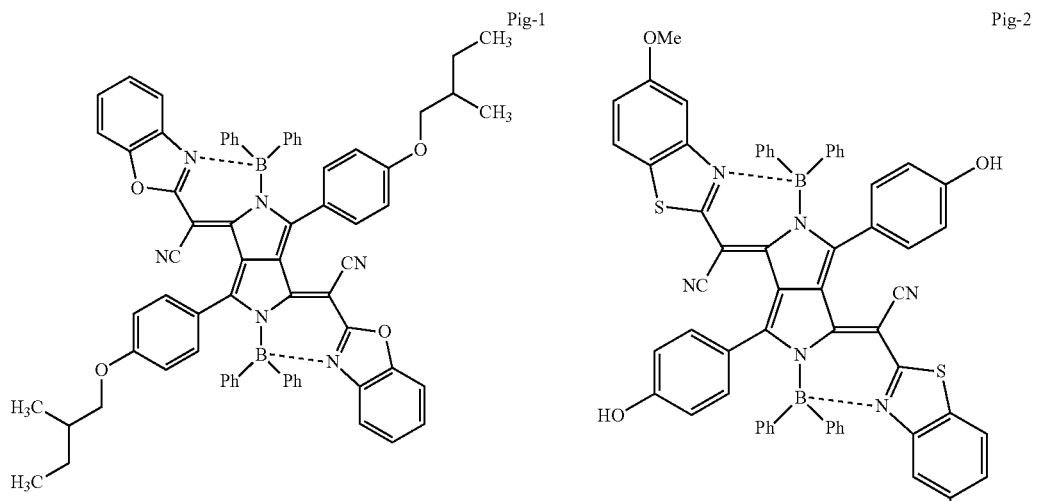
Pig-1
Pig-2
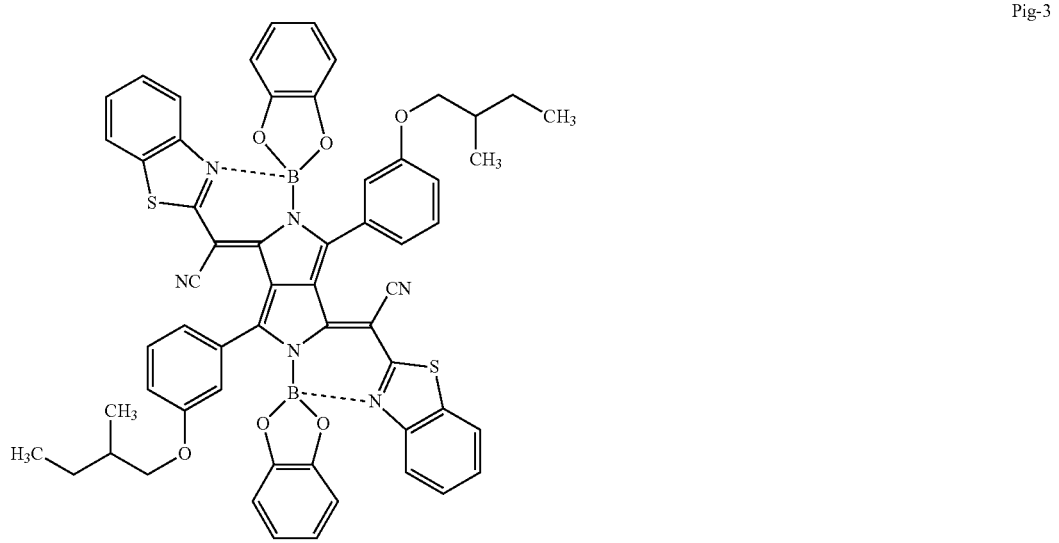
Pig-3
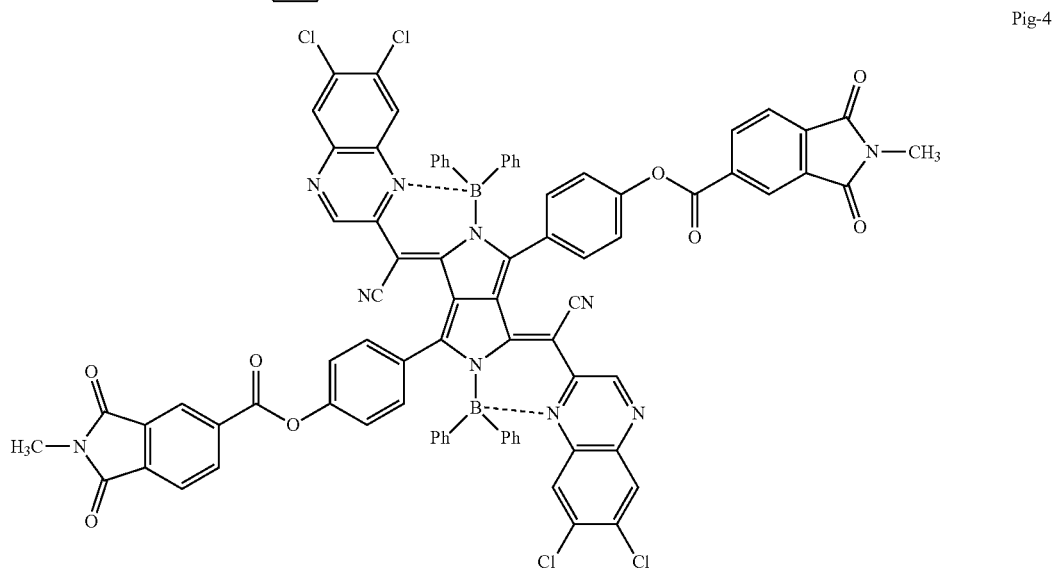
Pig-4

Pig-5
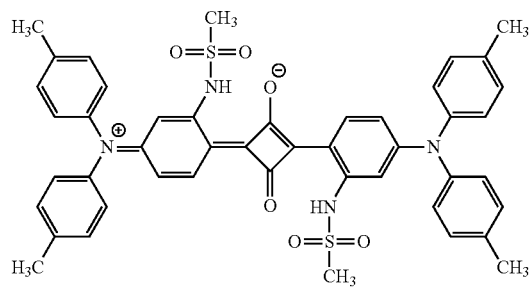
Pig-6
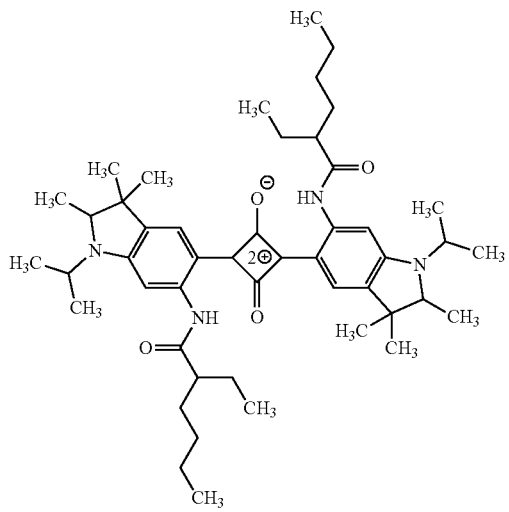
Pig-7
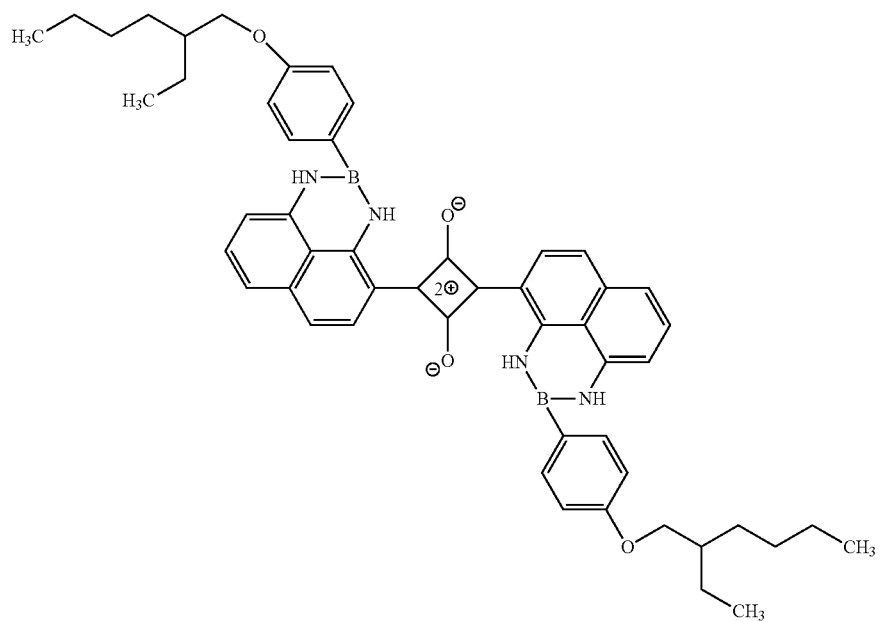
Pig-8
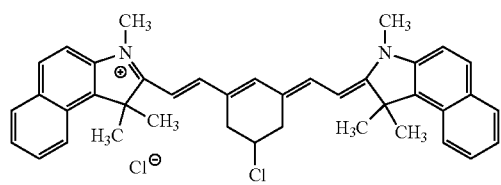
Pig-9
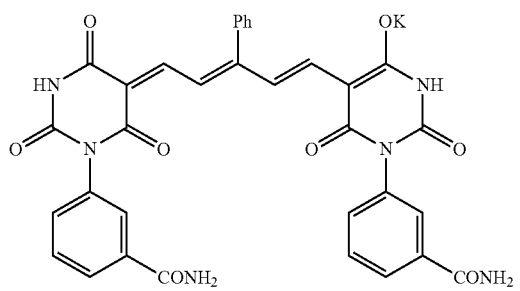

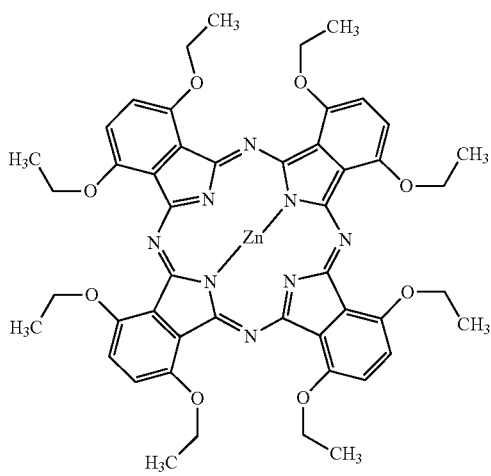

Pig-10

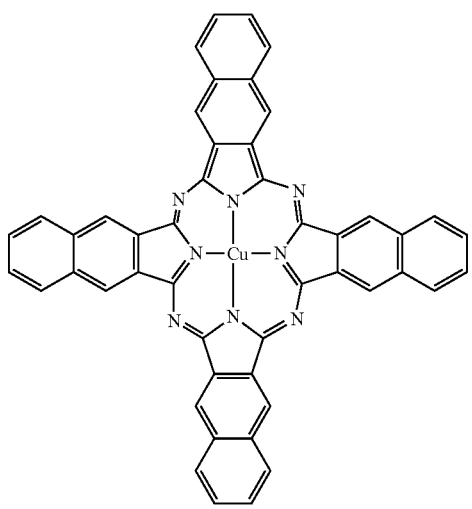

Pig-11

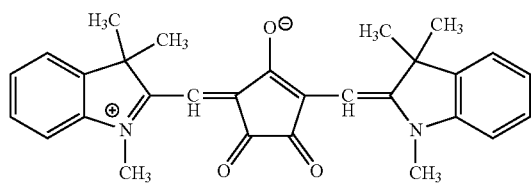

Pig-12

The average particle size of the infrared absorbing pigment is preferably 150 nm or less, more preferably 100 nm or less, and still more preferably 50 nm or less. In addition, the lower limit is preferably 1 nm or more, more preferably 3 nm or more, and still more preferably 5 nm or more.

The volume average particle size of the infrared absorbing pigment in the present disclosure is measured using MICROTRAC UPA 150 (manufactured by Nikkiso Co., Ltd.).

The content of the infrared absorbing pigment is preferably 1 mass % to 50 mass % with respect to the total solid content of the resin composition. The lower limit is more preferably 5 mass % or higher and still more preferably 10 mass % or higher. The upper limit is more preferably 40 mass % or lower, and still more preferably 30 mass % or lower. In a case where the content of the infrared absorbing pigment is in the above-described range, a film having excellent infrared shielding properties, excellent dispersibility, and excellent transparency in a wavelength range of 400 nm to 650 nm can be formed. In the present disclosure, as the near infrared absorbing pigment, one kind may be used alone, or two or more kinds may be used. In a case where two or more infrared absorbing pigments are used in combination, it is preferable that the total content of the two or more infrared absorbing pigments is in the above-described range.

<Resin Having Infrared Absorbing Group>

The resin composition according to the embodiment of the present disclosure comprises the resin having an infrared absorbing group.

From the viewpoints of improving dispersibility and transparency and suppressing film defects caused by foreign matter, the weight-average molecular weight Mw of the resin having an infrared absorbing group is preferably 1,000 or higher, more preferably 5,000 or higher, still more preferably 5,000 to 100,000, and still more preferably 5,000 to 50,000.

It is preferable that the infrared absorbing group is a group having an absorption in an infrared range (preferably in a wavelength range of 700 nm to 1,300 nm and more preferably in a wavelength range of 700 nm to 1,000 nm).

In addition, from the viewpoint of transparency, it is preferable that the resin having an infrared absorbing group has a maximum absorption wavelength in a wavelength range of 650 nm to 1,000 nm.

From the viewpoints of dispersibility and transparency, the infrared absorbing group is preferably a group having at least one structure selected from the group consisting of a pyrrolopyrrole structure, a diimmonium structure, a rylene structure, a dithiol complex structure, a triarylmethane structure, an azomethine structure, an anthraquinone structure, a dibenzofuranone structure, an oxonol structure, a squarylium structure, a croconium structure, a phthalocyanine structure, a naphthalocyanine structure, a pyrylium structure, an azulenium structure, a pyrromethene structure, and a cyanine structure, more preferably a group having at least one structure selected from the group consisting of a pyrrolopyrrole structure, a diimmonium structure, a squarylium structure, a phthalocyanine structure, a naphthalocyanine structure, an oxonol structure, and a cyanine structure, still more preferably a group having at least one structure selected from the group consisting of a pyrrolopyrrole structure, a squarylium structure, and a cyanine structure, still more preferably a group having at least one structure selected from the group consisting of a pyrrolopyrrole structure and a squarylium structure, and most preferably a group having a pyrrolopyrrole structure.

From the viewpoints of dispersibility and transparency, it is preferable that the pyrrolopyrrole structure is a pyrrolopyrrole structure having at least one ring selected from the group consisting of a benzoxazole ring, a benzothiazole ring, and a quinoxaline ring.

In addition, from the viewpoints of dispersibility and transparency, the pyrrolopyrrole structure is preferably a pyrrolopyrrole structure having a diarylborane structure and more preferably a pyrrolopyrrole structure having at least one ring selected from the group consisting of a benzoxazole ring, a benzothiazole ring, and a quinoxaline ring and a diarylborane structure.

Further, from the viewpoints of dispersibility and the aggregation of the infrared absorbing pigment, the infrared absorbing group is preferably a group having a skeleton similar to that of the infrared absorbing pigment, more preferably a group having the same π-conjugated plane structure as that of the infrared absorbing pigment, and still more preferably a group obtained by removing one hydrogen atom from the infrared absorbing pigment. According to the above-described aspect, the resin having an infrared absorbing group is likely to adsorb to the infrared absorbing pigment, the dispersibility of the infrared absorbing pigment can be improved, and an effect of suppressing thixotropy can also be expected.

A resin structure in the resin having an infrared absorbing group is not particularly limited, and examples thereof include an acrylic resin structure, a styrene resin structure, a polyester resin structure, a polyacrylonitrile resin structure, a polycarbonate resin structure, a polyamide resin structure, a polyurethane resin structure, a para-hydroxy styrene resin structure, an epoxy resin structure, a novolac resin structure, and a polyalkylene glycol structure.

In particular, from the viewpoints of improving dispersibility and transparency and suppressing film defects caused by foreign matter, the resin having an infrared absorbing group is preferably a resin having at least one structure selected from the group consisting of an acrylic resin structure, a polyester resin structure, and a polyalkylene glycol structure and more preferably an acrylic resin having an infrared absorbing group.

In addition, the resin having an infrared absorbing group may be a linear resin, a branched or crosslinked resin, a block copolymer, or a graft copolymer.

From the viewpoints of improving dispersibility and transparency and suppressing film defects caused by foreign matter, the resin having an infrared absorbing group is preferably a resin having an acrylic resin structure and a polyester resin structure and more preferably an acrylic resin having a polyester resin structure as a graft chain.

In addition, from the viewpoints of dispersibility and solubility, it is preferable that the resin having an infrared absorbing group includes a steric repulsive group.

The steric repulsive group is not particularly limited as long as it is a group having a large steric hindrance. For example, a polyester resin structure or a polyalkylene glycol structure is preferable, and a polyester resin structure is more preferable.

The polyester resin structure is not particularly limited. For example, a linear polyester resin structure is preferable, and a polycaprolactone structure or a polyvalerolactone structure is more preferable.

In addition, from the viewpoints of improving dispersibility and transparency and suppressing film defects caused by foreign matter, the resin having an infrared absorbing group is preferably a resin that includes a constitutional unit having an infrared absorbing group and more preferably an acrylic resin that includes a constitutional unit having an infrared absorbing group.

From the viewpoints of improving dispersibility and transparency and suppressing film defects caused by foreign matter, for example, the constitutional unit having an infrared absorbing group is preferably a constitutional unit represented by any one of the following Formulae Ac-1 to Ac-8, more preferably a constitutional unit represented by any one of the following Formulae Ac-1 to Ac-4, and still more preferably a constitutional unit represented by the following Formula Ac-1.

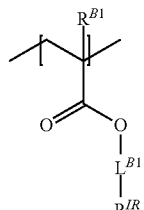

Formula Ac-1

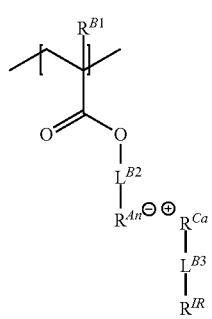

Formula Ac-2

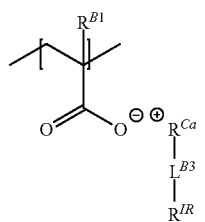

Formula Ac-3

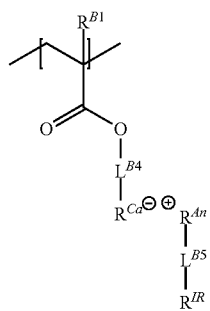

Formula Ac-4

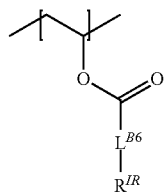

Formula Ac-5

-continued

Formula Ac-6

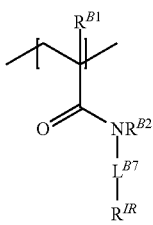

Formula Ac-7

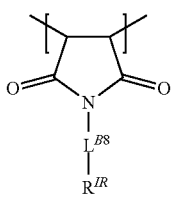

Formula Ac-8

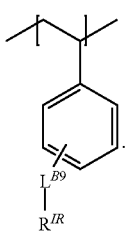

In Formulae Ac-1 to Ac-8, $R^{B1}$'s each independently represent a hydrogen atom or a methyl group, $R^{B2}$'s each independently represent a hydrogen atom or an alkyl group, $R^{IR}$'s each independently represent an infrared absorbing group, $L^{B1}$ to $L^{B9}$ each independently represent a single bond or a divalent linking group having 1 to 60 carbon atoms, $R^{An-}$'s each independently represent an anionic group, and $R^{Ca+}$ each independently represent a cationic group.

It is preferable that $R^{B2}$ represents a hydrogen atom.

Preferable aspects of $R^{IR}$ are each independently the same as those of the infrared absorbing group.

$L^{B1}$ to $L^{B8}$ each independently represent a divalent linking group having 1 to 60 carbon atoms and more preferably a divalent linking group having 1 to 30 carbon atoms.

$L^{B9}$'s each independently represent preferably a single bond or a divalent linking group having 1 to 30 carbon atoms and more preferably a single bond.

The divalent linking group represented by $L^{B1}$ to $L^{B9}$ is preferably an alkylene group or a group including a combination of one or more alkylene groups and one or more groups selected from the group consisting of an ether bond, a thioether bond, an ester bond, an amide bond, a urethane bond, a urea bond, and a carbonate bond, more preferably an alkylene group or a group including a combination of one or more alkylene groups and one or more groups selected from the group consisting of an ether bond, a thioether bond, an ester bond, and an amide bond.

$R^A$'s each independently represent preferably an acid anion group, more preferably a carboxylate anion group, a phosphate anion group, or a sulfonate anion group, and still more preferably a carboxylate anion group.

$R^{ca}$'s each independently represent preferably an ammonium group, more preferably a dialkylammonium group or a trialkylammonium group, and still more preferably a diethylammonium group or a triethylammonium group.

Specific preferable examples of the constitutional units represented by Formulae Ac-1 to Ac-8 include the following constitutional units. However, it is needless to say that the present disclosure is not limited to these examples.

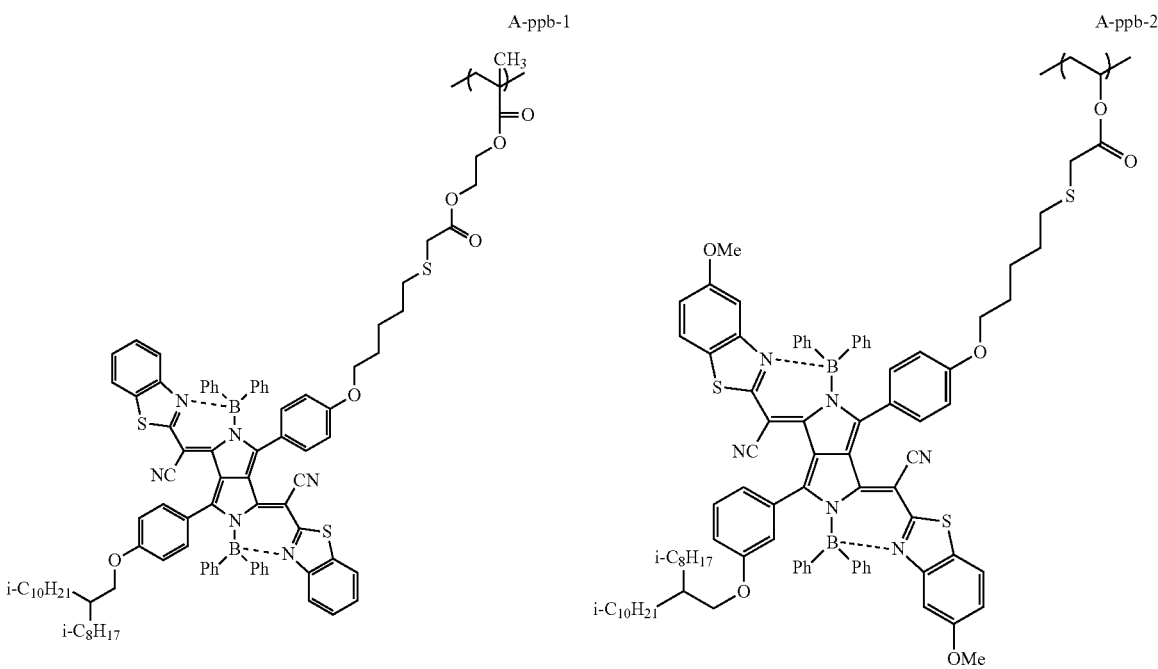

-continued
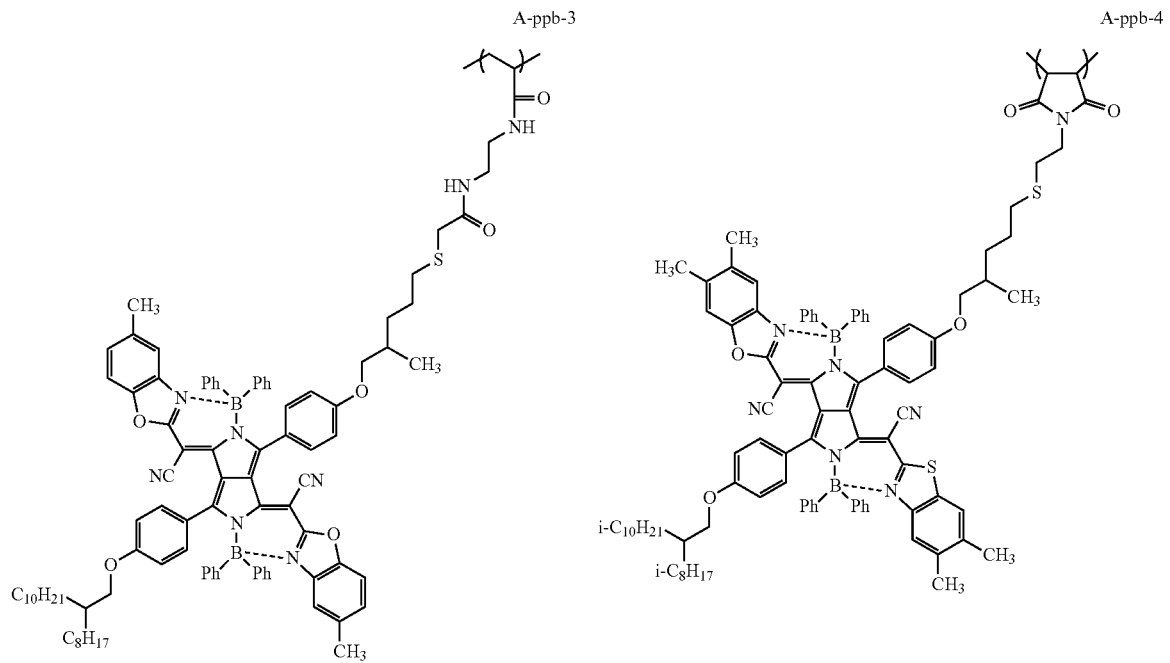
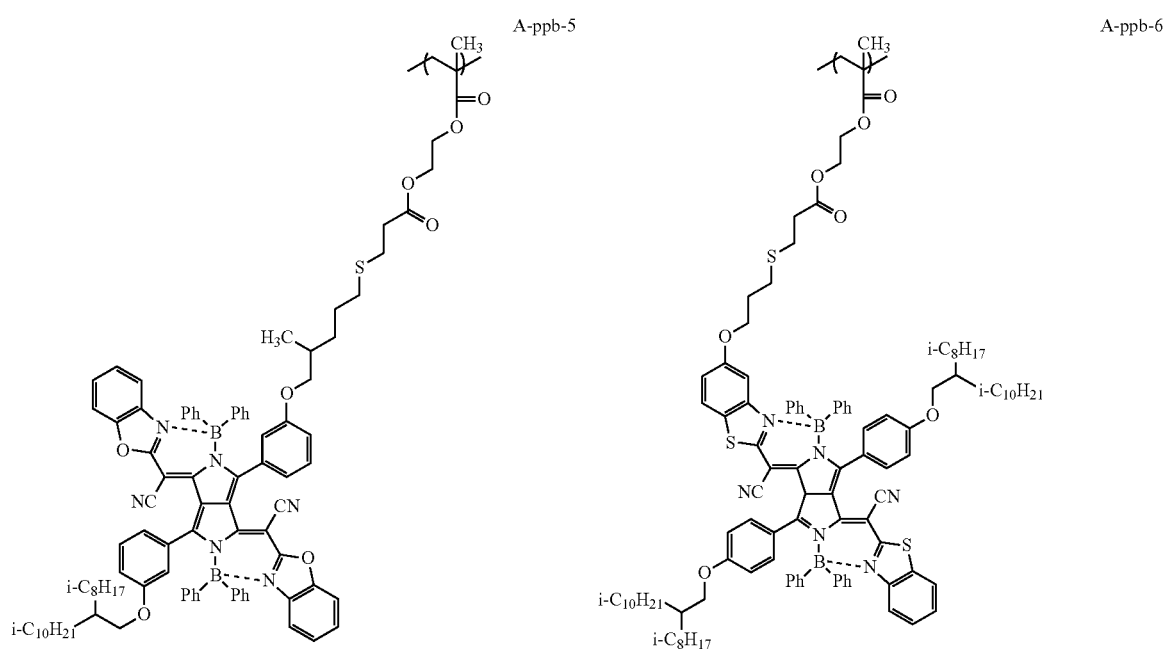

-continued
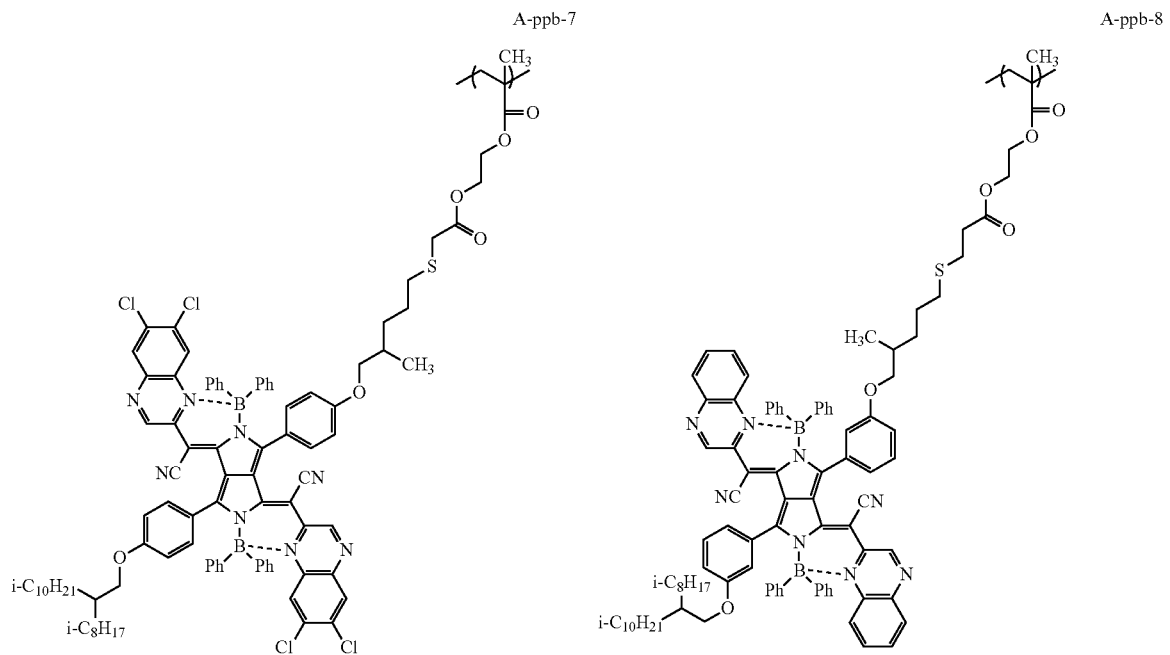
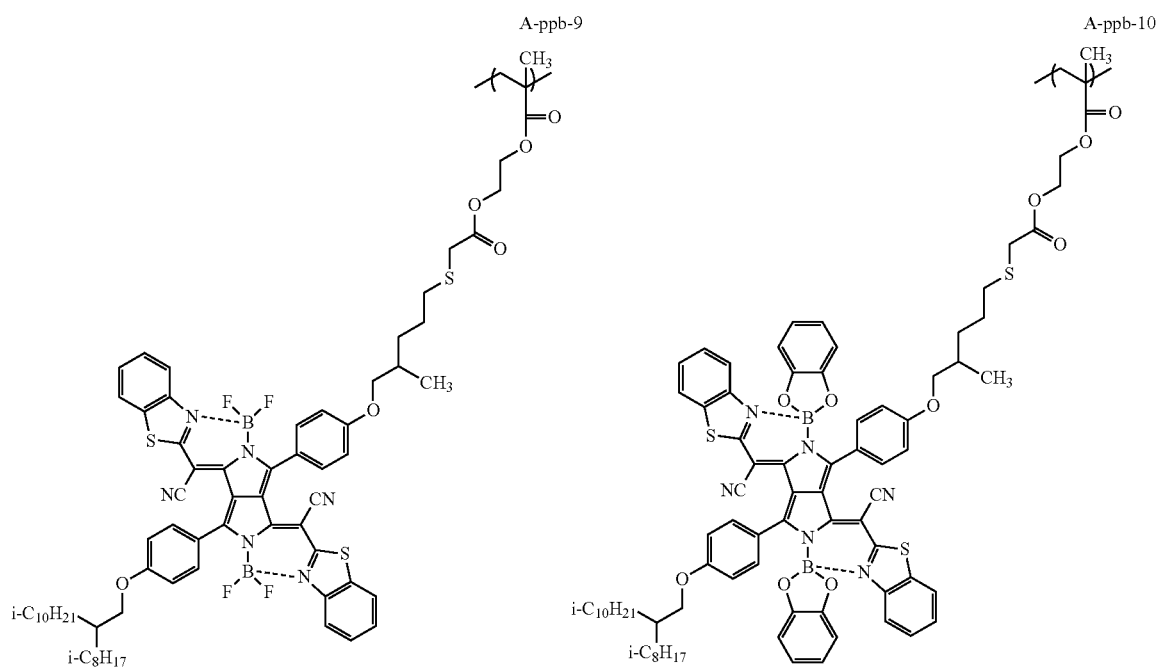

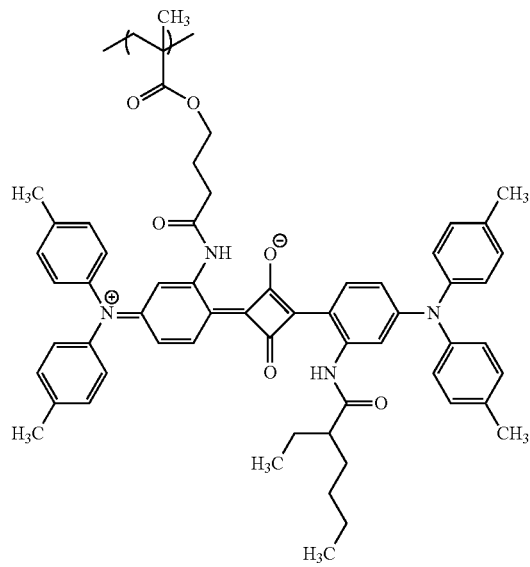
A-sq-1
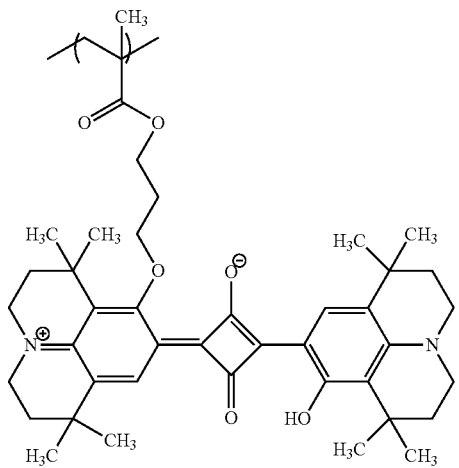
A-sq-2
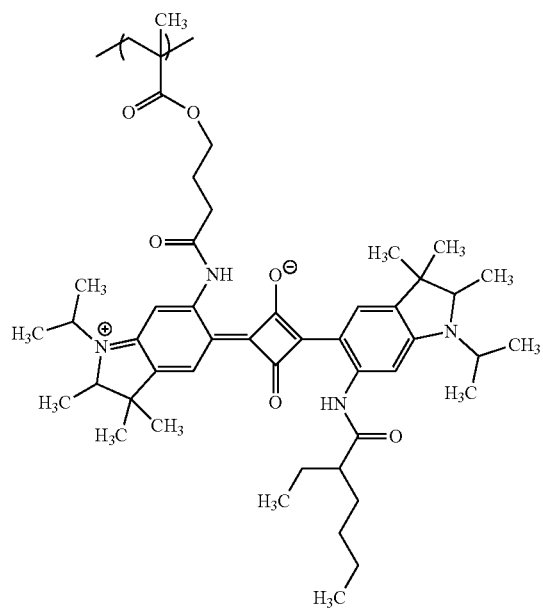
A-sq-3
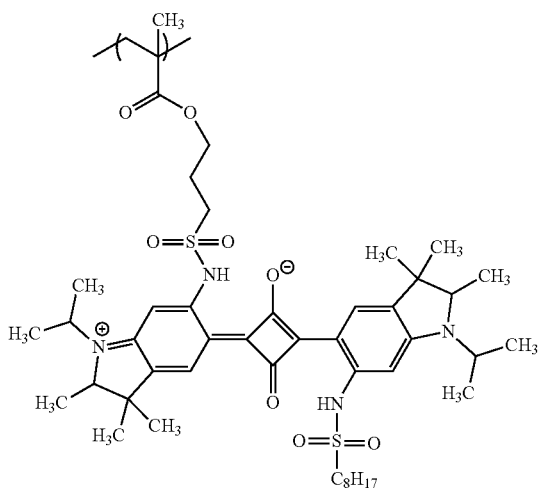
A-sq-4

-continued
A-sq-5
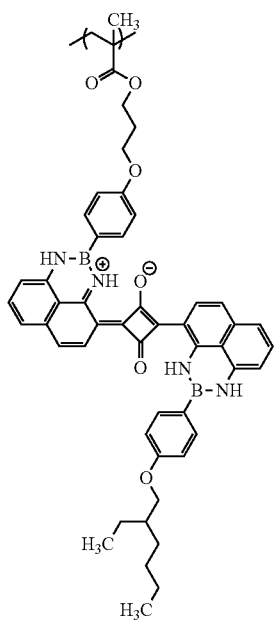
A-cy-1
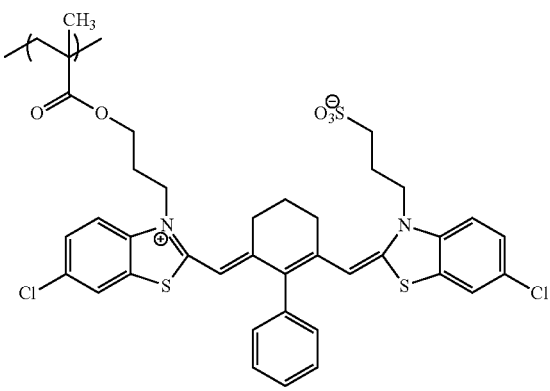
A-cy-2
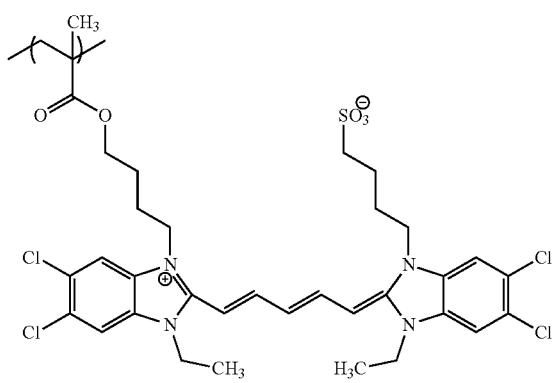
A-cy-3
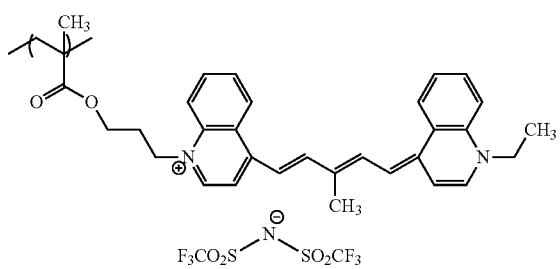
A-cy-4
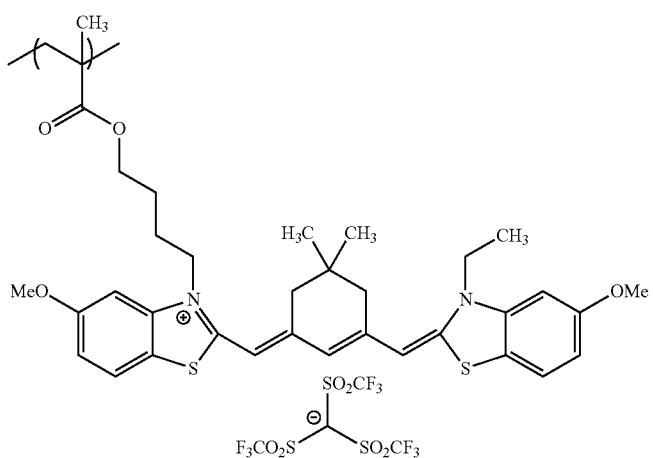

-continued
A-ox-1
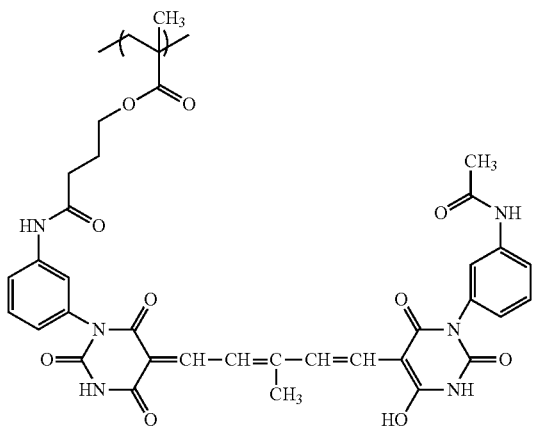
A-ox-2
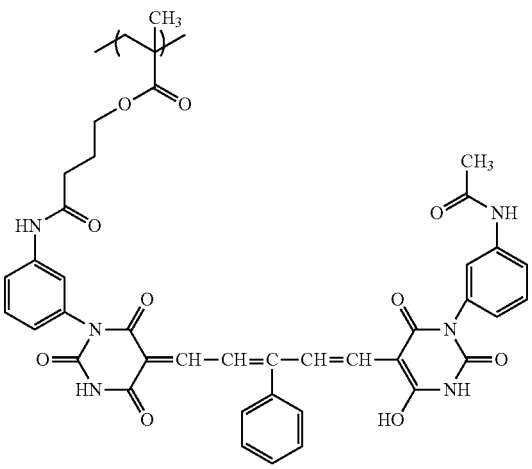
A-ox-3
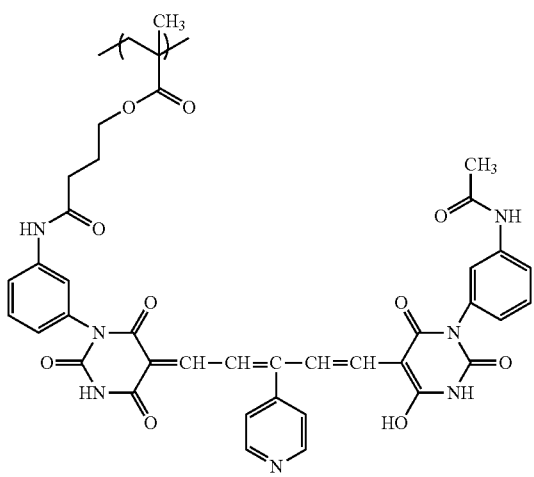
A-ox-4
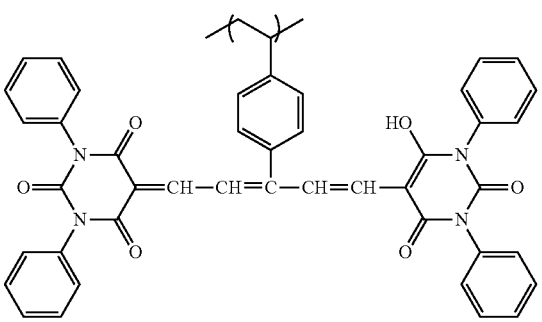
A-ph-1
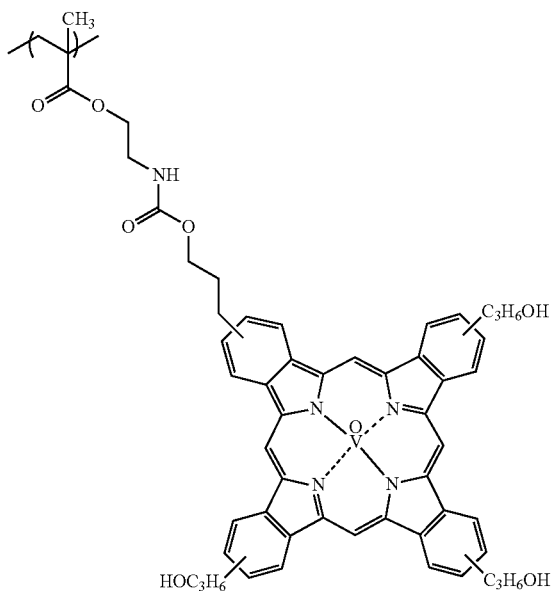
A-ph-2
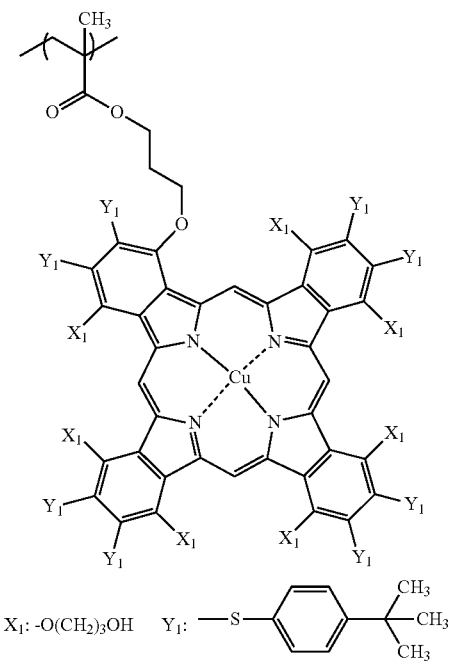
$X_1$: -O(CH$_2$)$_3$OH   $Y_1$: —S—⟨C$_6$H$_4$⟩—C(CH$_3$)$_3$ -continued
A-ph-3
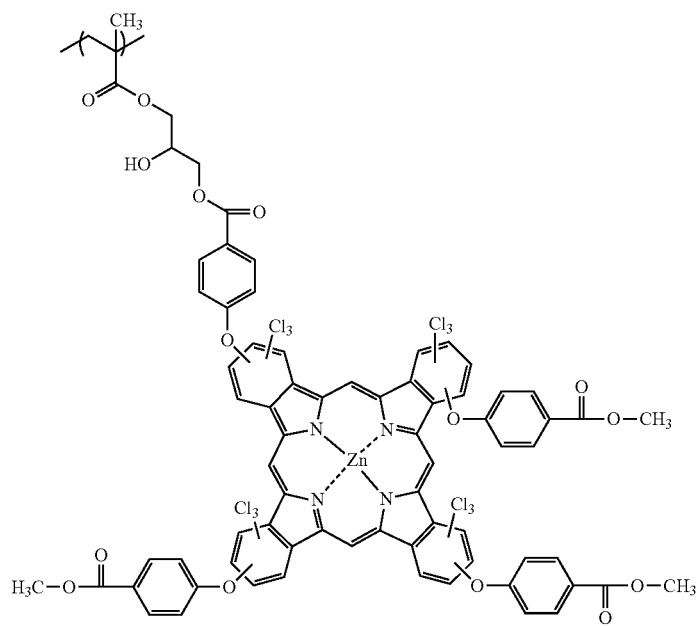
A-na-1
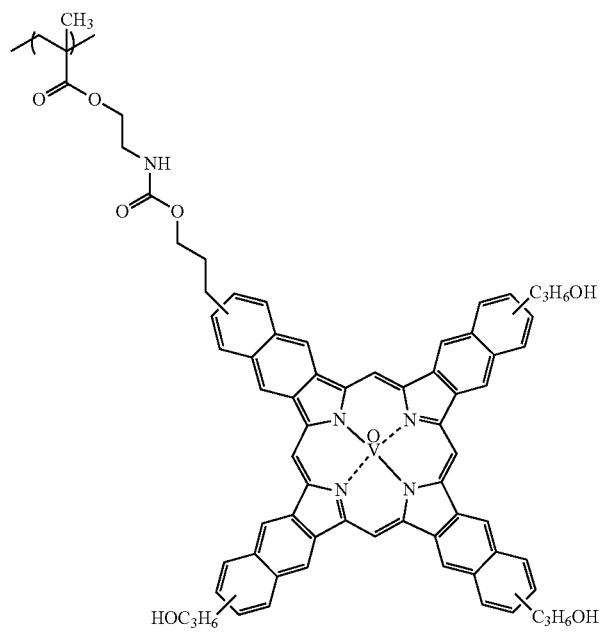

-continued
A-na-2
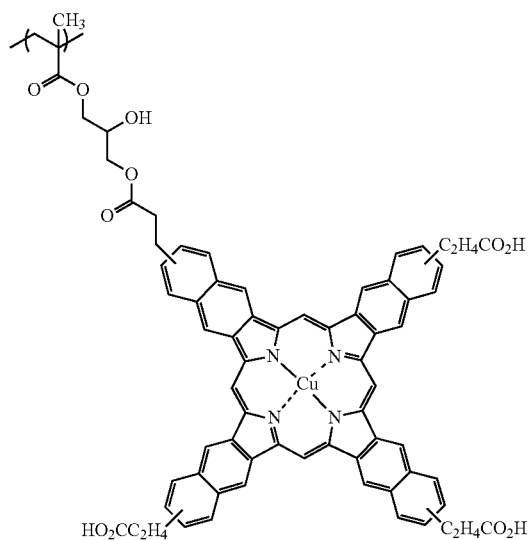
A-na-3
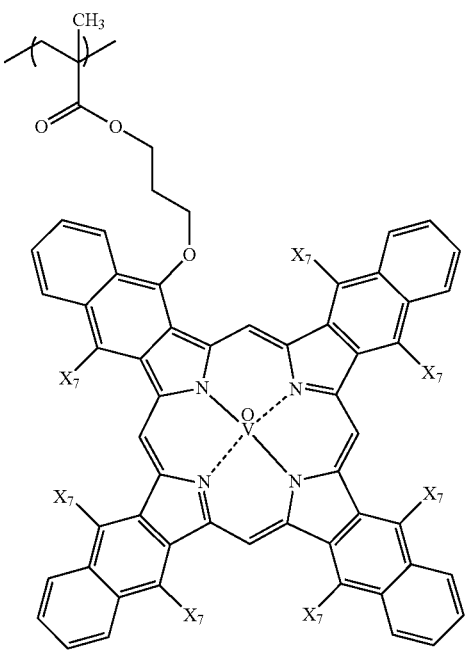
X$_7$: -O(CH$_2$)$_3$OH
A-cr-1
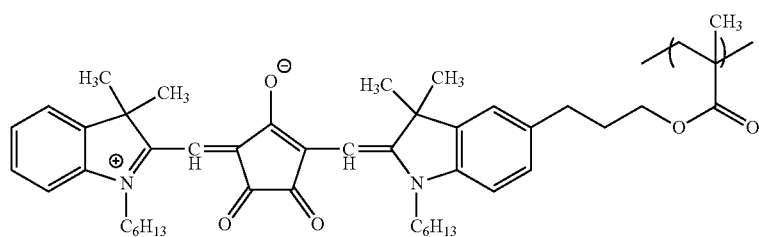
C-ppb-1
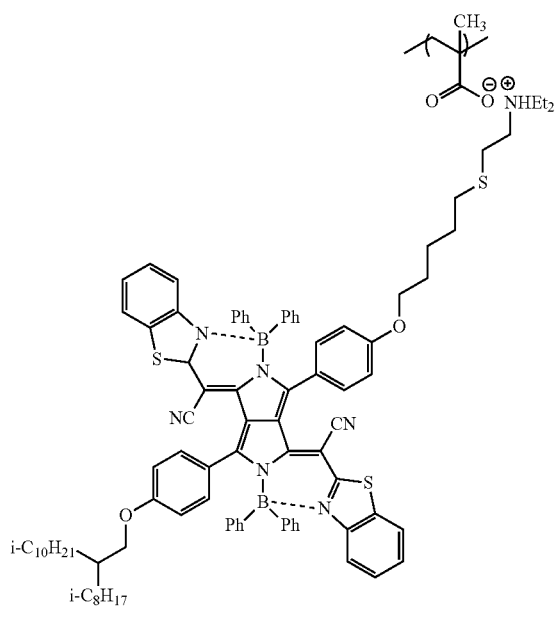
C-ppb-2
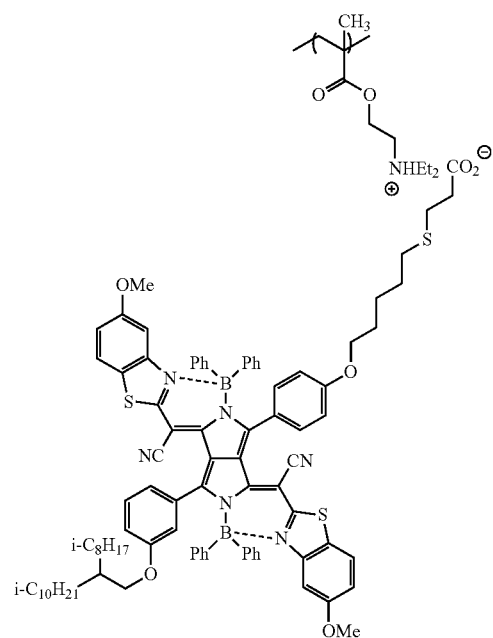

C-ppb-3
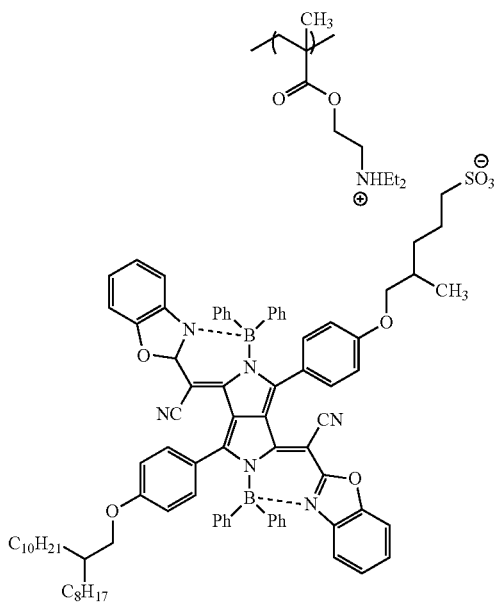
C-ppb-4
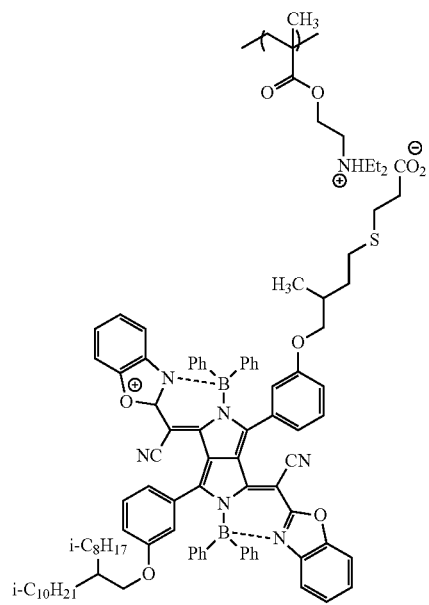
C-ppb-5
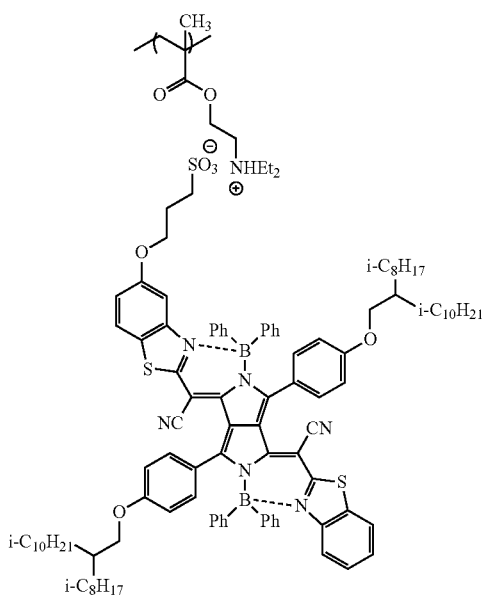
C-ppb-6
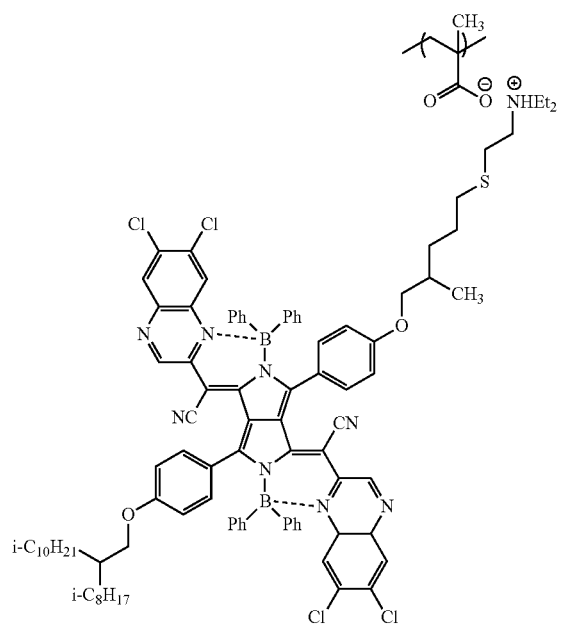

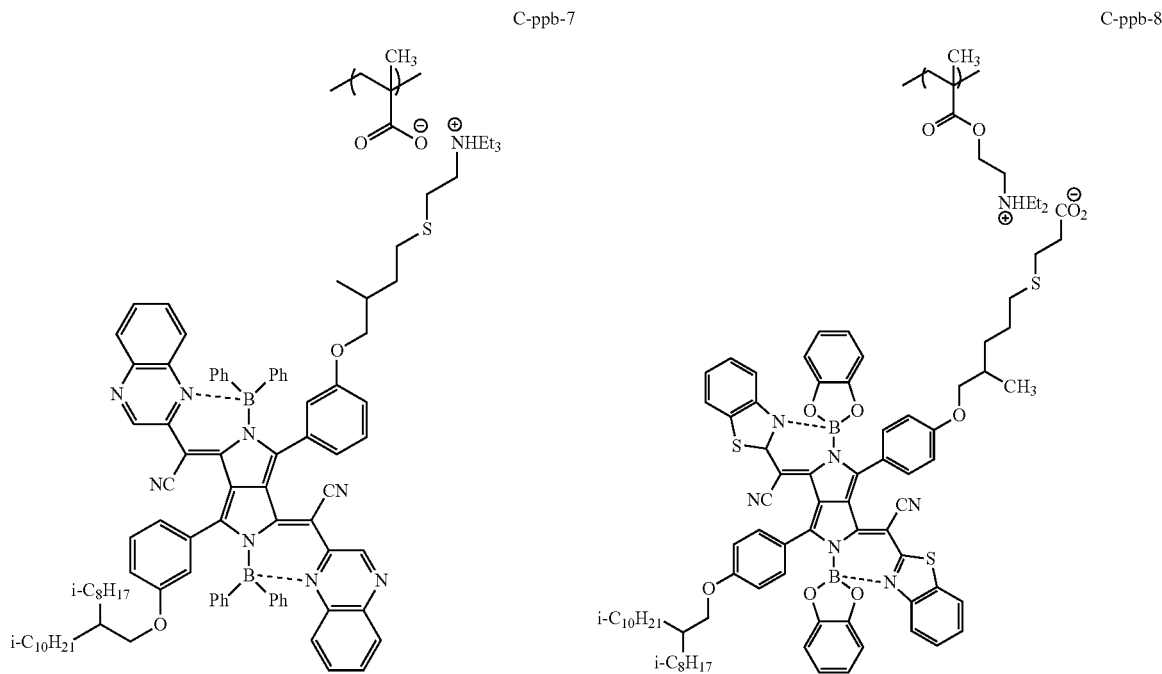
C-ppb-7, C-ppb-8
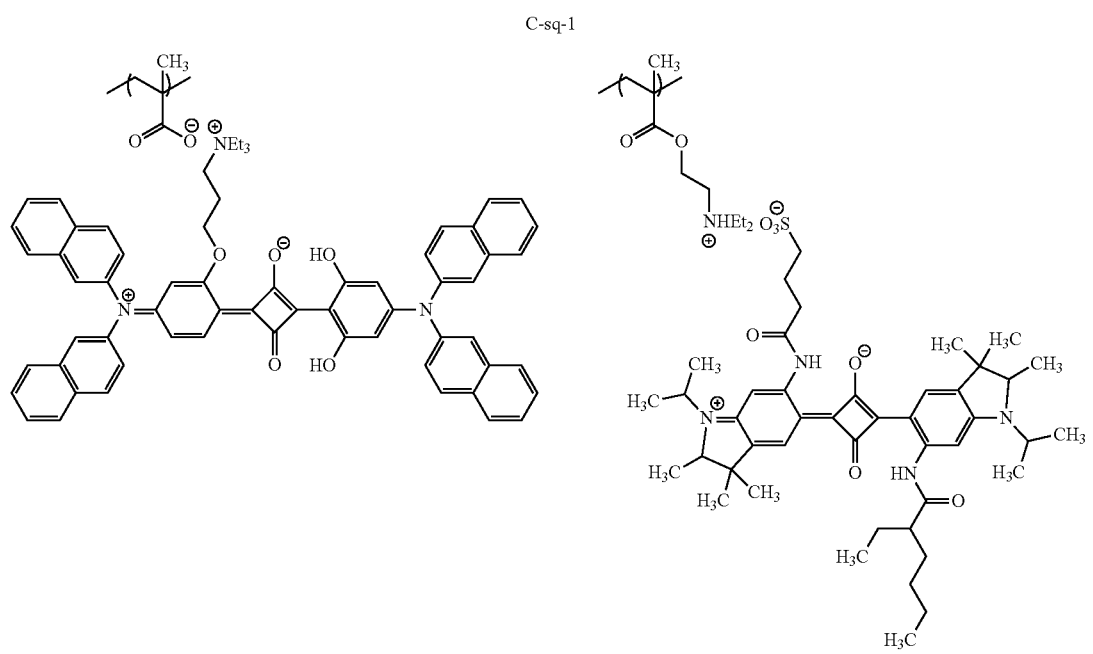
C-sq-1, C-sq-2

-continued
C-sq-3
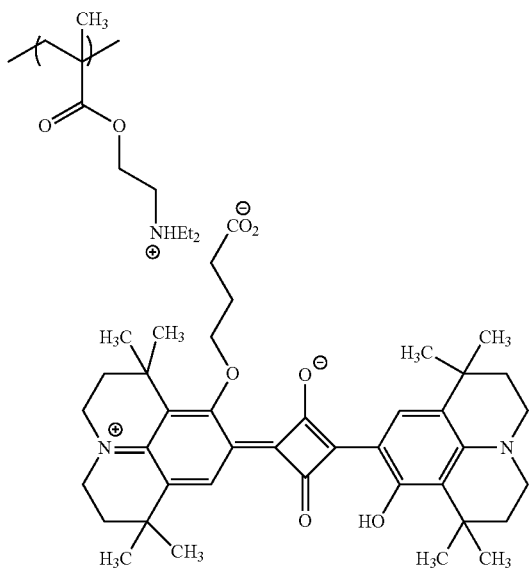
C-sq-4
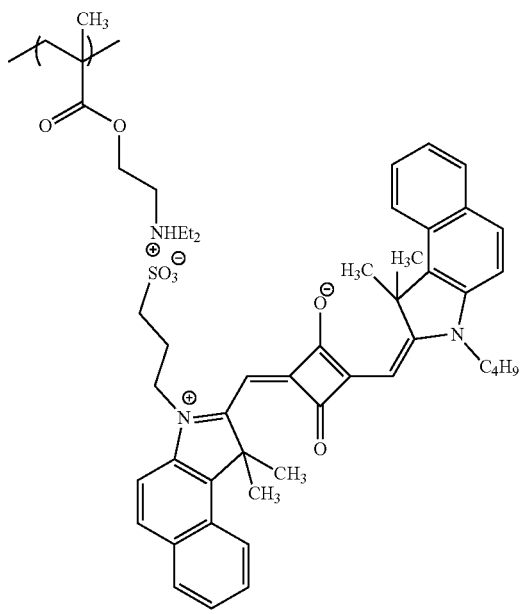
C-cy-1
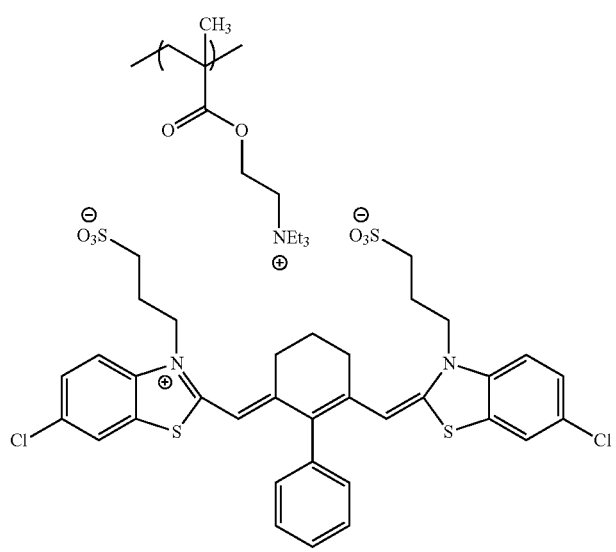
C-cy-2
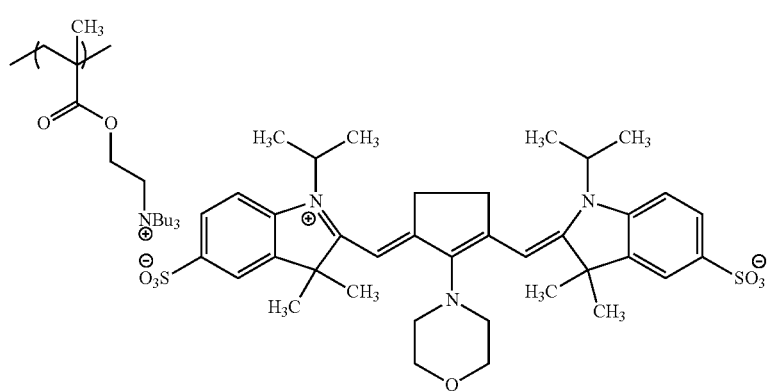

-continued
C-cy-3 C-ox-1
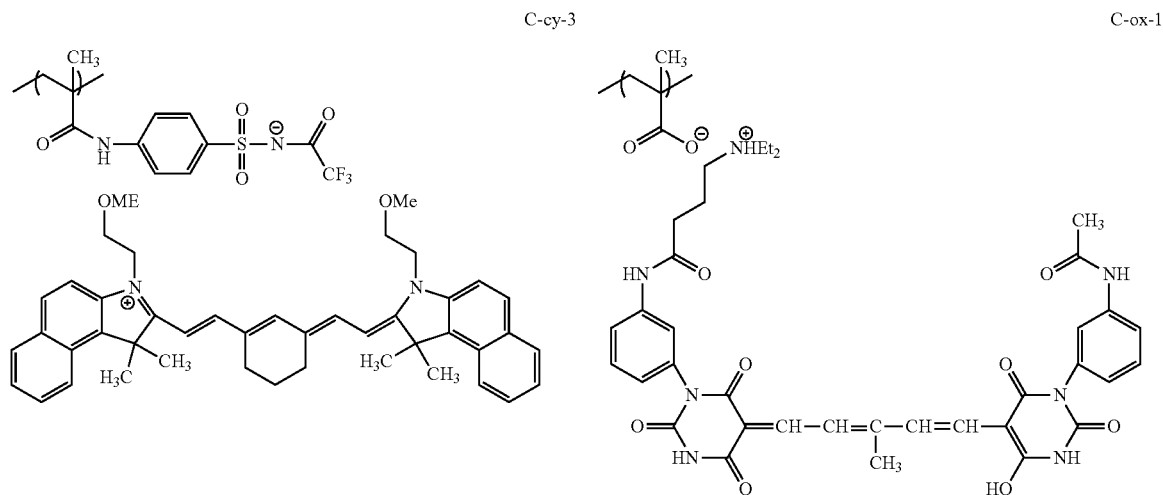
C-ox-2 C-ox-3
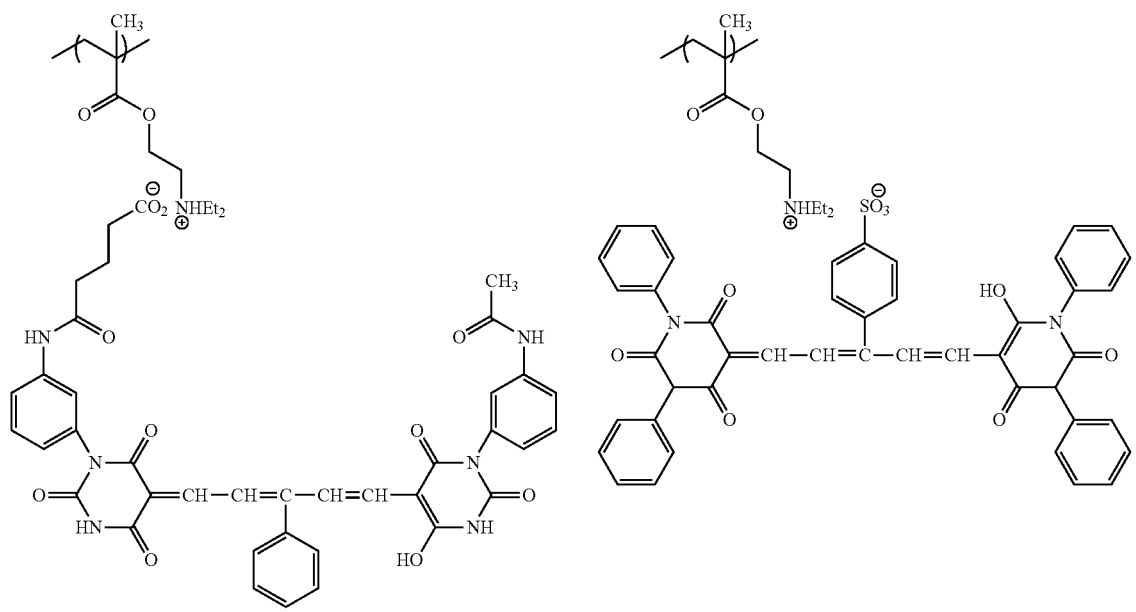

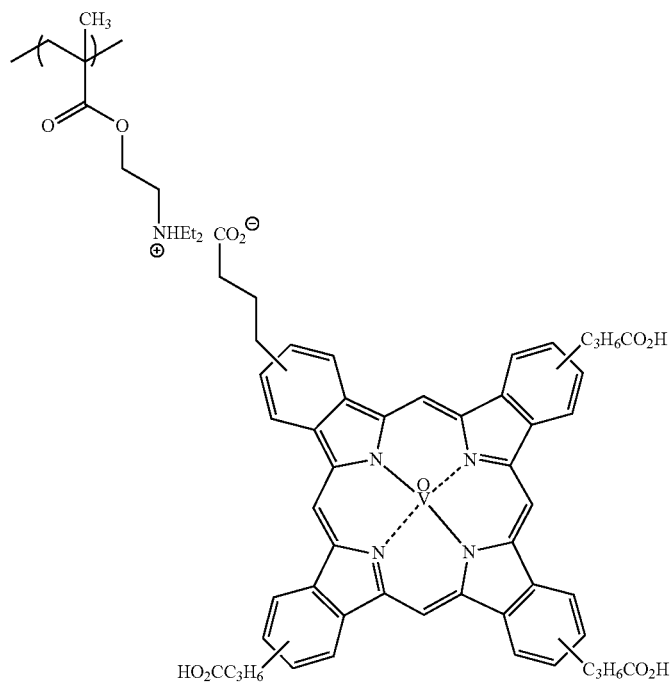
C-ph-1
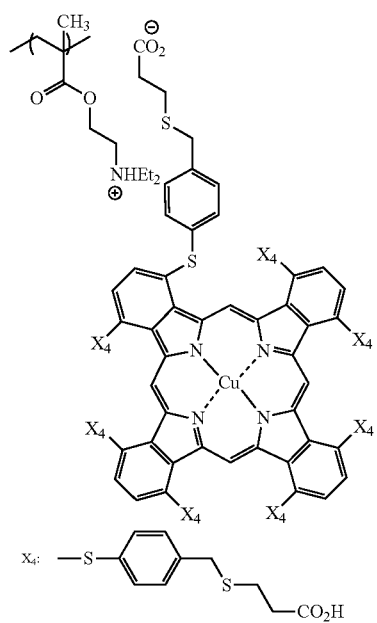
C-ph-2

-continued
C-na-1
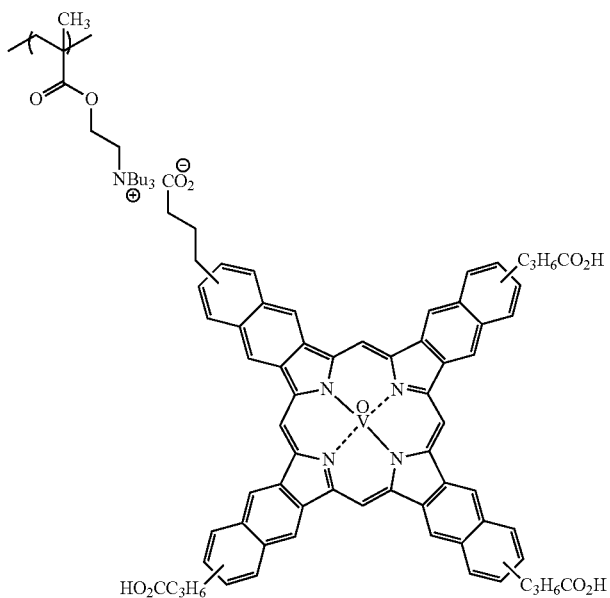
C-na-2
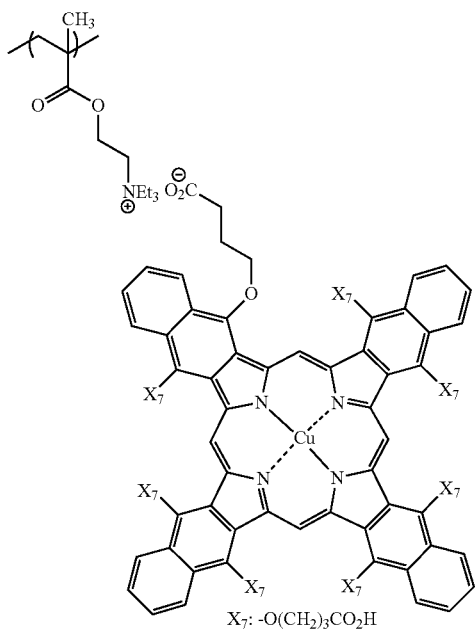
C-cr-1
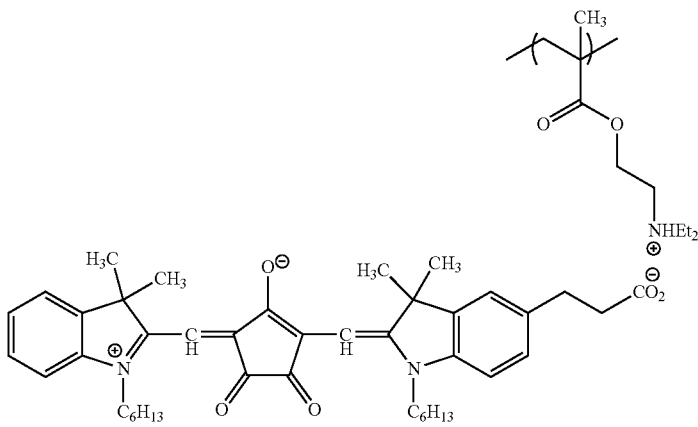

As the constitutional unit having an infrared absorbing group that is included in the resin having an infrared absorbing group, one kind may be used alone, or two or more kinds may be used.

From the viewpoint of dispersibility, the content of the constitutional unit having an infrared absorbing group in the resin having an infrared absorbing group is preferably 10 mass % to 100 mass %, more preferably 30 mass % to 100 mass %, still more preferably 40 mass % to 100 mass %, and still more preferably 50 mass % to 100 mass % with respect to the total mass of the resin having an infrared absorbing group.

In addition, the resin having an infrared absorbing group may include a constitutional unit other than the constitutional unit having an infrared absorbing group.

From the viewpoints of improving dispersibility and transparency and suppressing film defects caused by foreign matter, it is preferable that the resin having an infrared absorbing group (preferably an acrylic resin having an infrared absorbing group) includes a constitutional unit having an acid group, and it is more preferable that the resin having an infrared absorbing group includes a constitutional unit having a carboxy group (carboxylate group).

Examples of the acid group include a carboxy group (carboxylate group), a sulfonamide group, a phosphonate group, a sulfonate group, a phenolic hydroxyl group, and a sulfonylamine group. Among these, a carboxy group is more preferable.

The constitutional unit having an acid group can be introduced into the resin having an infrared absorbing group by copolymerization of monomers having an acid group.

It is more preferable the constitutional unit having an acid group is a constitutional unit obtained by substituting a constitutional unit derived from styrene or a constitutional unit derived from a vinyl compound with an acid group, or a constitutional unit derived from (meth)acrylic acid.

As the constitutional unit having an acid group that is included in the resin having an infrared absorbing group, one kind may be used alone, or two or more kinds may be used.

From the viewpoint of dispersibility, the content of the constitutional unit having an acid group in the resin having an infrared absorbing group is preferably 0.1 mass % to 40 mass %, more preferably 1 mass % to 35 mass %, and still more preferably 5 mass % to 30 mass % with respect to the total mass of the resin having an infrared absorbing group.

Specific preferable examples of the constitutional unit having an acid group include the following constitutional units. However, it is needless to say that the present disclosure is not limited to these examples.

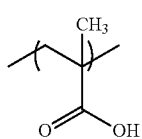
co-1

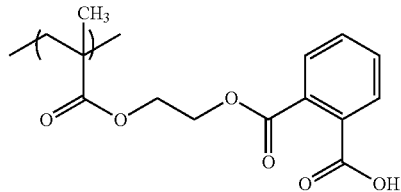
co-2

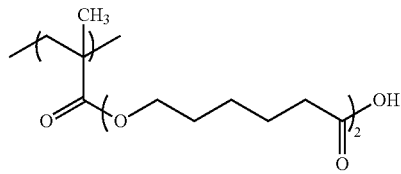
co_3

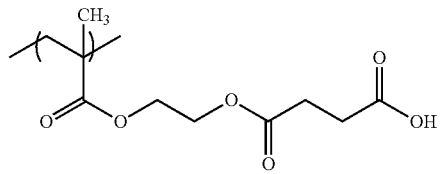
co-4

In addition, from the viewpoints of improving dispersibility and transparency and suppressing film defects caused by foreign matter, it is preferable that the resin having an infrared absorbing group (preferably an acrylic resin having an infrared absorbing group) includes a constitutional unit having a resin structure, it is more preferable that the resin having an infrared absorbing group includes a constitutional unit having a polyester resin structure or a polyalkylene glycol structure, and it is still more preferable that the resin having an infrared absorbing group includes a constitutional unit having a polyester resin structure.

The polyester resin structure is not particularly limited. For example, a linear polyester resin structure is preferable, and a polycaprolactone structure or a polyvalerolactone structure is more preferable.

As the constitutional unit having a polyester resin structure that is included in the resin having an infrared absorbing group, one kind may be used alone, or two or more kinds may be used.

From the viewpoint of dispersibility, the content of the constitutional unit having a polyester resin structure in the resin having an infrared absorbing group is preferably 1 mass % to 50 mass %, more preferably 2 mass % to 40 mass %, and still more preferably 5 mass % to 35 mass % with respect to the total mass of the resin having an infrared absorbing group.

Specific preferable examples of the constitutional unit having a polyester resin structure include the following constitutional units. However, it is needless to say that the present disclosure is not limited to these examples.

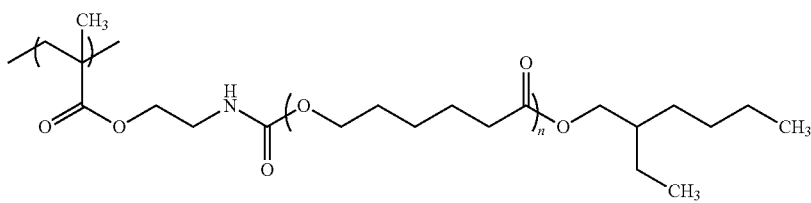

n = 20 co-5
n = 30 co-6

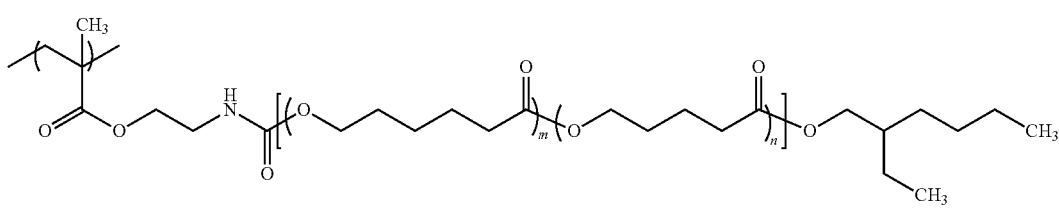

m = 15, n = 5

In addition, from the viewpoints of improving dispersibility and transparency and suppressing film defects caused by foreign matter, it is preferable that the resin having an infrared absorbing group (preferably an acrylic resin having an infrared absorbing group) includes a constitutional unit having an ethylenically unsaturated group.

The ethylenically unsaturated group is not particularly limited and is preferably a (meth)acryloyl group.

In addition, in a case where the resin having an infrared absorbing group includes an ethylenically unsaturated group or a (meth)acryloyl group at a side chain, it is preferable that the resin having an infrared absorbing group includes a divalent linking group having an alicyclic structure between a main chain and an ethylenically unsaturated group.

As the constitutional unit having an ethylenically unsaturated group that is included in the resin having an infrared absorbing group, one kind may be used alone, or two or more kinds may be used.

From the viewpoint of dispersibility, the content of the constitutional unit having an ethylenically unsaturated group in the resin having an infrared absorbing group is preferably 0.1 mass % to 30 mass %, more preferably 1 mass % to 25 mass %, and still more preferably 5 mass % to 20 mass % with respect to the total mass of the resin having an infrared absorbing group.

Specific preferable examples of the constitutional unit having an ethylenically unsaturated group include the following constitutional units. However, it is needless to say that the present disclosure is not limited to these examples.

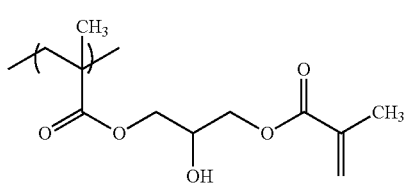

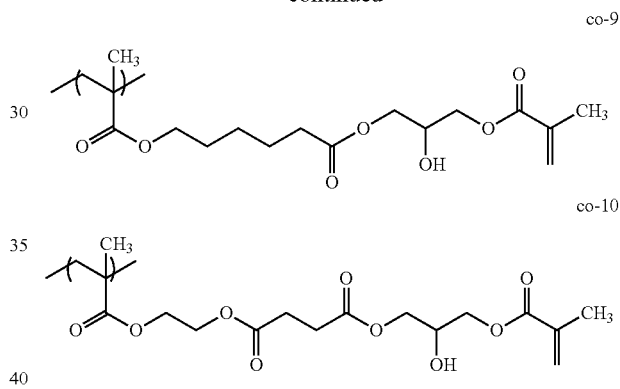

In addition, from the viewpoints of improving dispersibility and transparency and suppressing film defects caused by foreign matter, the resin having an infrared absorbing group is preferably a compound in which one to four resin chains are bonded to an infrared absorbing group and more preferably a compound in which two to four resin chains are bonded to an infrared absorbing group, and still more preferably a compound in which two resin chains are bonded to an infrared absorbing group.

The resin chain is not particularly limited and, from the viewpoints of improving dispersibility and transparency and suppressing film defects caused by foreign matter, is preferably a polycondensed resin chain, more preferably a polyester resin chain or a polyalkylene glycol chain, still more preferably a polyester resin chain, and a polycaprolactone chain or a polyvalerolactone chain.

In addition, it is preferable that the compound in which two to four resin chains are bonded to an infrared absorbing group is a compound having any one of two to four axes of rotational symmetry.

Specific preferable examples of the compound in which two to four resin chains are bonded to an infrared absorbing group include the following compounds. However, it is needless to say that the present disclosure is not limited to these examples.

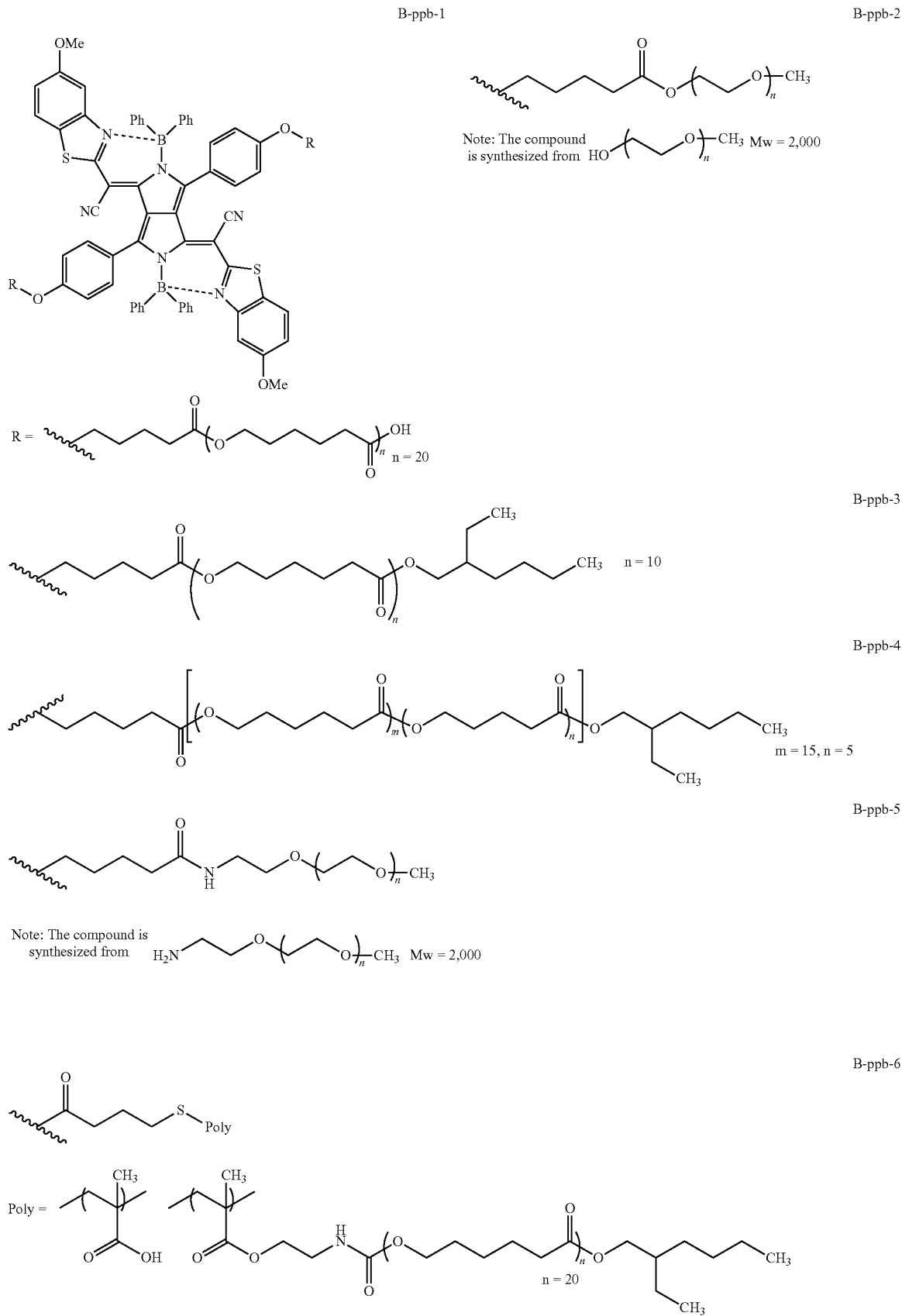

-continued
B-ppb-7
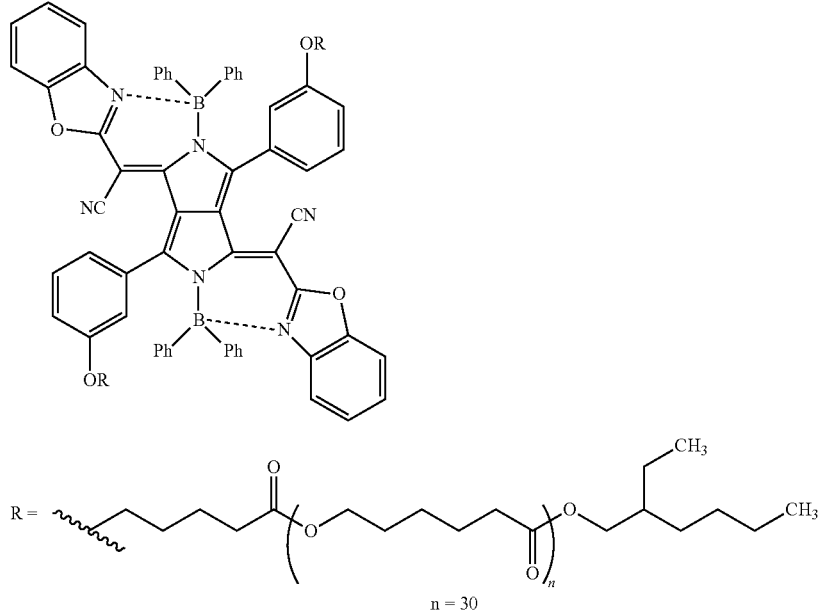
B-ppb-8
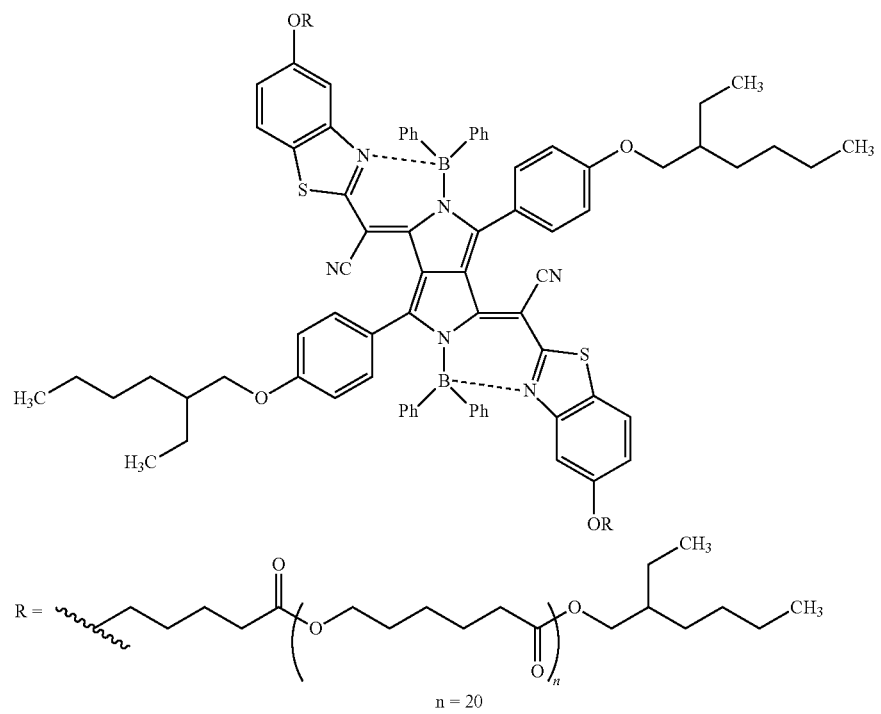

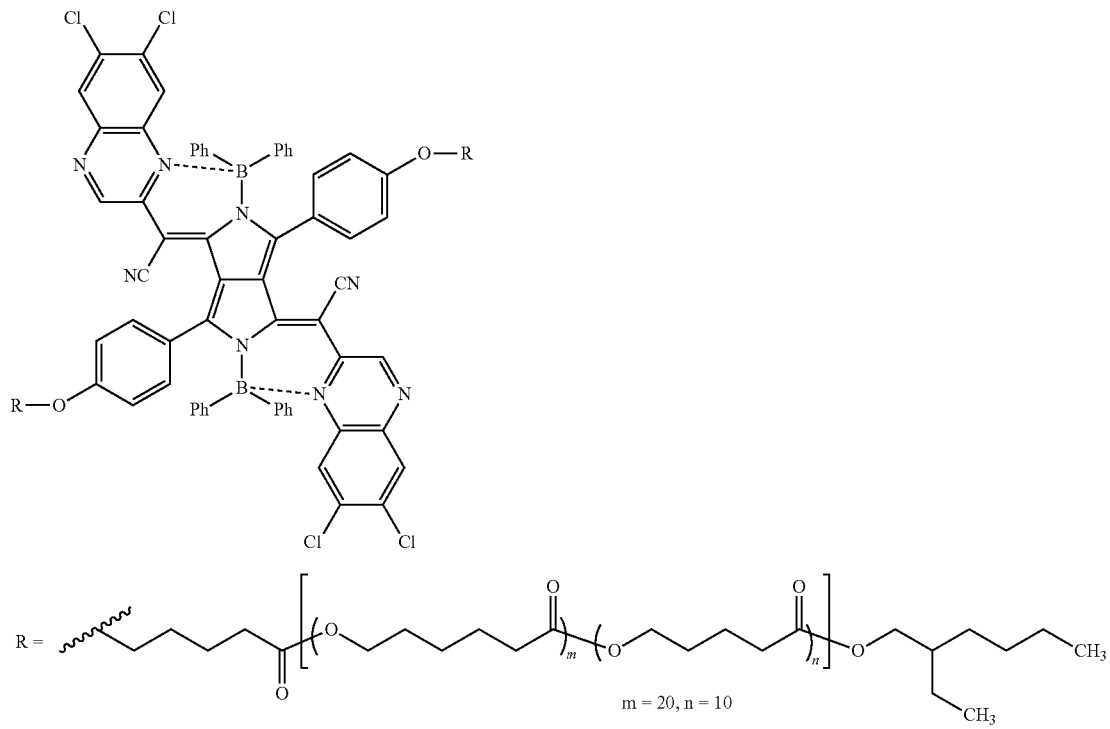
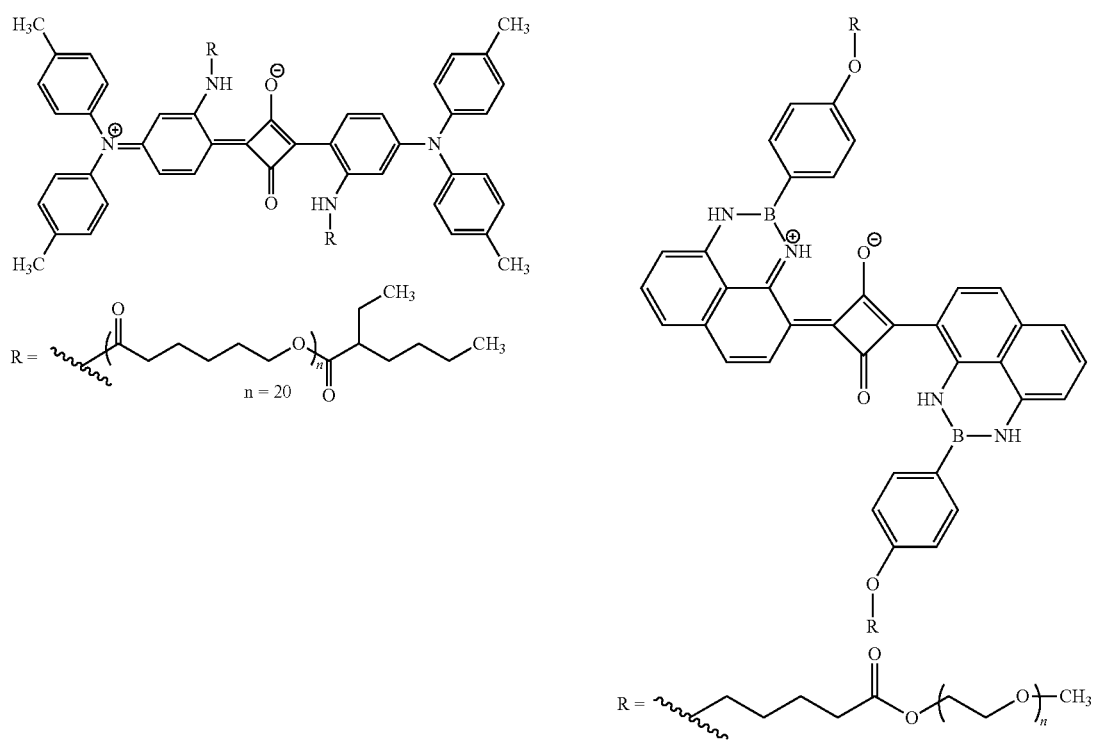

B-sq-3
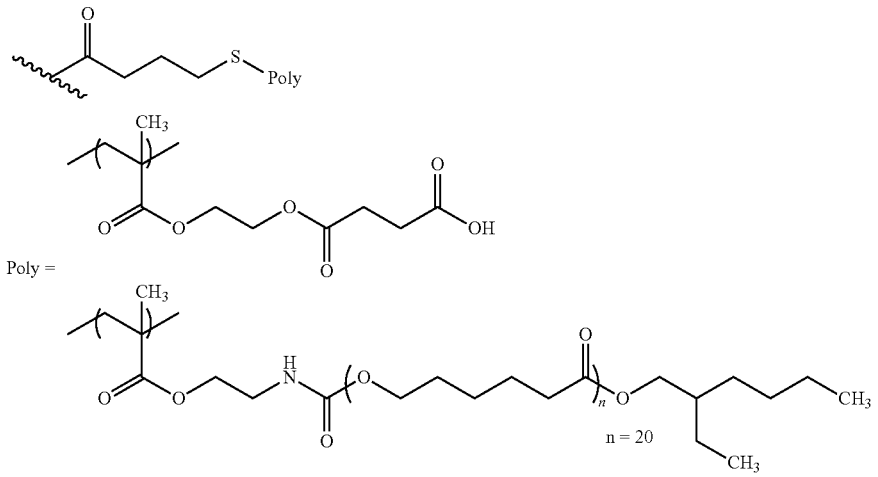
B-cy-1
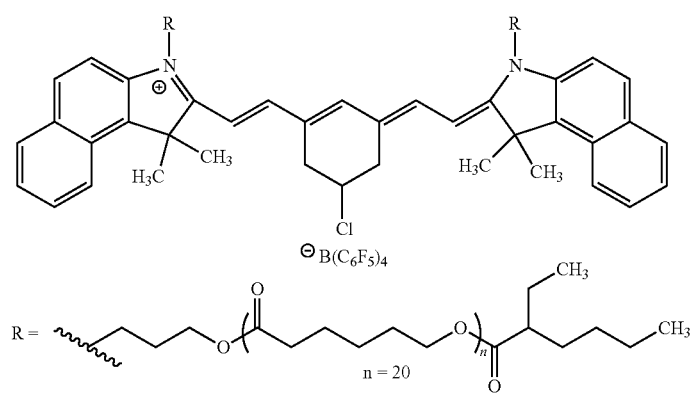
B-cy-2
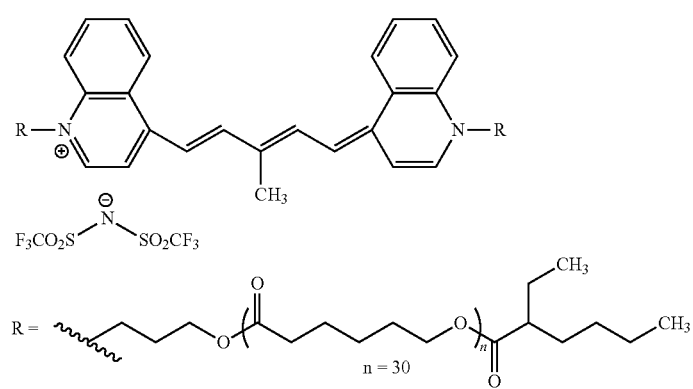

-continued

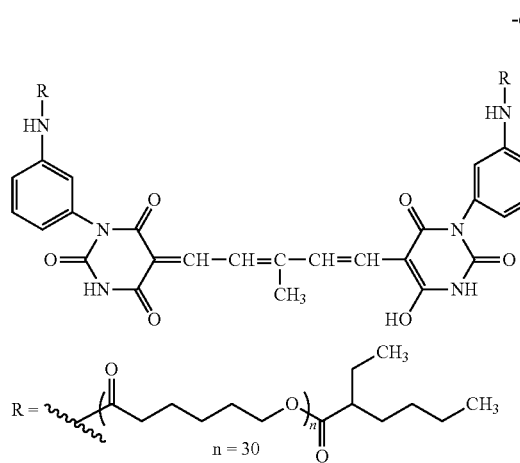

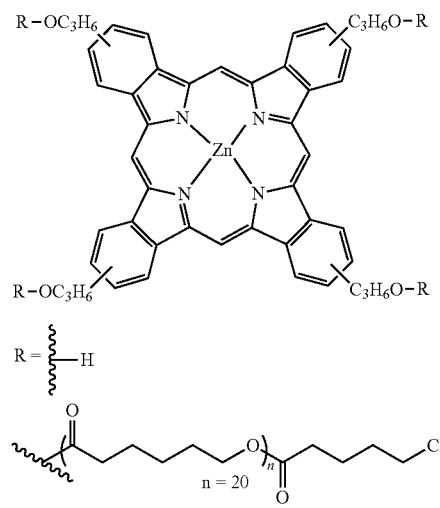
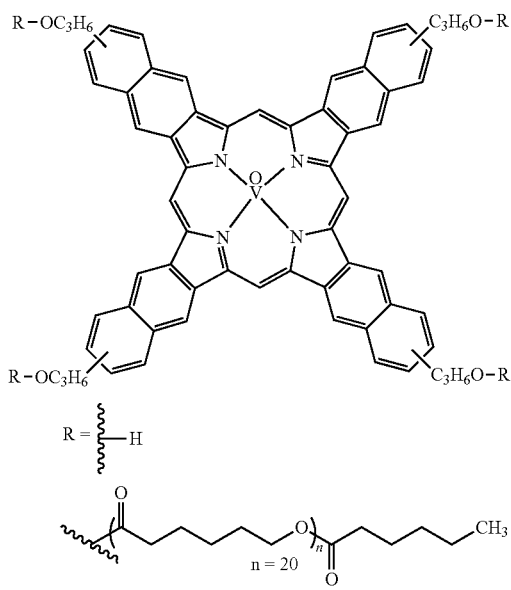

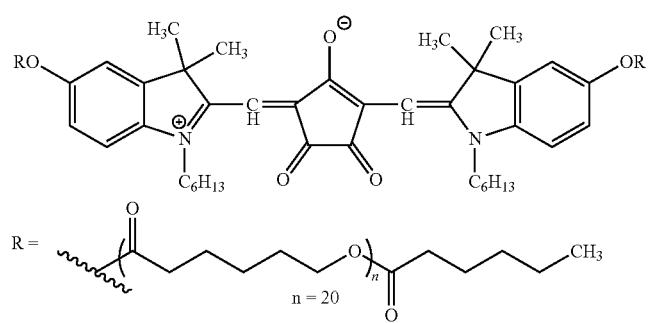

The content of the resin having an infrared absorbing group is preferably 0.1 mass % to 30 mass % with respect to the total solid content of the resin composition. The lower limit is more preferably 0.5 mass % or higher and still more preferably 1 mass % or higher. The upper limit is more preferably 20 mass % or lower, and still more preferably 10 mass % or lower. In a case where the content of the resin having an infrared absorbing group is in the above-described range, a film having excellent dispersibility and excellent transparency in a wavelength range of 400 nm to 650 nm can be formed, and a film having reduced foreign matter defects can be formed. In the present disclosure, as the resin having an infrared absorbing group, one kind may be used alone, or two or more kinds may be used. In a case where two or more resins having an infrared absorbing group are used in combination, it is preferable that the total content of the two or resins having an infrared absorbing group is in the above-described range.

(Curable Compound)

It is preferable that the resin composition according to the embodiment of the present disclosure further includes a curable compound.

The curable compound is preferably a compound having a polymerizable group (hereinafter, also referred to as "polymerizable compound"). The curable compound may be in a chemical form of a monomer, an oligomer, a prepolymer, a polymer, or the like. The details of the curable compound can be found in, for example, paragraphs "0070" to "0191" of JP2014-041318A (corresponding to paragraphs "0071" to "0192" of WO2014/017669A) or paragraphs "0045" to "0216" of JP2014-032380A, the content of which is incorporated herein by reference.

In addition, examples of a commercially available product of a urethane resin having a methacryloyl group include 8UH-1006 and 8UH-1012 (both of which are manufactured by Taisei Fine Chemical Co., Ltd.).

The curable compound is preferably a polymerizable compound. The polymerizable compound may be a radically polymerizable compound or a cationically polymerizable compound. For example, a compound having a polymerizable group such as an ethylenically unsaturated bond or a cyclic ether (epoxy, oxetane) can be used. As the ethylenically unsaturated bond, a vinyl group, a styryl group, a (meth)acryloyl group, or a (meth)allyl group is preferable. The polymerizable compound may be a monofunctional compound having one polymerizable group or a polyfunctional polymerizable compound having two or more polymerizable groups, and is preferably a polyfunctional polymerizable compound and more preferably a polyfunctional (meth)acrylate compound. By the resin composition including the polyfunctional polymerizable compound, film hardness can be further improved.

Examples of the curable compound include a monofunctional (meth)acrylate compound, a polyfunctional (meth)acrylate compound (preferably a trifunctional to hexafunctional (meth)acrylate compound), a polybasic acid-modified acrylic oligomer, an epoxy resin, and a polyfunctional epoxy resin.

The content of the curable compound is preferably 1 to 90 mass % with respect to the total solid content of the resin composition. The lower limit is more preferably 5 mass % or higher, still more preferably 10 mass % or higher, and even still more preferably 20 mass % or higher. The upper limit is more preferably 80 mass % or lower, and still more preferably 75 mass % or lower.

As the curable compound, one kind may be used alone, or two or more kinds may be used. In a case where two or more curable compounds are used in combination, it is preferable that the total content of the two or more curable compounds is in the above-described range.

As the curable compound, an ethylenically unsaturated compound can also be used. Examples of the ethylenically unsaturated compound can be found in paragraphs "0033" and "0034" of JP2013-253224A, the content of which is incorporated herein by reference.

As the ethylenically unsaturated compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. In addition, oligomers of the above-described examples can be used.

In addition, diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The ethylenically unsaturated compound may have an acid group such as a carboxy group, a sulfonate group, or a phosphate group.

Examples of the acid group and the ethylenically unsaturated compound include an ester of an aliphatic polyhydroxy compound and an unsaturated carboxylic acid. A compound having an acid group obtained by causing a nonaromatic carboxylic anhydride to react with an unreacted hydroxyl group of an aliphatic polyhydroxy compound is preferable. In particular, it is more preferable that, in this ester, the aliphatic polyhydroxy compound is pentaerythritol or dipentaerythritol. Examples of a commercially available product of the monomer having an acid group include M-510 and M-520 of ARONIX series as polybasic acid-modified acrylic oligomer (manufactured by Toagosei Co., Ltd.).

The acid value of the acid group and the ethylenically unsaturated compound is preferably 0.1 mgKOH/g to 40 mgKOH/g. The lower limit is more preferably 5 mgKOH/g or higher. The upper limit is more preferably 30 mgKOH/g or lower.

In the present disclosure, as the curable compound, a compound having an epoxy group or an oxetanyl group can be used. Examples of the compound having an epoxy group or an oxetanyl group include a polymer having an epoxy group at a side chain and a monomer or an oligomer having two or more epoxy groups in a molecule. Examples of the compound include a bisphenol A epoxy resin, a bisphenol F epoxy resin, a phenol novolac epoxy resin, a cresol novolac epoxy resin, and an aliphatic epoxy resin. In addition, a monofunctional or polyfunctional glycidyl ether compound can also be used, and a polyfunctional aliphatic glycidyl ether compound is preferable.

The weight-average molecular weight is preferably 500 to 5,000,000 and more preferably 1,000 to 500,000.

As the compound, a commercially available product may be used, or a compound obtained by introducing an epoxy group into a side chain of the polymer may be used. Examples of the commercially available product include CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (all of which are manufactured by Daicel Corporation).

(Polymerization Initiator)

It is preferable that the resin composition according to the embodiment of the present disclosure further includes a polymerization initiator.

The content of the polymerization initiator is preferably 0.01 to 30 mass % with respect to the total solid content of the composition. The lower limit is more preferably 0.1 mass % or higher and still more preferably 0.5 mass % or higher.

The upper limit is more preferably 20 mass % or lower, and still more preferably 15 mass % or lower.

As the polymerization initiator, one kind or two or more kinds may be used. In a case where two or more polymerization initiators are used, it is preferable that the total content of the two or more polymerization initiators is in the above-described range.

The polymerization initiator may be a photopolymerization initiator or a thermal polymerization initiator and is preferably a photopolymerization initiator.

In addition, the polymerization initiator may be a radical polymerization initiator or a cationic polymerization initiator.

Further, it is preferable that a polymerization initiator having no colorability and high color fading properties is selected as the polymerization initiator.

Examples of the photoradical polymerization initiator include: a halogenated hydrocarbon derivative (For example, a compound having a triazine skeleton or a compound having an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-058241A (JP-S62-058241A), a compound described in JP1993-281728A (JP-H5-281728A), a compound described in JP1993-034920A (JP-S5-034920A), and a compound described in U.S. Pat. No. 4,212,976A.

In addition, from the viewpoint of exposure sensitivity, as the photoradical polymerization initiator, a compound selected from the group consisting of an oxime compound, a trihalomethyltriazine compound, a benzyldimethylketal compound, an α-hydroxyketone compound, an a-aminoketone compound, an acylphosphine compound, a phosphine oxide compound, a metallocene compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound is preferable, and an oxime compound is more preferable.

Specific examples of the oxime compound include a compound described in JP2001-233842A, a compound described in JP2000-080068A, a compound described in JP2006-342166A, and a compound described in JP2016-021012A. In addition, examples of the oxime compound include a compound described in J. C. S. Perkin II (1979), pp. 1653-1660, J. C. S. Perkin II (1979), pp. 156-162 and Journal of Photopolymer Science and Technology (1995), pp. 202-232, JP2000-066385A, JP2000-080068A, JP2004-534797A, or JP2006-342166A.

As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA ARKLS NCI-831 (manufactured by Adeka Corporation), ADEKA ARKLS NCI-930 (manufactured by Adeka Corporation), or ADEKA OPTOMER N-1919 (manufactured by Adeka Corporation) can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-015025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays may be used.

Other preferable examples of the oxime compound can be found in paragraphs "0274" to "0275" of JP2013-029760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

In Formula (OX-1), $R^{O1}$ and $R^{O2}$ each independently represent a monovalent substituent, $R^{O3}$ represents a divalent organic group, and $Ar^{O1}$ represents an aryl group.

In Formula (OX-1), it is preferable that the monovalent substituent represented by $R^{O1}$ is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may be further substituted with another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by $R^{O2}$, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by $R^{O3}$, an alkylene group having 1 to 12 carbon atoms, a cycloalkylene group, or an alkynylene group is preferable. These groups may have one or more substituents. Examples of the substituent are as described above.

A compound represented by the following Formula (1) or (2) can also be used as the photopolymerization initiator.

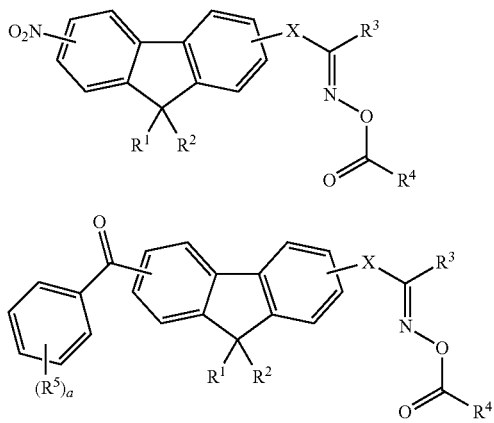

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms; in a case where $R^1$ and $R^2$ represent a phenyl group, the phenyl groups may be bonded to each other to form a fluorene group; $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a single bond or a carbonyl group.

In Formula (2), $R^1$, $R^2$, $R^3$, and $R^4$ have the same definitions as those of $R^1$, $R^2$, $R^3$, and $R^4$ in Formula (1), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, X represents a single bond or a carbonyl group, and a represents an integer of 0 to 4.

In Formulae (1) and (2), it is preferable that $R^1$ and $R^2$ each independently represent a methyl group, an ethyl group, a n-propyl group, an i-propyl group, a cyclohexyl group, or a phenyl group. It is preferable that $R^3$ represents a methyl group, an ethyl group, a phenyl group, a tolyl group, or a xylyl group. It is preferable that $R^4$ represents an alkyl group having 1 to 6 carbon atoms or a phenyl group. It is preferable that $R^5$ represents a methyl group, an ethyl group, a phenyl group, a tolyl group, or a naphthyl group. It is preferable that X represents a single bond.

Specific examples of the compounds represented by Formulae (1) and (2) include compounds described in paragraphs "0076" to "0079" of JP2014-137466A. The content is incorporated herein by reference.

As the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, paragraphs "0007" to "0025" of JP4223071B, and ADEKA ARKLS NCI-730 and NCI-831 (both of which are manufactured by Adeka Corporation).

The oxime compound preferably has a maximum absorption wavelength in a wavelength range of 350 nm to 500 nm, more preferably has an absorption wavelength in a wavelength range of 360 nm to 480 nm, and still more preferably has a high absorbance at 365 nm and 405 nm.

The molar absorption coefficient of the oxime compound at 365 nm or 405 nm is preferably 1,000 to 300,000, more preferably 2,000 to 300,000, and still more preferably 5,000 to 200,000 from the viewpoint of sensitivity.

The molar absorption coefficient of the compound can be measured using a well-known method. For example, it is preferable that the molar absorption coefficient can be measured using an ultraviolet-visible spectrophotometer (Cary-5 spectrophotometer, manufactured by Varian Medical Systems, Inc.) and ethyl acetate as a solvent at a concentration of 0.01 g/L.

Specific examples of the oxime compound which are preferably used in the present disclosure are shown below, but the present disclosure is not limited thereto.

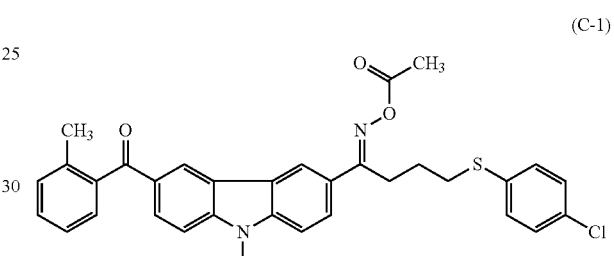

(C-1)

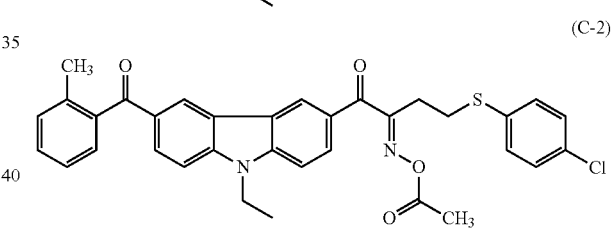

(C-2)

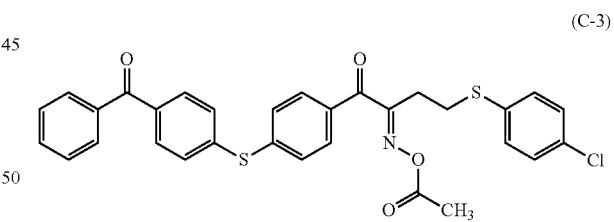

(C-3)

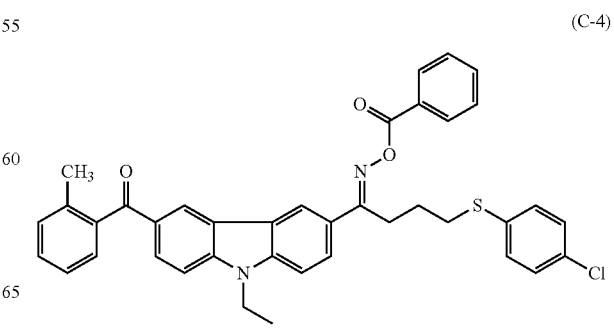

(C-4)

-continued (C-5)
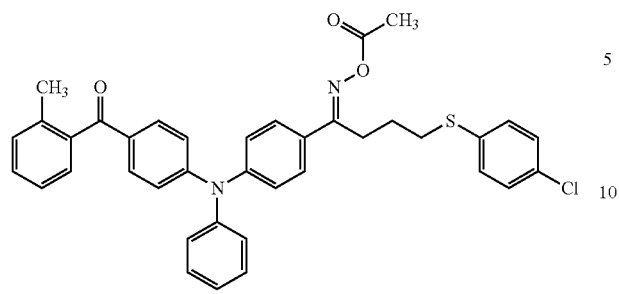

(C-10)
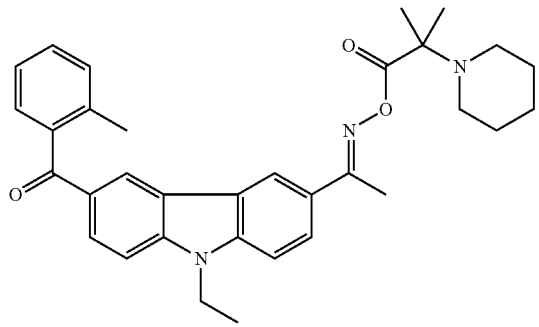

(C-6)
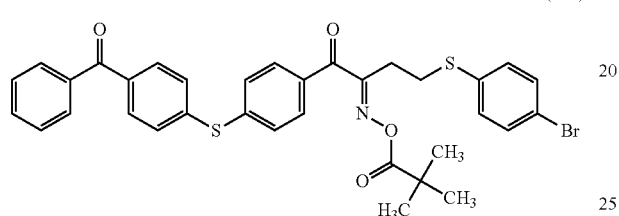

(C-11)
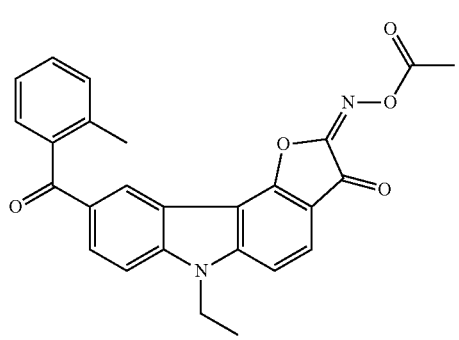

(C-7)
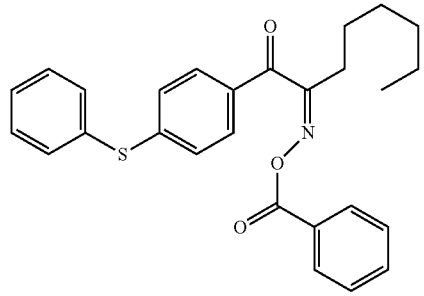

(C-12)
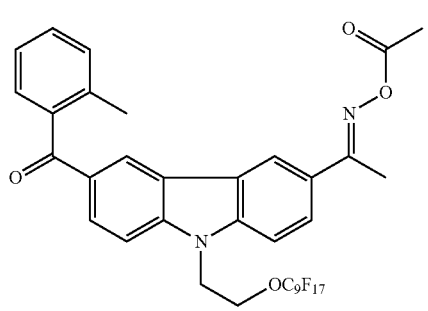

Examples of the $OC_9F_{17}$ in (C-12) shown above include the following groups.

(C-8)
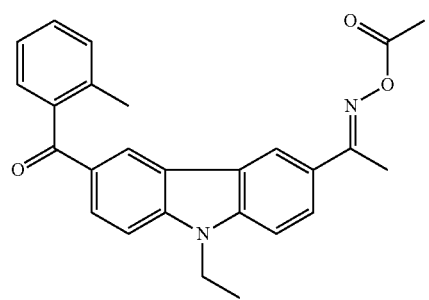

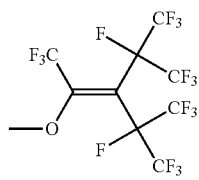 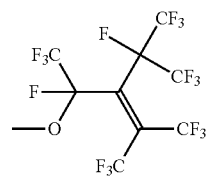

As the photopolymerization initiator, an oxime compound having a fluorine atom can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

Examples of the photocationic polymerization initiator include a photoacid generator. Examples of the photoacid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodis- (C-9)
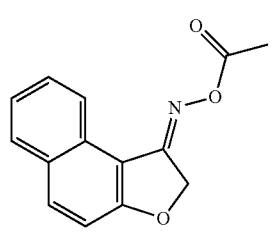

ulfone, disulfone, or o-nitrobenzyl sulfonate. The details of the photocationic polymerization initiator can be found in paragraphs "0139" to "0214" of JP2009-258603A, the content of which is incorporated herein by reference.

As the photocationic polymerization initiator, a commercially available product can also be used. Examples of the commercially available product of the photocationic polymerization initiator include ADEKA ARKLS SP series manufactured by Adeka Corporation (for example, ADEKA ARKLS SP-606) and IRGACURE 250, IRGACURE 270, and IRGACURE 290 manufactured by BASF SE.

(Chromatic Colorant, Black Colorant, Colorant that Shields Visible Light)

The composition according to the present disclosure may include at least one selected from the group consisting of a chromatic colorant and a black colorant (hereinafter, a chromatic colorant and a black colorant will also be collectively called "visible colorant"). In the present disclosure, "chromatic colorant" denotes a colorant other than a white colorant and a black colorant. It is preferable that the chromatic colorant is a colorant having an absorption in a wavelength range of 400 nm or longer and shorter than 650 nm.

—Chromatic Colorant—

In the present disclosure, the chromatic colorant may be a pigment or a dye.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present disclosure is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments); C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In addition, as the dye, at least one of an acid dye or a derivative thereof may be suitably used. Furthermore, for example, at least one of a direct dye, a basic dye, a mordant dye, an acid mordant dye, an azoic dye, a dispersed dye, an oil-soluble dye, a food dye, or a derivative thereof can be suitably used.

Specific examples of the acid dye are shown below, but the present disclosure is not limited to these examples. For example, the following dyes and derivatives thereof can be used:

acid alizarin violet N;

acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1;

acid chrome violet K;

acid Fuchsin and acid green 1, 3, 5, 9, 16, 25, 27, and 50;

acid orange 6, 7, 8, 10, 12, 50, 51, 52, 56, 63, 74, and 95;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;

acid violet 6B, 7, 9, 17, and 19;

acid yellow 1, 3, 7, 9, 11, 17, 23, 25, 29, 34, 36, 42, 54, 72, 73, 76, 79, 98, 99, 111, 112, 114, 116, 184, and 243; and Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azo methine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

—Black Colorant—

It is preferable that the black colorant is an organic black colorant. In the present disclosure, the black colorant as the colorant that shields visible light denotes a material that absorbs visible light and allows at least a part of infrared light. Accordingly, in the present disclosure, examples of the black colorant as the colorant that shields visible light do not include carbon black and titanium black. As the black colorant as the colorant that shields visible light, for example, a bisbenzofuranone compound, an azomethine compound, a perylene compound, or an azo compound can also be used.

Examples of the bisbenzofuranone compound include compounds described in JP2010-534726A, JP2012-515233A, and JP2012-515234A. For example, "Irgaphor Black" (manufactured by BASF SE) is available.

Examples of the perylene compound include C.I. Pigment Black 31 and 32.

Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available. The azo compound is not particularly limited, and for example, a compound represented by the following Formula (A-1) can be suitably used.

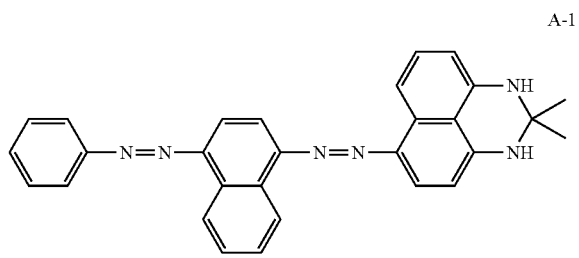 [SMILES: CC1(C)Nc2cccc3c(N=Nc4ccc(N=Nc5ccccc5)c5ccccc45)ccc(c23)N1]

A-1

—Colorant that Shields Visible Light—

In a case where an infrared transmitting filter that allows transmission of infrared light in a range that is not absorbed by the infrared absorbing pigment and the resin having an infrared absorbing group is manufactured using the resin composition according to the embodiment of the present disclosure, it is preferable that the resin composition includes the colorant that shields visible light.

In addition, it is preferable that black, gray, or a color similar to black or gray is exhibited using a combination of a plurality of colorants that shields visible light.

In addition, it is preferable that the colorant that shields visible light is a material that absorbs light in a wavelength range of violet to red.

In addition, it is preferable that the colorant that shields visible light is a colorant that shields light in a wavelength range of 450 nm to 650 nm.

In the present disclosure, it is preferable that the colorant that shields visible light satisfies at least one of the following requirement (1) or (2), and it is more preferable that the coloring material that shields visible light satisfies the requirement (1). (1): An aspect in which the colorant that shields visible light includes two or more chromatic colorants (2): An aspect in which the colorant that shields visible light includes a black colorant In addition, in the present disclosure, the black colorant as the colorant that shields visible light denotes a material that absorbs visible light and allows at least a part of infrared light. Accordingly, in the present disclosure, the organic black colorant as the colorant that shields visible light does not denote a black colorant that absorbs both visible light and infrared light, for example, carbon black or titanium black.

It is preferable that the colorant that shields visible light is a material in which a ratio AB of a minimum value A of an absorbance in a wavelength range of 450 nm to 650 nm to a minimum value B of an absorbance in a wavelength range of 900 nm to 1,300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the colorant that shields visible light includes two or more chromatic colorants, it is preferable that the chromatic colorants are selected from the group consisting of a red colorant, a green colorant, a blue colorant, a yellow colorant, a violet colorant, and an orange colorant.

In a case where the colorant that shields visible light is formed using a combination of two or more chromatic colorants, examples of the combination of chromatic colorants are as follows.

(1) An aspect in which the colorant that shields visible light includes a yellow colorant, a blue colorant, a violet colorant, and a red colorant (2) An aspect in which the colorant that shields visible light includes a yellow colorant, a blue colorant, and a red colorant (3) An aspect in which the colorant that shields visible light includes a yellow colorant, a violet colorant, and a red colorant (4) An aspect in which the colorant that shields visible light includes a yellow colorant and a violet colorant (5) An aspect in which the colorant that shields visible light includes a green colorant, a blue colorant, a violet colorant, and a red colorant (6) An aspect in which the colorant that shields visible light includes a violet colorant and an orange colorant (7) An aspect in which the colorant that shields visible light includes a green colorant, a violet colorant, and a red colorant (8) An aspect in which the colorant that shields light in the visible range includes a green colorant and a red colorant Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

| No. | Yellow Colorant | Green Colorant | Blue Colorant | Violet Colorant | Red Colorant | Orange Colorant |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the resin composition according to the embodiment of the present disclosure includes a visible colorant, the content of the visible colorant is preferably 0.01 mass % to 50 mass % with respect to the total solid content of the resin composition. The lower limit is more preferably 0.1 mass % or higher and still more preferably 0.5 mass % or higher. The upper limit is more preferably 30 mass % or lower, and still more preferably 15 mass % or lower.

The content of the visible colorant is preferably 10 parts by mass to 1,000 parts by mass and more preferably 50 parts by mass to 800 parts by mass with respect to 100 parts by mass of the infrared absorbing pigment.

(Resin)

The resin composition according to the embodiment of the present disclosure includes a resin other than the resin having an infrared absorbing group (hereinafter, simply referred to as "resin"). The resin is mixed, for example, in order to disperse the pigment and the like in the composition and to be added as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2,000 to 2,000,000. The upper limit is more preferably 1,000,000 or lower and still more preferably 500,000 or lower. The lower limit is more preferably 3,000 or higher and still more preferably 5,000 or higher.

The content of the resin is preferably 10 mass % to 80 mass % and more preferably 20 mass % to 60 mass % with respect to the total solid content of the resin composition. The composition may include one resin or two or more resins. In a case where the composition includes two or more resins, it is preferable that the total content of the resins is in the above-described range.

—Dispersant—

Examples of the dispersant include: a polymer dispersant such as a resin having an amine group (polyamidoamine or a salt thereof), an oligoimine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate;

In terms of a structure, the polymer dispersant can be further classified into a linear polymer, a terminal-modified polymer, a graft polymer, and a block polymer.

In addition, as the polymer dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-077994A (JP-H9-077994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-037082A (JP-S54-037082A), JP1996-507960A (JP-H8-507960A), or JP2009-258668A, a reaction product of polyallylamine and polyester described in JP1997-169821A (JP-H9-169821A), a copolymer of a macromonomer and a nitrogen-containing monomer described in JP1998-339949A (JP-H10-339949A) or JP2004-037986A, a graft polymer having a partial skeleton or a heterocycle of an organic colorant described in JP2003-238837A, JP2008-009426A, or JP2008-081732A, and a copolymer of a macromonomer and an acid group-containing monomer described in JP2010-106268A.

As the macromonomer used for manufacturing the graft polymer by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A). Among these, from the viewpoint of the dispersibility and dispersion stability of the pigment dispersion and the developability of the composition in which the pigment dispersion is used, a polyester macromonomer having excellent flexibility and solvent compatibility is more preferable, and the polyester macromonomer represented by the polyester macromonomer described in JP1990-272009A (JP-H2-272009A) is most preferable.

As the block polymer, a block polymer described in JP2003-049110A or JP2009-052010A is preferable.

The resin (dispersant) is available as a commercially available product, and specific examples thereof include "Disperbyk-101 (polyamidoamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN—B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

Among these resins, one kind may be used alone, or two or more kinds may be used in combination. In addition, an alkali-soluble resin described below can also be used as the dispersant. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H7-319161A) is also preferable.

The content of the dispersant is preferably 1 part by mass to 80 parts by mass, more preferably 5 parts by mass to 70 parts by mass, and still more preferably 10 parts by mass to 60 parts by mass with respect to 100 parts by mass of the infrared absorbing pigment.

In addition, it is preferable that the content of the dispersant is lower than the content of the resin having an infrared absorbing group.

—Alkali-Soluble Resin—

From the viewpoint of developability, it is preferable that the resin composition according to the embodiment of the present disclosure further includes an alkali-soluble resin.

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain). As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxy group, a phosphate group, a sulfonate group, and a phenolic hydroxyl group. A group that is soluble in an organic solvent and is developable with a weakly alkaline aqueous solution is preferable, and (meth)acrylic acid is more preferable. Among these acid groups, one kind may be used alone, or two or more kinds may be used in combination. The details of the alkali-soluble resin can be found in paragraphs "0558" to "0571" of JP2012-208494A (corresponding to paragraphs "0685" to "0700" of US2012/0235099A), the content of which is incorporated herein by reference.

As the alkali-soluble resin, a resin that includes a constitutional unit represented by the following Formula (ED) is also preferable.

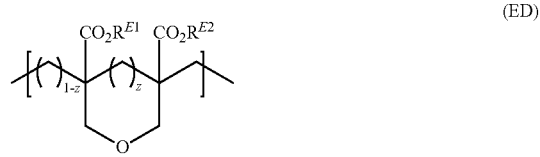

(ED)

In Formula (ED), $R^{E1}$ and $R^{E2}$ each independently represent a hydrogen atom or a hydrocarbon group having 1 to 25 carbon atoms which may have a substituent, and z represents 0 or 1.

The hydrocarbon group having 1 to 25 carbon atoms represented by $R^{E1}$ and $R^{E2}$ is not particularly limited, and examples thereof include: a linear or branched alkyl group such as a methyl group, an ethyl group, a n-propyl group, an isopropyl group, a n-butyl group, an isobutyl group, a t-butyl group, a t-amyl group, a stearyl group, a lauryl group, or a 2-ethylhexyl group; an aryl group such as a phenyl group; an alicyclic group such as a cyclohexyl group, a t-butylcyclohexyl group, a dicyclopentadienyl group, a tricyclodecanyl group, an isobornyl group, an adamantyl group, or a 2-methyl-2-adamantyl group; an alkyl group substituted with an alkoxy group such as a 1-methoxyethyl group or a 1-ethoxyethyl group; and an alkyl group substituted with an aryl group such as a benzyl group. Among these, a primary or secondary hydrocarbon group which is not likely to leave due to an acid or heat, for example, a methyl group, an ethyl group, a cyclohexyl group, or a benzyl group is preferable from the viewpoint of heat resistance.

$R^{E1}$ and $R^{E2}$ may represent the same substituent or different substituents.

Examples of the compound that includes the constitutional unit represented by Formula (ED) include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(n-butyl)-2,2'-[oxybis(methylene)]bis-2-propenoate, di(t-butyl)-2,2'-[oxybis(methylene)bis-2-propenoate, di(isobutyl)-2,2'-[oxybis(methylene)]bis-2-propenoate. Among these, dimethyl-2,2'-[oxybis(methylene)]bis-2-propenoate is preferable.

The alkali-soluble resin may include a constitutional unit other than the constitutional unit represented by Formula (ED).

As the monomer for forming the constitutional unit, for example, from the viewpoint of handleability such as solubility in a solvent, it is preferable that an aryl (meth)acrylate, an alkyl (meth)acrylate, or a polyethyleneoxy (meth)acrylate that imparts oil-solubility is included as a copolymerization component, and it is more preferable that an aryl (meth) acrylate or an alkyl (meth)acrylate is included as a copolymerization component.

In addition, from the viewpoint of alkali developability, it is preferable that a monomer having a carboxyl group such as a (meth)acrylic acid or an itaconic acid that includes an acidic group, a monomer having a phenolic hydroxyl group such as N-hydroxyphenyl maleimide, or a monomer having a carboxylic anhydride group such as maleic anhydride or itaconic anhydride is included as a copolymerization component, and it is more preferable that (meth)acrylic acid is included as a copolymerization component.

Preferable examples of the alkali-soluble resin include a resin including a constitutional unit represented by Formula (ED), a constitutional unit that is formed of benzyl methacrylate, and a constitutional unit that is formed at least one monomer selected from the group consisting of methyl methacrylate and methacrylic acid.

The details of the resin that includes the constitutional unit represented by Formula (ED) can be found in paragraphs "0079" to "0099" of JP2012-198408A, the content of which is incorporated herein by reference.

The weight-average molecular weight (Mw) of the alkali-soluble resin is preferably 2,000 to 50,000. The lower limit is more preferably 5,000 or higher and still more preferably 7,000 or higher. The upper limit is more preferably 30,000 or lower and still more preferably 20,000 or lower.

The acid value of the alkali-soluble resin is preferably 30 to 200 mgKOH/g. The lower limit is more preferably 50 mgKOH/g or higher and still more preferably 70 mgKOH/g or higher. The upper limit is more preferably 150 mgKOH/g or lower and still more preferably 120 mgKOH/g or lower.

In the present disclosure, the acid value is measured using the following method.

The acid value indicates the mass of potassium hydroxide required to neutralize an acidic component per 1 g of solid content. A measurement sample is dissolved in a mixed solvent including tetrahydrofuran and water at a ratio (mass ratio; tetrahydrofuran/water) of 9/1, and the obtained solution is neutralized and titrated with a 0.1 mol/L sodium hydroxide aqueous solution at 25° C. using a potentiometric titrator (trade name: AT-510, manufactured by Kyoto Electronics Manufacturing Co., Ltd.). An inflection point of a titration pH curve is set as a titration end point, and the acid value is calculated from the following expression.

$$A = 56.11 \times Vs \times 0.1 \times f/w$$

A: the acid value (mgKOH/g)

Vs: the amount (mL) of the 0.1 mol/L sodium hydroxide aqueous solution used for the titration f: the titer of the 0.1 mol/L sodium hydroxide aqueous solution w: the mass (g) of the measurement sample (expressed in terms of solid contents)

(Solvent)

The resin composition according to the embodiment of the present disclosure may include a solvent. The solvent is not particularly limited as long as the respective components of the resin composition can be uniformly dissolved or dispersed therein, and can be appropriately selected according to the purpose. For example, water or an organic solvent can be used, and an organic solvent is preferable.

Preferable examples of the organic solvent include an alcohol (for example, methanol), a ketone, an ester, an aromatic hydrocarbon, a halogenated hydrocarbon, dimethylformamide, dimethylacetamide, dimethyl sulfoxide, and sulfolane. Among these, one kind may be used alone, or two or more kinds may be used in combination.

In particular, at least one organic solvent selected from the group consisting of an ester having a cyclic alkyl group and a ketone is preferably used.

Specific examples of the alcohol, the aromatic hydrocarbon, and the halogenated hydrocarbon can be found in, for example, paragraph "0136" of JP2012-194534A, the content of which is incorporated herein by reference.

Specific examples of the ester, the ketone, and the ether can be found in, for example, paragraph "0497" of JP2012-208494A (corresponding to paragraph "0609" of US2012/0235099A). Other examples include n-amyl acetate, ethyl propionate, dimethyl phthalate, ethyl benzoate, methyl sulfate, acetone, methyl isobutyl ketone, diethyl ether, and ethylene glycol monobutyl ether acetate.

As the solvent, one or more selected from ethanol, methanol, methyl 3-methoxypropionate, ethyl 3-methoxypropionate, methyl 3-ethoxypropionate, ethyl 3-ethoxypropionate, N-methyl-2-pyrrolidone, ethyl cellosolve acetate, ethyl lactate, butyl acetate, cyclohexyl acetate, diethylene glycol dimethyl ether, 2-heptanone, cyclopentanone, cyclohexanone, ethyl carbitol acetate, butyl carbitol acetate, ethylene glycol monobutyl ether acetate, propylene glycol monomethyl ether, and propylene glycol monomethyl ether acetate are preferable.

The content of the solvent is preferably 10 mass % to 90 mass % with respect to the total solid content of the resin composition. The lower limit is more preferably 15 mass % or higher and still more preferably 20 mass % or higher. The upper limit is more preferably 80 mass % or lower, and still more preferably 70 mass % or lower.

As the solvent, one kind or two or more kinds may be used. In a case where two or more solvents are used, it is preferable that the total content of the two or more solvents is in the above-described range.

In addition, from the viewpoint of environmental response, it is preferable that the resin composition according to the embodiment of the present disclosure does not include a solvent such as toluene.

(Silane Coupling Agent)

The resin composition according to the embodiment of the present disclosure may include a silane coupling agent. In the present disclosure, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. In addition, it is preferable that the functional group other than a hydrolyzable group is a group which interacts with the resin or the like or forms a bond with the resin or the like to exhibit affinity. Examples of the functional group other than a hydrolyzable group include a vinyl group, a styryl group, a (meth)acryloyl group, a mercapto group, an epoxy group, an oxetanyl group, an amino group, an ureido group, a sulfide group, and an isocyanate group. Among these, a (meth)acryloyl group or an epoxy group is preferable. In addition, examples of the silane coupling agent include a compound described in paragraphs "0018" to "0036" of JP2009-288703A, a compound described in paragraphs "0056" to "0066" of JP2009-242604A, and a compound described in paragraphs "0229" to "0236" of WO2015/166779A, the content of which is incorporated herein by reference.

The content of the silane coupling agent is preferably 0.01 mass % to 15.0 mass % and more preferably 0.05 mass % to 10.0 mass % with respect to the total solid content of the resin composition. As the silane coupling agent, one kind may be used alone, or two or more kinds may be used. In a case where two or more silane coupling agents are used in combination, it is preferable that the total content of the silane coupling agents is in the above-described range.

(Surfactant)

The resin composition according to the embodiment of the present disclosure may include a surfactant from the viewpoint of further improving application properties. As the surfactants, various surfactants such as a fluorine surfactant, a nonionic surfactant, a cationic surfactant, an anionic surfactant, or a silicone surfactant can be used. The details of the surfactant can be found in paragraphs "0238" to "0245" of WO2015/166779A, the content of which is incorporated herein by reference.

By the resin composition according to the embodiment of the present disclosure containing a fluorine surfactant, liquid characteristics (for example, fluidity) of a coating solution prepared from the coloring composition are further improved, and the uniformity in coating thickness and liquid saving properties can be further improved. In addition, a film having a uniform thickness with reduced unevenness in thickness can be formed more suitably.

The fluorine content in the fluorine surfactant is preferably 3 mass % to 40 mass %, more preferably 5 mass % to 30 mass %, and still more preferably 7 mass % to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present disclosure.

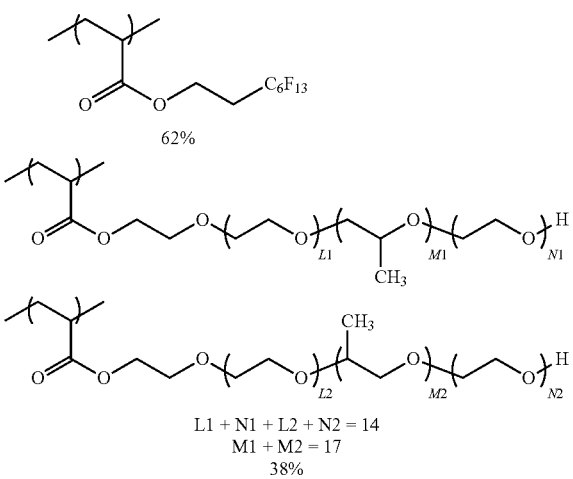

The weight-average molecular weight of the compound is preferably 3,000 to 50,000 and, for example, 14,000. In the compound, "%" (62% and 38%) representing the proportion of a constitutional unit is mass %.

In addition, as the fluorine surfactant, a fluorine-containing polymer having an ethylenically unsaturated group at a side chain can also be used. Specific examples include compounds described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil & Fat Co., Ltd.), and OLFINE E1010 and SURFYNOL 104, 400, and 440 (all of which are manufactured by Nissin Chemical Co., Ltd.).

The content of the surfactant is preferably 0.001 to 5.0 mass % and more preferably 0.005 to 3.0 mass % with respect to the total solid content of the resin composition. As the surfactant, one kind may be used alone, or two or more kinds may be used. In a case where two or more surfactants are used in combination, it is preferable that the total content of the two or more surfactants is in the above-described range.

(Ultraviolet Absorber)

It is preferable that the resin composition according to the embodiment of the present disclosure further includes an ultraviolet absorber. Examples of the ultraviolet absorber include conjugated diene compound and a diketone compound. Among these, a conjugated diene compound is preferable. As the conjugated diene compound, a compound represented by the following Formula (UV-1) is more preferable.

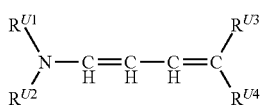

(UV-1)

In Formula (UV-1), $R^{U1}$ and $R^{U2}$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^{U1}$ and $R^{U2}$ may form a cyclic amino group with a nitrogen atom bonded to $R^{U1}$ and $R^{U2}$. Examples of the cyclic amino group include a piperidino group, a morpholino group, a pyrrolidino group, a hexahydroazepino group, and a piperazino group.

$R^{U1}$ and $R^{U2}$ each independently represent preferably an alkyl group having 1 to 20 carbon atoms, more preferably an alkyl group having 1 to 10 carbon atoms, and still more preferably an alkyl group having 1 to 5 carbon atoms.

$R^{U3}$ and $R^{U4}$ represent an electron-withdrawing group. $R^{U3}$ and $R^{U4}$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^{U3}$ and $R^{U4}$ may be bonded to each other to form a cyclic electron-withdrawing group. Examples of the cyclic electron-withdrawing group which is formed by $R^{U3}$ and $R^{U4}$ being bonded to each other include a 6-membered ring having two carbonyl groups.

At least one of $R^{U1}$, $R^{U2}$, $R^{U3}$, or $R^{U4}$ may represent a polymer obtained from a monomer which is bonded to a vinyl group through a linking group. At least one of $R^{U1}$, $R^{U2}$, $R^{U3}$, or $R^{U4}$ may represent a copolymer obtained from the above polymer and another monomer.

The description of the substituent of the ultraviolet absorber represented by Formula (UV-1) can be found in paragraph "0320" to "0327" of JP2013-068814A, the content of which is incorporated herein by reference. Examples of a commercially available product of the ultraviolet absorber represented by Formula (UV-1) include UV503 (manufactured by Daito Chemical Co., Ltd.).

As the diketone compound used as the ultraviolet absorber, a compound represented by the following Formula (UV-2) is preferable.

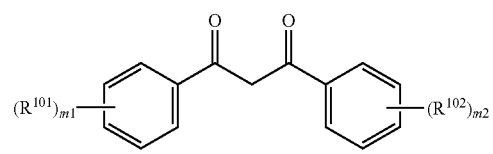

(UV-2)

In Formula (UV-2), $R^{101}$ and $R^{102}$ each independently represent a substituent, and m1 and m2 each independently represent an integer of 0 to 4. Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxy group, a halogen atom, and a cyano group. Among these, an alkyl group or an alkoxy group is preferable.

The number of carbon atoms in the alkyl group is preferably 1 to 20. The alkyl group is, for example, linear, branched, or cyclic, and is preferably linear or branched and more preferably branched.

The number of carbon atoms in the alkoxy group is preferably 1 to 20. The alkoxy group is, for example, linear, branched, or cyclic, and is preferably linear or branched and more preferably branched.

It is preferable that one of $R^{101}$ and $R^{102}$ represent an alkyl group and the other one of $R^{101}$ and $R^{102}$ represent an alkoxy group.

m1 and m2 each independently represent preferably an integer of 0 to 2, more preferably 0 or 1, and still more preferably 1.

Examples of the compound represented by Formula (UV-2) include the following compound.

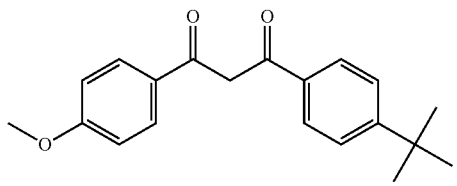 [SMILES: COc1ccc(C(=O)CC(=O)c2ccc(C(C)(C)C)cc2)cc1]

As the ultraviolet absorber, UVINUL A (manufactured by BASF SE) can also be used. In addition, as the ultraviolet absorber, an ultraviolet absorber such as an amino diene compound, a salicylate compound, a benzophenone compound, a benzotriazole compound, an acrylonitrile compound, or a triazine compound can be preferably used. Specifically, a compound described in JP2013-068814A can be used. As the benzotriazole compound, MYUA series (manufactured by Miyoshi Oil & Fat Co., Ltd.; (The Chemical Daily, Feb. 1, 2016) may be used.

The content of the ultraviolet absorber is preferably 0.01 mass % to 10 mass % and more preferably 0.01 mass % to 5 mass % with respect to the mass of the total solid content of the resin composition.

(Polymerization Inhibitor)

The composition according to the embodiment of the present disclosure may include a polymerization inhibitor. Examples of the polymerization inhibitor include hydroquinone, p-methoxyphenol, di-tert-butyl-p-cresol, pyrogallol, t-butylcatechol, benzoquinone, 4,4'-thiobis(3-methyl-6-tert-butylphenol), 2,2'-methylenebis(4-methyl-6-tert-butylphenol), and N-nitrosophenylhydroxyamine salt (for example, an ammonium salt or a cerium (III) salt). Among these, p-methoxyphenol is preferable. The polymerization inhibitor may also function as an antioxidant. The content of the polymerization inhibitor is preferably 0.01 mass % to 5 mass % with respect to the total solid content of the resin composition.

(Other Components)

Optionally, the resin composition according to the embodiment of the present disclosure may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the infrared absorbing composition appropriately including the components, desired stability, film properties, and the like of an optical filter such as a near infrared cut filter can be adjusted. The details of the components can be found in, for example, paragraph "0183" of JP2012-003225A (corresponding to "0237" of US2013/0034812A) and paragraphs "0101" to "0104" and "0107" to "0109" of JP2008-250074A, the contents of which are incorporated herein by reference. As the antioxidant, for example, a phenol compound, a phosphorus compound, (for example, a compound described in paragraph "0042" of JP2011-090147A), or a thioether compound can be used. Examples of a commercially available product of the antioxidant include ADEKA STAB series (AO-20, AO-30, AO-40, AO-50, AO-50F, AO-60, AO-60G, AO-80, and AO-330, manufactured by Adeka Corporation). The content of the antioxidant is preferably 0.01 mass % to 20 mass % and more preferably 0.3 mass % to 15 mass % with respect to the total solid content of the resin composition. As the antioxidant, one kind may be used alone, or two or more kinds may be used. In a case where two or more antioxidants are used in combination, it is preferable that the total content of the antioxidants is in the above-described range.

(Preparation of Resin Composition)

The composition according to the embodiment of the present disclosure can be prepared by mixing the above-described various components. In addition, It is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) or nylon is preferable.

The pore diameter of the filter is preferably 0.01 μm to 7.0 μm, more preferably 0.01 μm to 3.0 μm, and still more preferably 0.05 μm to 0.5 μm. In the above-described range, fine foreign matter, which inhibits preparation of a fine and smooth composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd., or Kits Microfilter Corporation.

(Use of Resin Composition)

The resin composition according to the embodiment of the present disclosure can be made liquid. Therefore, a film can be easily formed, for example, by applying the resin composition according to the embodiment of the present disclosure to a substrate or the like and drying the resin composition.

For example, in a case where a film is formed by coating, the viscosity of the composition according to the embodiment of the present disclosure is preferably in a range of 1 mPa·s to 100 mPa·s. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

The total solid content of the composition according to the embodiment of the present disclosure changes depending on a coating method and, for example, is preferably 1 mass % to 50 mass %. The lower limit is more preferably 10 mass % or higher. The upper limit is more preferably 30 mass % or lower.

The use of the resin composition according to the embodiment of the present disclosure is not particularly limited. The resin composition according to the embodiment of the present disclosure can be preferably used to form an infrared cut filter or the like. For example, the resin composition can be preferably used, for example, for an infrared cut filter (for example, an infrared cut filter for a wafer level lens) on a light receiving side of a solid image pickup element or as an infrared cut filter on a back surface side (opposite to the light receiving side) of a solid image pickup element In particular, the resin composition can be preferably used as an infrared cut filter on a light receiving side of a solid image pickup element. In addition, by the resin composition according to the embodiment of the present disclosure including the colorant that shields visible light, an infrared transmitting filter that can allow transmission of only infrared light at a specific wavelength or higher can also be formed. For example, an infrared transmitting filter that shields light in a wavelength of 400 nm to 900 nm and can allow transmission of infrared light in a wavelength range of 900 nm or longer can also be formed.

In addition, it is preferable that the resin composition according to the embodiment of the present disclosure is stored in a storage container.

As the storage container, in order to suppress infiltration of impurities (contamination) into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

<Film>

A film according to the embodiment of the present disclosure is a film that is formed of the resin composition according to the embodiment of the present disclosure or a film that is formed by curing the resin composition according to the embodiment of the present disclosure. In addition, in a case where the resin composition according to the embodiment of the present disclosure includes a solvent, the film is preferably a film from which the solvent is removed or a cured film from which the solvent is removed.

The film according to the embodiment of the present disclosure can be preferably used as an infrared cut filter. In addition, the film according to the embodiment of the present disclosure can also be used as a heat ray shielding filter or an infrared transmitting filter. The film according to the embodiment of the present disclosure may be used in a state where it is laminated on a support, or may be peeled off from a support. The film according to the embodiment of the present disclosure may be a film having a pattern or a film (flat film) not having a pattern.

The thickness of the film according to the embodiment of the present disclosure can be appropriately adjusted according to the purpose. The thickness of the film is preferably 20 µm or less, more preferably 10 µm or less, and still more preferably 5 µm or less. For example, the lower limit of the thickness of the film is preferably 0.1 µm or more, more preferably 0.2 µm or more, and still more preferably 0.3 µm or more.

The film according to the embodiment of the present disclosure has a maximum absorption wavelength preferably in a wavelength range of 600 nm to 1,200 nm, more preferably in a wavelength range of 700 nm to 1,000 nm, and still more preferably in a wavelength range of 740 nm to 960 nm.

In a case where the film according to the embodiment of the present disclosure is used as an infrared cut filter, in the present invention, it is preferable that the film according to the embodiment of the present disclosure satisfies at least one of the following condition (1), . . . , or (4), and it is more preferable that the film satisfy all the following conditions (1) to (4).

(1) A transmittance at a wavelength of 400 nm is preferably 70% or higher, more preferably 80% or higher, still more preferably 85% or higher, and still more preferably 90% or higher (2) A transmittance at a wavelength of 500 nm is preferably 70% or higher, more preferably 80% or higher, still more preferably 90% or higher, and still more preferably 95% or higher (3) A transmittance at a wavelength of 600 nm is preferably 70% or higher, more preferably 80% or higher, still more preferably 90% or higher, and still more preferably 95% or higher (4) A transmittance at a wavelength of 650 nm is preferably 70% or higher, more preferably 80% or higher, still more preferably 90% or higher, and still more preferably 95% or higher The film according to the embodiment of the present disclosure can also be used in combination with a color filter that includes a chromatic colorant. The color filter can be manufactured using a coloring composition including a chromatic colorant. Examples of the chromatic colorant include the chromatic colorants described regarding the resin composition according to the embodiment of the present disclosure. The coloring composition may further include, for example, a resin, a curable compound, a polymerization initiator, a surfactant, a solvent, a polymerization inhibitor, and an ultraviolet absorber. In more detail, for example, the materials described above can be used.

In a case where the film according to the embodiment of the present disclosure is used in combination with a color filter, it is preferable that the color filter is disposed on an optical path of the film according to the embodiment of the present disclosure. For example, the film according to the embodiment of the present disclosure and the color filter can be laminated to be used as a laminate. In the laminate, the film according to the embodiment of the present disclosure and the color filter may be or may not be adjacent to each other in a thickness direction. In a case where the film according to the embodiment of the present disclosure is not adjacent to the color filter in the thickness direction, the film according to the embodiment of the present disclosure may be formed on another support other than a support on which the color filter is formed, or another member (for example, a microlens or a planarizing layer) constituting a solid image pickup element may be interposed between the film according to the embodiment of the present disclosure and the color filter.

In the present disclosure, "infrared cut filter" refers to a filter that allows transmission of light (visible light) in the visible range and shields at least a part of light (infrared light) in the infrared range. The infrared cut filter may be a filter that allows transmission of light in the entire wavelength range of the visible range, or may be a filter that allows transmission of light in a specific wavelength range of the visible range and shields light in another specific wavelength range of the visible range. In addition, in the present disclosure, a color filter refers to a filter that allows transmission of light in a specific wavelength range of the visible range and shields light in another specific wavelength range of the visible range. In addition, in the present disclosure, "infrared transmitting filter" refers to a filter that shields visible light and allows transmission of at least a part of infrared light.

The film according to the embodiment of the present disclosure can be used in various devices including a solid image pickup element such as a charge coupled device (CCD) or a complementary metal-oxide semiconductor (CMOS), an infrared sensor, or an image display device.

<Method of Forming Film>

Next, a method of forming the film according to the embodiment of the present disclosure will be described. The film according to the embodiment of the present disclosure can be formed through a step of applying the resin composition according to the embodiment of the present disclosure.

In the method of forming the film according to the embodiment of the present disclosure, it is preferable that the resin composition is applied to a support. Examples of the support include a substrate formed of a material such as silicon, non-alkali glass, soda glass, PYREX (registered trade name) glass, or quartz glass. For example, an organic film or an inorganic film may be formed on the substrate. Examples of a material of the organic film include the above-described transparent resin. In addition, as the support, a substrate formed of the above-described resin can also be used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat. In addition, in a case where a glass substrate is used as the support, it is preferable that an inorganic film is formed on the glass substrate or the glass substrate may be dealkalized to be used. According to this aspect, a film in which the occurrence of foreign matter is further suppressed can be easily formed. In a case where a support including a component (for example, in the case of soda glass, a sodium ion) that is likely to be transferred from the support side such as soda glass to the film formed on the support is used, the component transferred from the support reacts with the pigment derivative to form a salt or the like, and crystals may precipitate. However, even in a case where the resin composition according to the embodiment of the present disclosure is applied to the support, a film in which the occurrence of foreign matter is suppressed can be formed. Therefore, the resin composition according to the embodiment of the present disclosure is particularly effective in a case where a film is formed on the support using the resin composition.

As a method of applying the resin composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet— Infinite Possibilities in Patent—" (February, 2005, S.B. Research Co., Ltd.) and methods described in JP2003-262716A, JP2003-185831A, JP2003-261827A, JP2012-126830A, and JP2006-169325A.

A composition layer formed by applying the resin composition may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, preferably 50° C. or higher and more preferably 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 seconds to 3,000 seconds, more preferably 40 seconds to 2,500 seconds, and still more preferably 80 seconds to 220 seconds. Drying can be performed using a hot plate, an oven, or the like.

The method of forming the film according to the embodiment of the present disclosure may further include a step of forming a pattern. Examples of a pattern forming method include a pattern forming method using a photolithography method and a pattern forming method using a dry etching method. In a case where the film according to the embodiment of the present disclosure is used as a flat film, the step of forming a pattern is not necessarily performed. Hereinafter, the step of forming a pattern will be described in detail.

—Case where Pattern is Formed Using Photolithography Method—

It is preferable that the pattern forming method using a photolithography method includes: a step (exposure step) of exposing the composition layer, which is formed by applying the resin composition according to the embodiment of the present disclosure, in a pattern shape; and a step (development step) of forming a pattern by removing a non-exposed portion of the composition layer by development. Optionally, the pattern forming method may further include a step (post-baking step) of baking the developed pattern. Hereinafter, the respective steps will be described.

<<Exposure Step>>

In the exposure step, the composition layer is exposed in a pattern shape. For example, the composition layer can be exposed in a pattern shape using an exposure device such as a stepper through a mask having a predetermined mask pattern. As a result, an exposed portion can be cured. As radiation (light) used during the exposure, ultraviolet rays such as g-rays or i-rays are preferable, and i-rays are more preferable. The irradiation dose (exposure dose) is preferably 0.03 J/cm$^2$ to 2.5 J/cm$^2$, more preferably 0.05 J/cm$^2$ to 1.0 J/cm$^2$, and still more preferably 0.08 J/cm$^2$ to 0.5 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and preferably can be selected in a range of 1,000 W/m$^2$ to 100,000 W/m$^2$ (for example, 5,000 W/m$^2$, 15,000 W/m$^2$, or 35,000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

<<Development Step>>

Next, a pattern is formed by removing a non-exposed portion of the exposed composition layer by development. The non-exposed portion of the composition layer can be removed by development using a developer. As a result, a non-exposed portion of the composition layer in the exposure step is eluted into the developer, and only the photocured portion remains on the support. As the developer, an alkali developer which does not cause damages to a solid image pickup element as an underlayer, a circuit or the like is desired. For example, the temperature of the developer is preferably 20° C. to 30° C. The development time is preferably 20 seconds to 180 seconds. In addition, in order to further improve residue removing properties, a step of shaking the developer off per 60 seconds and supplying a new developer may be repeated multiple times.

Examples of the alkaline agent used as the developer include: an organic alkaline compound such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. As the developer, an alkaline aqueous solution in which the above alkaline agent is diluted with pure water is preferably used. A concentration of the alkaline agent in the alkaline aqueous solution is preferably 0.001 mass % to 10 mass % and more preferably 0.01 mass % to 1 mass %. In addition, a surfactant may be used as the developer. Examples of the surfactant include the surfactants described above regarding the composition. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 times to 100 times. In a case where a developer including the alkaline aqueous solution is used, it is preferable that the layer is rinsed with pure water after development.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and still more preferably 90° C. or lower. The lower limit is, for example, 50° C. or higher. The film after the development is post-baked continuously or batchwise using heating means such as a hot plate, a convection oven (hot air circulation dryer), a high-frequency heater under the above-described conditions. In addition, in a case where a pattern is formed through a low-temperature process, post-baking is not necessarily performed.

Case where Pattern is Formed Using Dry Etching Method—

The formation of a pattern using a dry etching method can be performed using a method including: applying the resin composition to a support or the like to form a composition layer; curing the composition layer to form a cured composition layer; forming a patterned photoresist layer on the cured composition layer; and dry-etching the cured composition layer with etching gas by using the patterned photoresist layer as a mask. It is preferable that pre-baking is further performed in order to form the photoresist layer. In particular, in a preferable aspect, as a process of forming the photoresist, baking after exposure or baking after development (post-baking) is performed. The details of the pattern formation using the dry etching method can be found in paragraphs "0010" to "0067" of JP2013-064993A, the content of which is incorporated herein by reference.

<Method of Manufacturing Infrared Cut Filter>

An infrared cut filter according to the embodiment of the present disclosure comprises a film including a infrared absorbing pigment and a resin having an infrared absorbing group and preferably comprises the film according to the embodiment of the present disclosure.

The infrared cut filter according to the embodiment of the present disclosure may be a filter that cuts only infrared light in a part of an infrared range or a filter that cuts infrared light in the entire infrared range. Examples of the filter that cuts only infrared light in a part of an infrared range include a near infrared cut filter.

In addition, the infrared cut filter according to the embodiment of the present disclosure is preferably a filter that cuts infrared light in a wavelength range of 750 nm to 1,000 nm, more preferably a filter that cuts infrared light in a wavelength range of 750 nm to 1,200 nm, and still more preferably a filter that cuts infrared light in a wavelength range of 700 nm to 1,200 nm.

The infrared cut filter according to the embodiment of the present disclosure may further include, for example, a layer containing copper, a dielectric multi-layer film, or an ultraviolet absorbing layer in addition to the above-described film. By further including at least the layer containing copper and/or the dielectric multi-layer film, the infrared cut filter according to the embodiment of the present disclosure having a wide viewing angle and excellent infrared shielding properties can be easily obtained. In addition, by including the ultraviolet absorbing layer, the infrared cut filter according to the embodiment of the present disclosure having excellent ultraviolet shielding properties can be obtained. The details of the ultraviolet absorbing layer can be found in the description of an absorbing layer described in paragraphs "0040" to "0070" and paragraphs "0119" of "0145" of WO2015/099060, the content of which is incorporated herein by reference. The details of the dielectric multi-layer film can be found in paragraphs "0255" to "0259" of JP2014-041318A, the content of which is incorporated herein by reference. As the layer containing copper, a glass substrate (copper-containing glass substrate) formed of glass containing copper, or a layer (copper complex-containing layer) containing a copper complex may also be used. Examples of the copper-containing glass substrate include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation).

The infrared cut filter according to the embodiment of the present disclosure can be used in various devices including a solid image pickup element such as a charge coupled device (CCD) or a complementary metal-oxide semiconductor (CMOS), an infrared sensor, or an image display device.

It is also preferable that the infrared cut filter according to the embodiment of the present disclosure includes: a pixel (pattern) of the film that is formed using the resin composition according to the embodiment of the present disclosure; and at least one pixel (pattern) selected from the group consisting of a red pixel, a green pixel, a blue pixel, a magenta pixel, a yellow pixel, a cyan pixel, a black pixel, and an achromatic pixel.

A method of manufacturing the infrared cut filter according to the embodiment of the present disclosure is not particularly limited and is preferably a method including: a step of applying the resin composition according to the embodiment of the present disclosure to a support to form a composition layer; a step of exposing the composition layer in a pattern shape; and a step of forming a pattern by removing a portion that is not exposed during the exposure by development, or a method including: a step of forming a layer that includes an infrared absorbing pigment and a resin having an infrared absorbing group on a support; a step of forming a photoresist layer on the layer; a step of obtaining a resist pattern by patterning the photoresist layer by exposure and development; and a step of dry-etching the cured layer by using the resist pattern as an etching mask.

The respective steps of the method of manufacturing the infrared cut filter according to the embodiment of the present disclosure can refer to the respective steps of the method of forming the film according to the embodiment of the present disclosure.

<Solid Image Pickup Element>

A solid image pickup element according to the embodiment of the present disclosure comprises a film including a infrared absorbing pigment and a resin having an infrared absorbing group and preferably comprises the film according to the embodiment of the present disclosure. The configuration of the solid image pickup element is not particularly limited as long as it includes the film according to the embodiment of the present disclosure and functions as a solid image pickup element. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the embodiment of the present disclosure is formed on the device protective film. Further, a configuration in which light collecting means (for example, a microlens; hereinafter, the same shall be applied) is provided above the device protective film and below the film according to the embodiment of the present disclosure (on a side thereof close the support), or a configuration in which light collecting means is provided on the film according to the embodiment of the present disclosure may be adopted. In addition, the color filter used in the solid image pickup element may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present disclosure comprises a film including a infrared absorbing pigment and a resin having an infrared absorbing group and preferably comprises the film according to the embodiment of the present disclosure. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present disclosure is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the embodiment of the present disclosure comprises a film including a infrared absorbing pigment and a resin having an infrared absorbing group and preferably comprises the film according to the embodiment of the present disclosure. The configuration of the infrared sensor is not particularly limited as long as it functions as an infrared sensor. Hereinafter, an embodiment of the infrared sensor according to the present disclosure will be described using the drawings.

In FIG. 1, reference numeral 110 represents a solid image pickup element. In an imaging region provided on a solid image pickup element 110, infrared cut filters 111 and infrared transmitting filters 114 are provided. In addition, color filters 112 are laminated on the infrared cut filters 111. Microlenses 115 are disposed on an incidence ray hυ side of the color filters 112 and the infrared transmitting filters 114. A planarizing layer 116 is formed so as to cover the microlenses 115.

The infrared cut filter 111 can be formed using the resin composition according to the embodiment of the present disclosure. Spectral characteristics of the infrared cut filters 111 can be selected according to the emission wavelength of an infrared light emitting diode (infrared LED) to be used.

The color filters 112 is not particularly limited as long as pixels which allow transmission of light having a specific wavelength in a visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected according to the emission wavelength of the infrared LED to be used. For example, in a case where the emission wavelength of the infrared LED is 850 nm, a maximum value of a light transmittance of the infrared transmitting filter 114 in the thickness direction of the film in a wavelength range of 400 nm to 650 nm is preferably 30% or lower, more preferably 20% or lower, still more preferably 10% or lower and still more preferably 0.1% or lower. It is preferable that the transmittance satisfies the above-described conditions in the entire wavelength range of 400 nm to 650 nm.

A minimum value of a light transmittance of the infrared transmitting filter 114 in the thickness direction of the film in a wavelength range of 800 nm or longer (preferably 800 nm to 1,300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED.

The thickness of the infrared transmitting filter 114 is preferably 100 μm or less, more preferably 15 μm or less, still more preferably 5 μm or less, and still more preferably 1 μm or less. The lower limit value is preferably 0.1 μm. In a case where the thickness is in the above-described range, the film can satisfy the above-described spectral characteristics.

A method of measuring the spectral characteristics, the thickness, and the like of the infrared transmitting filter 114 are as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 nm to 1,300 nm using an ultraviolet-visible-near infrared spectrophotometer (U-4100, manufactured by Hitachi High-Technologies Corporation).

In addition, for example, in a case where the emission wavelength of the infrared LED is 940 nm, it is preferable that a maximum value of a light transmittance of the infrared transmitting filter 114 in a thickness direction in a wavelength range of 450 nm to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1,000 nm to 1,300 nm is 70% or higher.

In the infrared sensor shown in FIG. 1, an infrared cut filter (other infrared cut filter) other than the infrared cut filter 111 may be further disposed on the planarizing layer 116. As the other infrared cut filter, for example, at least a layer containing copper or a dielectric multi-layer film may be provided. The details are as described above. In addition, as the other infrared cut filter, a dual band pass filter may be used.

(Camera Module)

A camera module according to the embodiment of the present disclosure comprises a solid image pickup element and the infrared cut filter according to the embodiment of the present disclosure.

In addition, it is preferable that the camera module according to the embodiment of the present disclosure further includes a lens and a circuit that processes an image obtained from the solid image pickup element.

The solid image pickup element used in the camera module according to the embodiment of the present disclosure may be the solid image pickup element according to the embodiment of the present disclosure or may be a well-known solid image pickup element.

In addition, as the lens used in the camera module according to the embodiment of the present disclosure and the circuit that processes an image obtained from the solid image pickup element, a well-known lens and a well-known circuit can be used.

Examples of the camera module can be found in a camera module described in JP2016-006476A or JP2014-197190A, the contents of which are incorporated herein by reference.

EXAMPLES

Hereinafter, the present disclosure will be described in detail using Examples. Materials, used amounts, ratios, treatment details, treatment procedures, and the like shown in the following examples can be appropriately changed within a range not departing from the scope of the present disclosure. Accordingly, the scope of the present disclosure is not limited to the following specific examples. Unless specified otherwise, "part(s)" and "%" represent "part(s) by mass" and "mass %".

<Preparation of Dispersion>

10 parts by mass of an infrared absorbing pigment shown in the following Tables 1 to 4, 7.9 parts by mass of a resin having an infrared absorbing group shown in the following Tables 1 to 4, 132 parts by mass of propylene glycol methyl ether acetate (PGMEA), and 200 parts by mass of zirconia beads having a diameter of 0.3 mm were mixed with each other, the mixture was dispersed using a paint shaker for 5 hours, and the beads were separated by filtration. As a result, a dispersion was manufactured.

In order to manufacture a dispersion to which a resin (D-1) or a resin (D-2) was added, 10 parts by mass of an infrared absorbing pigment, 3.9 parts by mass of a resin having an infrared absorbing group, 4.0 parts by mass of a resin shown in the following tables, 132 parts by mass of propylene glycol methyl ether acetate (PGMEA), and 200 parts by mass of zirconia beads having a diameter of 0.3 mm were mixed with each other, and the same operations were performed.

<Evaluation of Dispersibility>

(Viscosity)

Using an E-type viscometer, the viscosity of the dispersion at 25° C. was measured at a rotation speed of 1,000 rpm and was evaluated based on the following criteria. As the viscosity decreases, the dispersibility becomes higher.

A: 1 mPa·s to 15 mPa·s
B: higher than 15 mPa·s and 30 mPa·s or lower
C: higher than 30 mPa·s and 100 mPa·s or lower
D: higher than 100 mPa·s (Particle Size)

The volume average particle size of the infrared absorbing pigment in the dispersion was measured using MICROTRAC UPA 150 (manufactured by Nikkiso Co., Ltd.). As the average particle size decreases, the dispersibility becomes higher.

A: the average particle size of the infrared absorbing pigment was 5 nm to 50 nm B: the average particle size of the infrared absorbing pigment was more than 50 nm and 100 nm or less C: the average particle size of the infrared absorbing pigment was more than 100 nm and 500 nm or less D: the average particle size of the infrared absorbing pigment was more than 500 nm

TABLE 1

| | | | Resin having Infrared Absorbing Group | | | |
| | | | Copolymerization Component | | | |
| | Pigment | Resin Name | First Component | Second Component | Third Component | Fourth Component |
| --- | --- | --- | --- | --- | --- | --- |
| Dispersion 1 | Pig-1 | A-ppb-1-P1 | A-ppb-1 | co-1 | co-5 | — |
| Dispersion 2 | Pig-2 | A-ppb-2-P1 | A-ppb-2 | co-1 | co-5 | co-8 |
| Dispersion 3 | Pig-1 | A-ppb-3-P1 | A-ppb-3 | co-1 | co-6 | — |
| Dispersion 4 | Pig-2 | A-ppb-4-P1 | A-ppb-4 | co-2 | co-5 | — |
| Dispersion 5 | Pig-1 | A-ppb-5-P1 | A-ppb-5 | co-1 | co-5 | — |
| Dispersion 6 | Pig-1 | A-ppb-6-P1 | A-ppb-6 | co-1 | co-7 | — |
| Dispersion 7 | Pig-4 | A-ppb-7-P1 | A-ppb-7 | co-3 | co-5 | — |
| Dispersion 8 | Pig-4 | A-ppb-8-P1 | A-ppb-8 | — | co-5 | — |
| Dispersion 9 | Pig-2 | A-ppb-9-P1 | A-ppb-9 | co-4 | co-5 | — |
| Dispersion 10 | Pig-3 | A-ppb-10-P1 | A-ppb-10 | co-1 | co-7 | — |
| Dispersion 11 | Pig-1/Pig-2 = 1/1 | A-ppb-1-P1 | A-ppb-1 | co-1 | co-5 | — |
| Dispersion 12 | Pig-1 | A-ppb-1-P1/A-ppb-2-P1 = 1/1 | A-ppb-1 A-ppb-2 | co-1 co-1 | co-5 co-5 | — co-8 |
| Dispersion 13 | Pig-5 | A-sq-1-P1 | A-sq-1 | co-1 | co-5 | — |
| Dispersion 14 | Pig-6 | A-sq-2-P1 | A-sq-2 | co-3 | co-7 | co-9 |
| Dispersion 15 | Pig-6 | A-sq-3-P1 | A-sq-3 | co-1 | co-5 | — |
| Dispersion 16 | Pig-5 | A-sq-4-P1 | A-sq-4 | co-4 | co-6 | — |
| Dispersion 17 | Pig-7 | A-sq-5-P1 | A-sq-5 | — | co-5 | co-8 |
| Dispersion 18 | Pig-5/Pig-6 = 1/1 | A-sq-1-P1 | A-sq-1 | co-1 | co-5 | — |
| Dispersion 19 | Pig-5/Pig-6 = 1/1 | A-sq-1-P1/A-sq-1-P2 = 1/1 | A-sq-1 A-sq-2 | co-1 co-3 | co-5 co-7 | — co-9 |
| Dispersion 20 | Pig-8 | A-cy-1-P1 | A-cy-1 | co-1 | co-5 | — |
| Dispersion 21 | Pig-8 | A-cy-2-P1 | A-cy-2 | co-1 | co-7 | — |
| Dispersion 22 | Pig-8 | A-cy-3-P1 | A-cy-3 | co-2 | co-5 | — |
| Dispersion 23 | Pig-8 | A-cy-4-P1 | A-cy-4 | co-1 | co-5 | — |
| Dispersion 24 | Pig-9 | A-ox-1-P1 | A-ox-1 | co-1 | co-5 | — |
| Dispersion 25 | Pig-9 | A-ox-2-P1 | A-ox-2 | co-3 | co-6 | — |
| Dispersion 26 | Pig-9 | A-ox-3-P1 | A-ox-3 | co-1 | co-5 | — |
| Dispersion 27 | Pig-9 | A-ox-4-P1 | A-ox-4 | — | co-5 | co-9 |
| Dispersion 28 | Pig-10 | A-ph-1-P1 | A-ph-1 | co-1 | co-5 | — |
| Dispersion 29 | Pig-10 | A-ph-2-P1 | A-ph-2 | co-4 | co-7 | co-10 |

TABLE 1-continued

| | | | | | | |
|---|---|---|---|---|---|---|
| Dispersion 30 | Pig-10 | A-ph-3-P1 | A-ph-3 | co-1 | co-5 | — |
| Dispersion 31 | Pig-11 | A-na-1-P1 | A-na-1 | co-1 | co-7 | — |
| Dispersion 32 | Pig-11 | A-na-2-P1 | A-na-2 | co-3 | co-5 | — |
| Dispersion 33 | Pig-11 | A-na-3-P1 | A-na-3 | co-1 | co-5 | — |
| Dispersion 34 | Pig-12 | A-cr-1-P1 | A-cr-3 | co-1 | co-7 | — |

| | Resin having Infrared Absorbing Group | | | | | | | |
|---|---|---|---|---|---|---|---|---|
| | Copolymerization Component Weight Ratio | | | | Weight-Average Molecular Weight (Mw) | Acid Value (mmol/g) | | | |
| | First Component | Second Component | Third Component | Fourth Component | | | Resin | Viscosity | Particle Size |
| Dispersion 1 | 65 | 10 | 25 | — | 20,000 | 1.16 | — | A | A |
| Dispersion 2 | 53 | 12 | 20 | 15 | 33,000 | 1.39 | — | A | A |
| Dispersion 3 | 58 | 17 | 25 | — | 25,000 | 1.97 | — | A | A |
| Dispersion 4 | 60 | 20 | 20 | — | 26,000 | 0.72 | — | A | A |
| Dispersion 5 | 75 | 5 | 20 | — | 21,000 | 0.58 | — | A | A |
| Dispersion 6 | 63 | 12 | 25 | — | 20,000 | 1.39 | — | B | B |
| Dispersion 7 | 48 | 32 | 20 | — | 24,000 | 1.02 | — | A | A |
| Dispersion 8 | 70 | — | 30 | — | 20,000 | — | — | A | A |
| Dispersion 9 | 60 | 25 | 15 | — | 26,000 | 1.09 | — | A | A |
| Dispersion 10 | 65 | 10 | 25 | — | 18,000 | 1.16 | — | B | B |
| Dispersion 11 | 65 | 10 | 25 | — | 20,000 | 1.16 | — | A | A |
| Dispersion 12 | 65 | 10 | 25 | — | 20,000 | 1.16 | — | A | A |
| | 53 | 12 | 20 | 15 | 33,000 | 1.39 | — | | |
| Dispersion 13 | 65 | 10 | 25 | — | 25,000 | 1.16 | — | A | A |
| Dispersion 14 | 55 | 25 | 15 | 5 | 28,000 | 0.80 | — | A | A |
| Dispersion 15 | 62 | 12 | 26 | — | 22,000 | 1.39 | — | A | A |
| Dispersion 16 | 55 | 25 | 20 | — | 31,000 | 1.09 | — | A | A |
| Dispersion 17 | 67 | — | 21 | 12 | 23,000 | — | — | A | A |
| Dispersion 18 | 65 | 10 | 25 | — | 25,000 | 1.16 | — | B | A |
| Dispersion 19 | 65 | 10 | 25 | — | 25,000 | 1.16 | — | A | A |
| | 55 | 25 | 15 | 5 | 28,000 | 0.80 | — | | |
| Dispersion 20 | 65 | 10 | 25 | — | 27,000 | 1.16 | — | A | A |
| Dispersion 21 | 68 | 11 | 21 | — | 22,000 | 1.28 | — | A | A |
| Dispersion 22 | 59 | 27 | 14 | — | 20,000 | 0.97 | — | A | A |
| Dispersion 23 | 65 | 10 | 25 | — | 19,000 | 1.16 | — | A | A |
| Dispersion 24 | 69 | 9 | 22 | — | 18,000 | 1.05 | — | A | A |
| Dispersion 25 | 59 | 28 | 13 | — | 32,000 | 0.89 | — | A | A |
| Dispersion 26 | 65 | 10 | 25 | — | 26,000 | 1.16 | — | A | A |
| Dispersion 27 | 66 | 27 | 7 | — | 20,000 | — | — | B | B |
| Dispersion 28 | 66 | 11 | 23 | — | 21,000 | 1.28 | — | A | A |
| Dispersion 29 | 49 | 17 | 24 | 10 | 27,000 | 0.74 | — | A | A |
| Dispersion 30 | 65 | 10 | 25 | — | 24,000 | 1.16 | — | A | A |
| Dispersion 31 | 65 | 12 | 23 | — | 23,000 | 1.39 | — | A | A |

TABLE 1-continued

| | | | | | | | | | |
|---|---|---|---|---|---|---|---|---|---|
| Dispersion 32 | 47 | 36 | 17 | — | 22,000 | 1.15 | — | A | A |
| Dispersion 33 | 61 | 14 | 25 | — | 20,000 | 1.63 | — | A | A |
| Dispersion 34 | 57 | 13 | 30 | — | 21,000 | 1.51 | — | A | A |

TABLE 2

| | | | Resin having Infrared Absorbing Group | | | |
|---|---|---|---|---|---|---|
| | | | Copolymerization Component | | | |
| | Pigment | Resin Name | First Component | Second Component | Third Component | Fourth Component |
| Dispersion 35 | Pig-1 | C-ppb-1-P1 | C-ppb-1 | co-1 | co-5 | — |
| Dispersion 36 | Pig-2 | C-ppb-2-P1 | C-ppb-2 | — | co-5 | — |
| Dispersion 37 | Pig-1 | C-ppb-3-P1 | C-ppb-3 | — | co-6 | — |
| Dispersion 38 | Pig-1 | C-ppb-4-P1 | C-ppb-4 | — | co-5 | — |
| Dispersion 39 | Pig-2 | C-ppb-5-P1 | C-ppb-5 | — | co-5 | — |
| Dispersion 40 | Pig-4 | C-ppb-6-P1 | C-ppb-6 | co-1 | co-7 | — |
| Dispersion 41 | Pig-4 | C-ppb-7-P1 | C-ppb-7 | co-3 | co-5 | — |
| Dispersion 42 | Pig-3 | C-ppb-8-P1 | C-ppb-8 | — | co-5 | — |
| Dispersion 43 | Pig-1/Pig-3 = 1/1 | C-ppb-1-P1 | C-ppb-1 | co-1 | co-5 | — |
| Dispersion 44 | Pig-5 | C-sq-1-P1 | C-sq-1 | co-1 | co-5 | — |
| Dispersion 45 | Pig-6 | C-sq-2-P1 | C-sq-2 | — | co-7 | — |
| Dispersion 46 | Pig-6 | C-sq-3-P1 | C-sq-3 | — | co-5 | — |
| Dispersion 47 | Pig-5 | C-sq-4-P1 | C-sq-4 | — | co-6 | — |
| Dispersion 48 | Pig-5/Pig-6/Pig-7 = 1/1/1 | C-sq-2-P1 | C-sq-1 | co-1 | co-5 | — |
| Dispersion 49 | Pig-6 | C-sq-2-P1/C-sq-3-P1 = 1/1 | C-sq-2 C-sq-3 | — — | co-7 co-5 | — — |
| Dispersion 50 | Pig-8 | C-cy-1-P1 | C-cy-1 | — | co-5 | — |
| Dispersion 51 | Pig-8 | C-cy-2-P1 | C-cy-2 | — | co-7 | — |
| Dispersion 52 | Pig-8 | C-cy-3-P1 | C-cy-3 | — | co-5 | — |
| Dispersion 53 | Pig-9 | C-ox-1-P1 | C-ox-1 | co-4 | co-5 | — |
| Dispersion 54 | Pig-9 | C-ox-2-P1 | C-ox-2 | — | co-6 | — |
| Dispersion 55 | Pig-9 | C-ox-3-P1 | C-ox-3 | — | co-5 | — |
| Dispersion 56 | Pig-10 | C-ph-1-P1 | C-ph-1 | — | co-5 | — |
| Dispersion 57 | Pig-10 | C-ph-2-P1 | C-ph-2 | — | co-7 | — |
| Dispersion 58 | Pig-10 | C-ph-1-P1/C-ph-1-P2 = 1/1 | C-ph-1 C-ph-2 | — — | co-5 co-7 | — — |
| Dispersion 59 | Pig-11 | C-na-1-P1 | C-na-1 | — | co-7 | — |
| Dispersion 60 | Pig-11 | C-na-2-P1 | C-na-2 | — | co-5 | — |
| Dispersion 61 | Pig-12 | C-cr-1-P1 | C-cr-1 | — | co-7 | — |

TABLE 2-continued

| | Resin having Infrared Absorbing Group | | | | | | | | |
|---|---|---|---|---|---|---|---|---|---|
| | Copolymerization Component Weight Ratio | | | | Weight-Average | Acid | | | |
| | First Component | Second Component | Third Component | Fourth Component | Molecular Weight (Mw) | Value (mmol/g) | Resin | Viscosity | Particle Size |
| Dispersion 35 | 63 | 12 | 25 | — | 18,000 | 1.39 | — | A | A |
| Dispersion 36 | 55 | — | 45 | — | 22,000 | — | — | A | A |
| Dispersion 37 | 57 | — | 43 | — | 30,000 | — | — | B | A |
| Dispersion 38 | 53 | — | 47 | — | 24,000 | — | — | A | A |
| Dispersion 39 | 75 | — | 25 | — | 21,000 | — | — | B | B |
| Dispersion 40 | 77 | 12 | 11 | — | 28,000 | 1.39 | — | A | A |
| Dispersion 41 | 42 | 32 | 26 | — | 25,000 | 1.02 | — | A | A |
| Dispersion 42 | 36 | — | 64 | — | 26,000 | — | — | B | B |
| Dispersion 43 | 63 | 12 | 25 | — | 18,000 | 1.39 | — | A | A |
| Dispersion 44 | 49 | 10 | 41 | — | 32,000 | 1.16 | — | A | A |
| Dispersion 45 | 56 | — | 44 | — | 28,000 | — | — | A | A |
| Dispersion 46 | 55 | — | 45 | — | 26,000 | — | — | A | A |
| Dispersion 47 | 46 | — | 54 | — | 33,000 | — | — | B | A |
| Dispersion 48 | 49 | 10 | 41 | — | 32,000 | 1.16 | — | A | A |
| Dispersion 49 | 56 | — | 44 | — | 28,000 | — | — | A | A |
| | 55 | — | 45 | — | 26,000 | | | | |
| Dispersion 50 | 49 | — | 51 | — | 21,000 | — | — | A | A |
| Dispersion 51 | 69 | — | 31 | — | 22,000 | — | — | A | A |
| Dispersion 52 | 58 | — | 42 | — | 31,000 | — | — | B | B |
| Dispersion 53 | 44 | 20 | 36 | — | 28,000 | 0.87 | — | A | A |
| Dispersion 54 | 57 | — | 43 | — | 29,000 | — | — | A | A |
| Dispersion 55 | 63 | — | 37 | — | 24,000 | — | — | B | B |
| Dispersion 56 | 62 | — | 38 | — | 22,000 | — | — | A | A |
| Dispersion 57 | 47 | — | 53 | — | 26,000 | — | — | B | A |
| Dispersion 58 | 62 | — | 38 | — | 22,000 | — | — | B | A |
| | 47 | — | 53 | — | 26,000 | | | | |
| Dispersion 59 | 68 | — | 32 | — | 28,000 | — | — | A | A |
| Dispersion 60 | 49 | — | 51 | — | 29,000 | — | — | B | A |
| Dispersion 61 | 59 | — | 41 | — | 23,000 | — | — | A | A |

TABLE 3

| | Pigment | Resin having Infrared Absorbing Group | Weight-Average Molecular Weight (Mw) of Resin having Infrared Absorbing Group | Resin | Viscosity | Particle Size |
|---|---|---|---|---|---|---|
| Dispersion 100 | Pig-1 | B-ppb-1 | 12,000 | | | |
| Dispersion 101 | Pig-1 | B-ppb-1 | 12,000 | | | |
| Dispersion 102 | Pig-1 | B-ppb-2 | 5,000 | — | B | A |
| Dispersion 113 | Pig-1 | B-ppb-3 | 11,000 | — | A | A |

TABLE 3-continued

| | Pigment | Resin having Infrared Absorbing Group | Weight-Average Molecular Weight (Mw) of Resin having Infrared Absorbing Group | Resin | Viscosity | Particle Size |
|---|---|---|---|---|---|---|
| Dispersion 104 | Pig-1 | B-ppb-4 | 11,000 | — | A | A |
| Dispersion 105 | Pig-1 | B-ppb-5 | 5,000 | — | B | A |
| Dispersion 106 | Pig-1 | B-ppb-6 | 20,000 | — | A | A |
| Dispersion 107 | Pig-1 | B-ppb-7 | 13,000 | — | A | A |
| Dispersion 108 | Pig-2 | B-ppb-7 | 13,000 | D-1 | A | A |
| Dispersion 109 | Pig-3 | B-ppb-8 | 12,000 | — | A | A |
| Dispersion 110 | Pig-4 | B-ppb-9 | 13,000 | — | A | A |
| Dispersion 111 | Pig-1/pig-3 = 1/1 | B-ppb-1 | 12,000 | — | A | A |
| Dispersion 112 | Pig-1/Pig-3 = 1/1 | B-ppb-1/B-ppb-2/ B-ppb-7 = 1/1/2 | 5,000 12,000 11,000 | — — — | A | A |
| Dispersion 113 | Pig-5 | B-sq-1 | 11,000 | — | A | A |
| Dispersion 114 | Pig-6 | B-sq-1 | 11,000 | — | A | A |
| Dispersion 115 | Pig-7 | B-sq-2 | 11,000 | D-1 | A | A |
| Dispersion 116 | Pig-7 | B-sq-3 | 25,000 | — | A | A |
| Dispersion 117 | Pig-7 | B-sq-2/B-sq-3-1/1 | 11,000 25,000 | — — | A A | A A |
| Dispersion 118 | Pig-8 | B-cy-1 | 12,000 | — | A | A |
| Dispersion 119 | Pig-8 | B-cy-2 | 13,000 | — | A | A |
| Dispersion 120 | Pig-9 | B-ox-1 | 15,000 | — | A | A |
| Dispersion 121 | Pig-10 | B-ox-2 | 13,000 | D-2 | A | A |
| Dispersion 122 | Pig-10 | B-ph-1 | 15,000 | — | A | A |
| Dispersion 123 | Pig-11 | B-na-1 | 15,000 | — | A | A |
| Dispersion 124 | Pig-12 | B-cr-1 | 14,000 | — | A | A |

TABLE 4

| | Pigment | Derivative | Resin | Viscosity | Particle Size |
|---|---|---|---|---|---|
| Comparative Dispersion 1 | Pig-1 | — | D-1 | D | D |
| Comparative Dispersion 2 | Pig-1 | — | D-2 | D | D |
| Comparative Dispersion 3 | Pig-1 | B-1 | D-2 | D | D |
| Comparative Dispersion 4 | Pig-1 | B-2 | D-1 | D | D |
| Comparative Dispersion 5 | Pig-6 | B-1 | D-2 | D | D |
| Comparative Dispersion 6 | Pig-8 | B-1 | D-2 | D | D |

In tables 1 to 4, in a case where two or more components were used, each of ratios shown in the columns of the components represent a mass ratio.

The details of the compounds shown in Table 1 to 4 are as follows. Me represents a methyl group, Et represents an ethyl group, Bu represents a n-butyl group, and Ph represents a phenyl group.

Pig-1 to Pig-12 represent the same compounds as the above-described compounds.

A-ppb-1 to A-ppb-10, A-sq-1 to A-sq-5, A-cy-1 to A-cy-4, A-ox-1 to A-ox-4, A-ph-1 to A-ph-3, A-na-1 to A-na-3, A-cr-1, C-ppb-1 to C-ppb-8, C-sq-1 to C-sq-4, C-cy-1 to C-cy-3, C-ox-1 to C-ox-3, C-ph-1, C-ph-2, C-na-1, C-na-2, and C-cr-1 represent the same constitutional units as the above-described constitutional units.

co-1 to co-10 represent the same constitutional units as the above-described constitutional units.

B-ppb-1 to B-ppb-9, B-sq-1 to B-sq-3, B-cy-1, B-cy-2, B-ox-1, B-ox-2, B-ph-1, B-na-1, and B-cr-1 represent the same compounds as the above-described compounds.

(Resin)

D-1: a resin having the following structure (acid value=105 mgKOH/g, weight-average molecular weight=8,000; a numerical value added to a main chain represents a mass ratio of a repeating unit; a numerical value added to a side chain represents the number of repeating units)

D-2: a resin having the following structure (acid value=32.3 mgKOH/g, amine value=45.0 mgKOH/g, weight-average molecular weight=22,900; a numerical value added to a main chain represents a mass ratio of a repeating unit; a numerical value added to a side chain represents the number of repeating units)

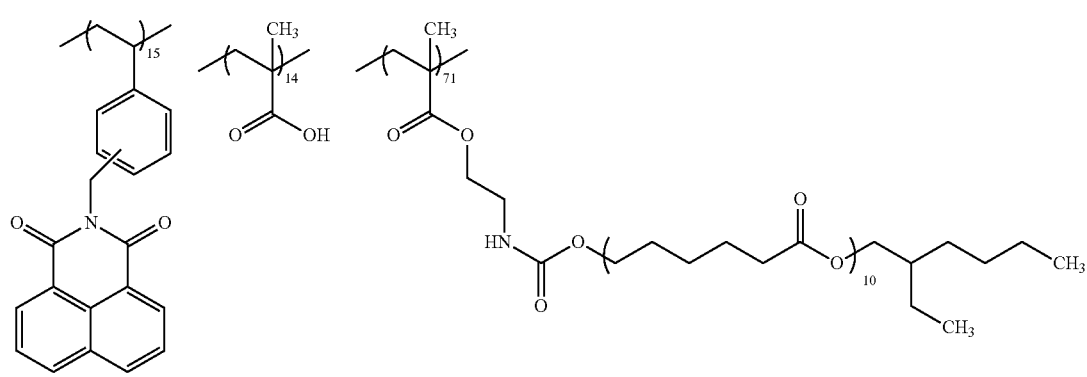

(D-1)

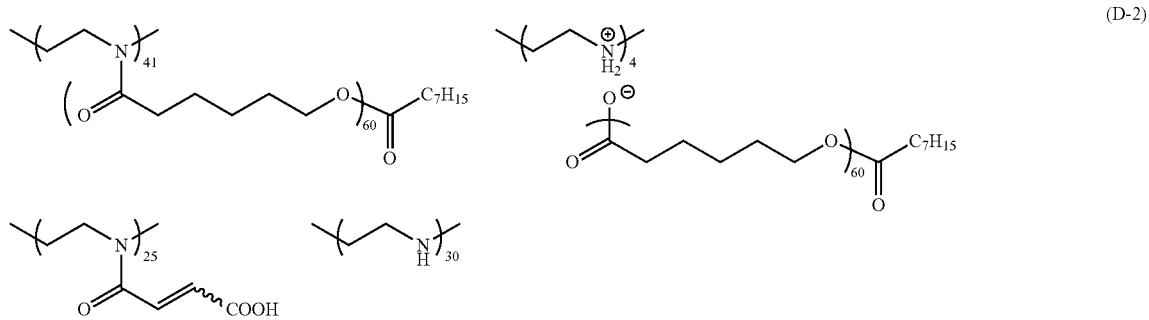

(D-2)

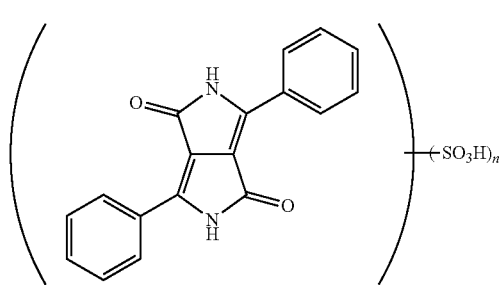

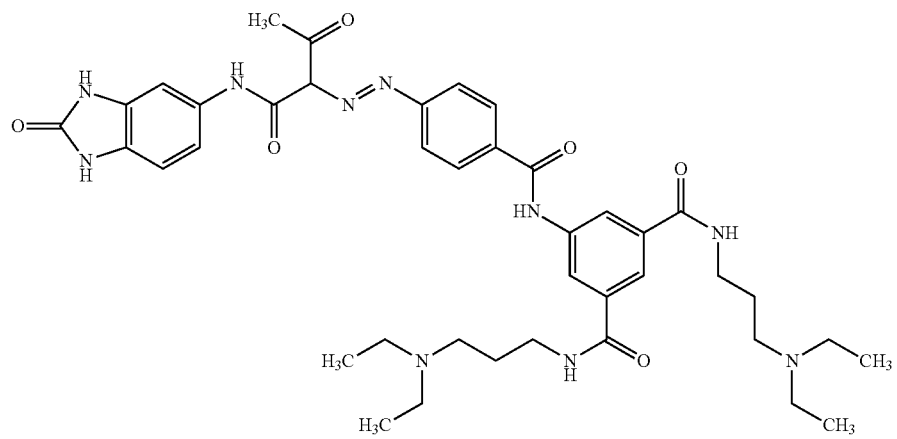

B-1

B-2

<Preparation of Resin Composition>

The following components were mixed with each other to prepare a resin composition.

(Composition of Resin Composition)

Dispersion shown in Tables 5 to 8 obtained as described above: 55 parts by mass

Resin: 7.0 parts by mass

Polymerizable compound: 4.5 parts by mass

Photopolymerization initiator: 0.8 parts by mass

Polymerization inhibitor (p-methoxyphenol): 0.001 parts by mass

Surfactant (the following mixture (Mw=14000); in the following formula, "%" (62% and 38%) representing the proportion of a constitutional unit is mass %): 0.03 parts by mass Ultraviolet absorber (UV-503, manufactured by Daito Chemical Co., Ltd.): 1.3 parts by mass Solvent (propylene glycol monomethyl ether acetate): 31 parts by mass

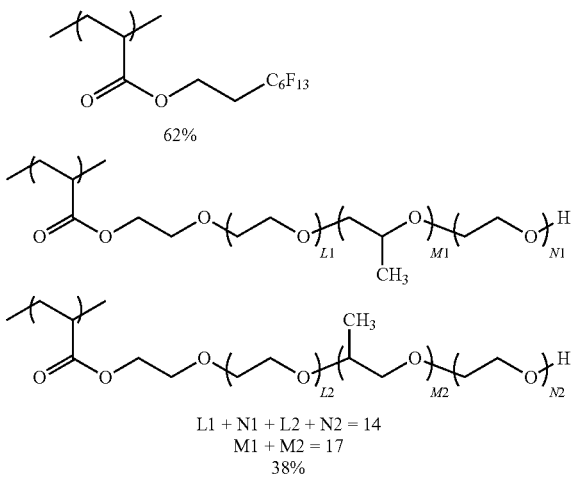

L1 + N1 + L2 + N2 = 14
M1 + M2 = 17
38%

<Preparation of Cured Film>

The resin composition was applied to a glass substrate using a spin coating method and then was heated using a hot plate at 100° C. for 2 minutes. As a result, a composition layer was obtained. The obtained composition layer was exposed using an i-ray stepper at an exposure dose of 500 mJ/cm². Next, a curing treatment was further performed on the exposed composition layer using a hot plate at 220° C. for 5 minutes. As a result, a cured film having a thickness of 0.7 μm was obtained.

<Evaluation of Visible Transparency>

The transmittance of the cured film formed using each of the resin compositions shown in Tables 5 to 8 in a wavelength range of 400 nm to 650 nm was measured using a spectrophotometer U-4100 (manufactured by Hitachi High-Technologies Corporation). The maximum transmittance in a wavelength range of 400 nm to 650 nm was evaluated based on the following standards.

A: the maximum transmittance was 90% or higher
B: the maximum transmittance was 85% or higher and lower than 90%
C: the maximum transmittance was lower than 85%

<Evaluation of Foreign Matter Defects>

Each of the resin compositions obtained as described above was applied to a glass wafer using a spin coating method such that the thickness after the application was 0.3 μm, and then was heated using a hot plate at 100° C. for 2 minutes. Next, the coating film was exposed using an i-ray stepper exposure device FPA-3000 i5+ (manufactured by Canon Corporation) at 1000 mJ/cm². Next, the coating film was heated using a hot plate at 220° C. for 5 minutes to form a film. The substrate on which the film was formed was observed using a scanning electron microscope S-4800 (manufactured by Hitachi High-Technologies Corporation) at a magnification of 10,000-fold to evaluate foreign matters.

A: the number of foreign matters was 0
B: the number of foreign matters was 1 to 3
C: the number of foreign matters was 4 to 30
D: the number of foreign matters was 31 or more

TABLE 5

| | Dispersion | Resin | Polymerizable Compound | Photopolymerization Initiator | Visible Transparency | Foreign Matter Defect |
|---|---|---|---|---|---|---|
| Example 1 | Dispersion 1 | E-1 | M-1 | C-7 | A | A |
| Example 2 | Dispersion 2 | E-1 | M-1 | C-8 | A | A |
| Example 3 | Dispersion 3 | E-1 | M-2 | C-7 | A | A |
| Example 4 | Dispersion 4 | E-1/E-2 = 2/1 | M-1 | C-7 | A | A |
| Example 5 | Dispersion 5 | E-1 | M-1/M-2 = 1/1 | C-7 | A | A |
| Example 6 | Dispersion 6 | E-1 | M-1 | C-7 | A | A |
| Example 7 | Dispersion 7 | E-1 | M-1 | C-8 | A | A |
| Example 8 | Dispersion 8 | E-1/E-3 = 2/1 | M-3 | C-7 | A | A |
| Example 9 | Dispersion 9 | E-1 | M-1 | C-7 | A | A |
| Example 10 | Dispersion 10 | E-1 | M-1/M-3 = 2/1 | C-7 | A | A |
| Example 11 | Dispersion 11 | E-1 | M-1 | C-8 | A | A |
| Example 12 | Dispersion 12 | E-1 | M-1/M-3 = 3/1 | C-7 | A | A |
| Example 13 | Dispersion 13 | E-1 | M-1 | C-7 | A | A |
| Example 14 | Dispersion 14 | E-1 | M-1/M-2 = 3/1 | C-7 | A | A |
| Example 15 | Dispersion 15 | E-1 | M-1 | C-7 | A | A |
| Example 16 | Dispersion 16 | E-1 | M-1/M-3 = 1/1 | C-7 | A | A |
| Example 17 | Dispersion 17 | E-1 | M-1 | C-7 | A | A |
| Example 18 | Dispersion 18 | E-1 | M-1/M-2 = 3/1 | C-8 | A | A |
| Example 19 | Dispersion 19 | E-1 | M-1 | C-7 | A | A |
| Example 20 | Dispersion 20 | E-1/E-3 = 3/1 | M-2 | C-7 | A | A |
| Example 21 | Dispersion 21 | E-1 | M-1 | C-7 | A | A |
| Example 22 | Dispersion 22 | E-1 | M-1/M-3 = 3/1 | C-8 | A | A |
| Example 23 | Dispersion 23 | E-1 | M-1 | C-7 | A | A |
| Example 24 | Dispersion 24 | E-1 | M-2 | C-7 | A | A |
| Example 25 | Dispersion 25 | E-1 | M-1/M-2/M-3 = 2/1/1 | C-7 | A | A |
| Example 26 | Dispersion 26 | E-1 | M-1 | C-7 | A | A |
| Example 27 | Dispersion 27 | E-1 | M-1/M-2 = 2/1 | C-8 | A | A |
| Example 28 | Dispersion 28 | E-1/E-2 = 1/1 | M-1 | C-7 | A | A |
| Example 29 | Dispersion 29 | E-1 | M-3 | C-7 | A | A |
| Example 30 | Dispersion 30 | E-1 | M-2 | C-8 | A | A |
| Example 31 | Dispersion 31 | E-1 | M-1 | C-7 | A | A |
| Example 32 | Dispersion 32 | E-1/E-2/E-3 = 2/1/1 | M-3 | C-8 | A | A |
| Example 33 | Dispersion 33 | E-1 | M-1 | C-7 | A | A |
| Example 34 | Dispersion 34 | E-1 | M-2 | C-7 | A | A |

TABLE 6

|  | Dispersion | Resin | Polymerizable Compound | Photopolymerization Initiator | Visible Transparency | Foreign Matter Defect |
|---|---|---|---|---|---|---|
| Example 35 | Dispersion 35 | E-1 | M-1 | C-7 | A | A |
| Example 36 | Dispersion 36 | E-1 | M-1 | C-7 | A | A |
| Example 37 | Dispersion 37 | E-1 | M-1/M-2 = 3/1 | C-8 | A | A |
| Example 38 | Dispersion 38 | E-1 | M-2 | C-7 | A | A |
| Example 39 | Dispersion 39 | E-1 | M-1 | C-7 | A | A |
| Example 40 | Dispersion 40 | E-1/E-2 = 2/1 | M-1 | C-7 | A | A |
| Example 41 | Dispersion 41 | E-1 | M-1 | C-8 | A | A |
| Example 42 | Dispersion 42 | E-1 | M-3 | C-7 | A | A |
| Example 43 | Dispersion 43 | E-1 | M-1 | C-7 | A | A |
| Example 44 | Dispersion 44 | E-1 | M-1 | C-7 | A | A |
| Example 45 | Dispersion 45 | E-1 | M-2 | C-7 | A | A |
| Example 46 | Dispersion 46 | E-1 | M-1 | C-8 | A | A |
| Example 47 | Dispersion 47 | E-1/E-3 = 2/1 | M-1/M-2 = 1/1 | C-7 | A | A |
| Example 48 | Dispersion 48 | E-1 | M-1 | C-8 | A | A |
| Example 49 | Dispersion 49 | E-1 | M-1/M-2 = 1/1 | C-7 | A | A |
| Example 50 | Dispersion 50 | E-1 | M-1 | C-7 | A | A |
| Example 51 | Dispersion 51 | E-1 | M-2 | C-7 | A | A |
| Example 52 | Dispersion 52 | E-1 | M-1 | C-7 | A | A |
| Example 53 | Dispersion 53 | E-1 | M-1/M-3 = 3/1 | C-7 | A | A |
| Example 54 | Dispersion 54 | E-1 | M-1 | C-7 | A | A |
| Example 55 | Dispersion 55 | E-1 | M-1 | C-8 | A | A |
| Example 56 | Dispersion 56 | E-1/E-3 = 3/1 | M-1 | C-8 | A | A |
| Example 57 | Dispersion 57 | E-1 | M-2 | C-7 | A | A |
| Example 58 | Dispersion 58 | E-1/E-2 = 3/1 | M-1 | C-8 | A | A |
| Example 59 | Dispersion 59 | E-1 | M-1 | C-7 | A | A |
| Example 60 | Dispersion 60 | E-1 | M-1/M-3 = 1/1 | C-8 | A | A |
| Example 61 | Dispersion 61 | E-1 | M-1 | C-7 | A | A |

TABLE 7

|  | Dispersion | Resin | Polymerizable Compound | Photopolymerization Initiator | Visible Transparency | Foreign Matter Defect |
|---|---|---|---|---|---|---|
| Example 100 | Dispersion 100 | E-1 | M-1 | C-7 | A | A |
| Example 101 | Dispersion 101 | E-1 | M-2 | C-7 | A | A |
| Example 102 | Dispersion 102 | E-1 | M-1 | C-7 | A | A |
| Example 103 | Dispersion 113 | E-1/E-2 = 2/1 | M-1 | C-8 | A | A |
| Example 104 | Dispersion 104 | E-1 | M-3 | C-7 | A | A |
| Example 105 | Dispersion 105 | E-1 | M-1 | C-7 | A | A |
| Example 106 | Dispersion 106 | E-1/E-3 = 2/1 | M-1 | C-7 | A | A |
| Example 107 | Dispersion 107 | E-1 | M-1 | C-7 | A | A |
| Example 108 | Dispersion 108 | E-1 | M-1/M-2 = 3/1 | C-7 | A | A |
| Example 109 | Dispersion 109 | E-1 | M-1 | C-7 | A | A |
| Example 110 | Dispersion 110 | E-1 | M-2 | C-8 | A | A |
| Example 111 | Dispersion 111 | E-1 | M-1 | C-7 | A | A |
| Example 112 | Dispersion 112 | E-1 | M-1 | C-7 | A | A |
| Example 113 | Dispersion 113 | E-1 | M-1 | C-7 | A | A |
| Example 114 | Dispersion 114 | E-1/E-3 = 2/1 | M-1 | C-7 | A | A |
| Example 115 | Dispersion 115 | E-1 | M-1/M-2 = 1/1 | C-7 | A | A |
| Example 116 | Dispersion 116 | E-1/E-2 = 2/1 | M-1/M-3 = 3/1 | C-8 | A | A |
| Example 117 | Dispersion 117 | E-1 | M-1 | C-7 | A | A |
| Example 118 | Dispersion 118 | E-1 | M-1 | C-7 | A | A |
| Example 119 | Dispersion 119 | E-1 | M-1 | C-8 | A | A |
| Example 120 | Dispersion 120 | E-1 | M-1 | C-7 | A | A |
| Example 121 | Dispersion 121 | E-1 | M-1/M-3 = 2/1 | C-7 | A | A |
| Example 122 | Dispersion 122 | E-1/E-2 = 2/1 | M-1 | C-8 | A | A |
| Example 123 | Dispersion 123 | E-1 | M-1 | C-7 | A | A |
| Example 124 | Dispersion 124 | E-1 | M-1 | C-7 | A | A |

TABLE 8

|  | Dispersion | Resin | Polymerizable Compound | Photopolymerization Initiator | Visible Transparency | Foreign Matter Defect |
|---|---|---|---|---|---|---|
| Comparative Example 1 | Comparative Dispersion 1 | E-1 | M-1 | C-7 | C | C |
| Comparative Example 2 | Comparative Dispersion 2 | E-1/E-2 = 2/1 | M-1 | C-7 | C | C |
| Comparative Example 3 | Comparative Dispersion 3 | E-1 | M-1/M-2 = 2/1 | C-7 | C | D |

TABLE 8-continued

| | Dispersion | Resin | Polymerizable Compound | Photopolymerization Initiator | Visible Transparency | Foreign Matter Defect |
|---|---|---|---|---|---|---|
| Comparative Example 4 | Comparative Dispersion 4 | E-1 | M-1 | C-7 | C | D |
| Comparative Example 5 | Comparative Dispersion 5 | E-1/E-3 = 2/1 | M-1 | C-7 | C | D |
| Comparative Example 6 | Comparative Dispersion 6 | E-1 | M-1/M-3 = 3/1 | C-7 | C | D |

The details of compounds shown in Tables 5 to 8 other than the above-described compounds are as follows.

(Resin)

E-1: ACRYBASE FF-426 (manufactured by Fujikura Kasei Co., Ltd., alkali-soluble resin)

E-2: ARTON F4520 (manufactured by JSR Corporation)

E-3: ARTON D4540 (manufactured by JSR Corporation)

(Photopolymerization Initiator)

C-7: a compound having the following structure

C-8: a compound having the following structure

C-7

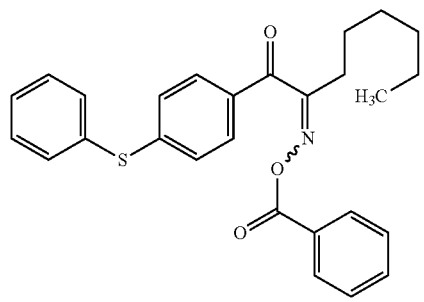

C-8

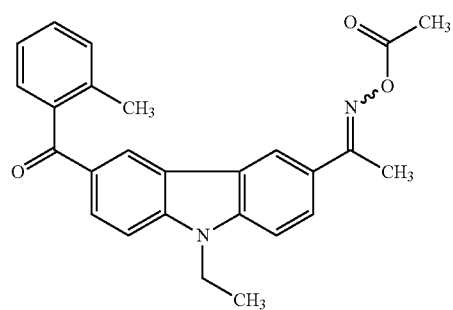

(Polymerizable Compound)

M-1: ARONIX M-305 (manufactured by Toagosei Co., Ltd.; a mixture of the following compounds; content of triacrylate: 55 mass % to 63 mass %)

M-2: KAYARAD RP-1040 (an ethylene oxide-modified pentaerythritol tetraacrylate; manufactured by Nippon Kayaku Co., Ltd.)

M-3: ARONIX M-510 (a polyfunctional acrylate compound, manufactured by Toagosei Co., Ltd.)

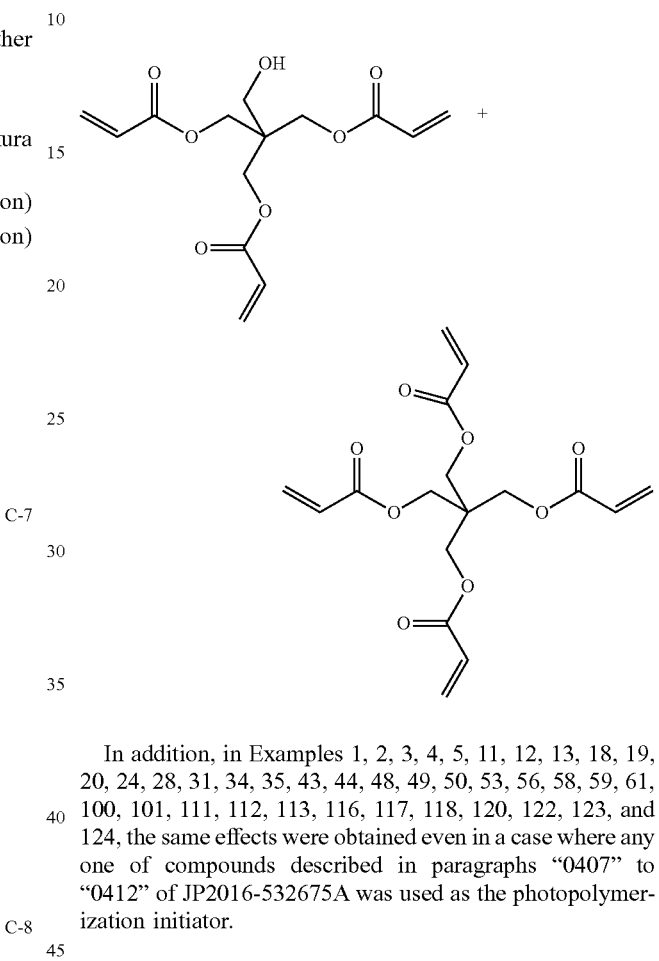

In addition, in Examples 1, 2, 3, 4, 5, 11, 12, 13, 18, 19, 20, 24, 28, 31, 34, 35, 43, 44, 48, 49, 50, 53, 56, 58, 59, 61, 100, 101, 111, 112, 113, 116, 117, 118, 120, 122, 123, and 124, the same effects were obtained even in a case where any one of compounds described in paragraphs "0407" to "0412" of JP2016-532675A was used as the photopolymerization initiator.

Example 200

The resin composition according to Example 1 was applied to a silicon wafer using a spin coating method such that the thickness of the formed film was 1.0 μm. Next, the coating film was heated using a hot plate at 100° C. for 2 minutes. Next, the coating film was heated using a hot plate at 200° C. for 5 minutes. Next, a 2 μm×2 μm Bayer pattern (infrared cut filter) was formed using a dry etching method.

The Bayer pattern refers to a pattern in which color filter elements including one Red element, two Green elements, and one Blue element were repeated in a 2×2 array as disclosed in U.S. Pat. No. 3,971,065A. In the example, filter elements including one Red element, one Green element, one Blue element, and one infrared transmitting filter element were repeated in a 2×2 array to form a Bayer pattern.

Next, the Red composition was applied to the Bayer pattern of the infrared cut filter using a spin coating method such that the thickness of the formed film was 1.0 μm Next, the coating film was heated using a hot plate at 100° C. for 2 minutes. Next, using an i-ray stepper exposure device FPA-3000 i5+ (manufactured by Canon Corporation), the coating film was exposed through a mask having a 2 μm×2 μm dot pattern at 1,000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the coating film was heated using a hot plate at 200° C. for 5 minutes. As a result, the Red composition was patterned on the Bayer pattern of the infrared cut filter. Likewise, a Green composition and a Blue composition were sequentially patterned to form red, green, and blue color patterns.

Next, the composition for forming an infrared transmitting filter (the following composition 101 or the following composition 102) was applied to the pattern-formed film using a spin coating method such that the thickness of the formed film was 2.0 μm. Next, the coating film was heated using a hot plate at 100° C. for 2 minutes. Next, using an i-ray stepper exposure device FPA-3000 i5+(manufactured by Canon Corporation), the coating film was exposed through a mask having a 2 μm×2 μm Bayer pattern at 1,000 mJ/cm². Next, puddle development was performed at 23° C. for 60 seconds using a tetramethylammonium hydroxide (TMAH) 0.3 mass % aqueous solution. Next, the coating film was rinsed by spin showering and was cleaned with pure water. Next, the silicon wafer was heated using a hot plate at 200° C. for 5 minutes. As a result, the infrared transmitting filter was patterned on a portion of the Bayer pattern of the infrared cut filter where the color pattern was not formed. This filter was incorporated into a solid image pickup element using a well-known method The obtained solid image pickup element was irradiated with infrared light emitted from an infrared light emitting diode (infrared LED) as a light source in a low-illuminance environment (0.001 Lux) to acquire images. Next, the imaging performance of the solid image pickup element was evaluated. Even in a low-illuminance environment, the image was able to be clearly recognized.

The Red composition, the Green composition, the Blue composition, and the composition for forming an infrared transmitting filter used in Example 200 are as follows.

(Red Composition)

The following components were mixed and stirred, and the obtained mixture was filtered through a nylon filter (manufactured by Pall Corporation) having a pore size of 0.45 μm to prepare a Red composition.
Red Pigment Dispersion: 51.7 parts by mass
Resin 4 (40 mass % PGMEA solution): 0.6 parts by mass
Curable compound 4: 0.6 parts by mass
Photopolymerization initiator 1: 0.3 parts by mass
Surfactant 1: 4.2 parts by mass
PGMEA: 42.6 parts by mass
(Green Composition)

The following components were mixed and stirred, and the obtained mixture was filtered through a nylon filter (manufactured by Pall Corporation) having a pore size of 0.45 μm to prepare a Green composition.
Green pigment dispersion: 73.7 parts by mass
Resin 4 (40 mass % PGMEA solution): 0.3 parts by mass
Curable compound 1: 1.2 parts by mass
Photopolymerization initiator 1: 0.6 parts by mass
Surfactant 1: 4.2 parts by mass
Ultraviolet absorber (UV-503, manufactured by Daito Chemical Co., Ltd.): 0.5 parts by mass
PGMEA: 19.5 parts by mass
(Blue Composition)

The following components were mixed and stirred, and the obtained mixture was filtered through a nylon filter (manufactured by Pall Corporation) having a pore size of 0.45 μm to prepare a Blue composition.
Blue pigment dispersion: 44.9 parts by mass
Resin 4 (40 mass % PGMEA solution): 2.1 parts by mass
Curable compound 1: 1.5 parts by mass
Curable compound 4: 0.7 parts by mass
Photopolymerization initiator 1: 0.8 parts by mass
Surfactant 1: 4.2 parts by mass
PGMEA: 45.8 parts by mass
(Composition for Forming Infrared Transmitting Filter)

The components having the following compositions were mixed and stirred, and the obtained mixture was filtered through a nylon filter (manufactured by Pall Corporation) having a pore size of 0.45 μm to prepare a composition for forming an infrared transmitting filter.
—Composition 100—
Pigment Dispersion 1-1: 46.5 parts by mass
Pigment Dispersion 1-2: 37.1 parts by mass
Curable compound 5: 1.8 parts by mass
Resin 4: 1.1 parts by mass
Photopolymerization initiator 2: 0.9 parts by mass
Surfactant 1: 4.2 parts by mass
Polymerization inhibitor (p-methoxyphenol): 0.001 parts by mass
Silane coupling agent: 0.6 parts by mass
PGMEA: 7.8 parts by mass
—Composition 101—
Pigment dispersion 2-1: 1,000 parts by mass
Curable compound (dipentaerythritol hexaacrylate): 50 parts by mass
Resin: 17 parts by mass
Photopolymerization initiator (1-[4-(phenylthio)]-1,2-octanedione-2-(O-benzoyloxime)): 10 parts by mass
PGMEA: 179 parts by mass
Alkali-soluble polymer F-1: 17 parts by mass (concentration of solid contents: 35 parts by mass)

Synthesis Example of Alkali-Soluble Polymer F-1

In a reaction vessel, 14 parts of benzyl methacrylate, 12 parts of N-phenylmaleimide, 15 parts of 2-hydroxyethyl methacrylate, 10 parts of styrene, and 20 parts of methacrylic acid were dissolved in 200 parts of propylene glycol monomethyl ether acetate, and 3 parts of 2,2'-azoisobutyronitrile and 5 parts of a-methylstyrene dimer were further put thereinto. After nitrogen purge, the inside of the reaction vessel was heated at 80° C. for 5 hours under stirring and nitrogen bubbling. As a result, a solution including an alkali-soluble polymer F-1 (concentration of solid contents: 35 mass %) was obtained. In this polymer, the weight-average molecular weight in terms of polystyrene was 9,700, the number-average molecular weight was 5,700, and Mw/Mn was 1.70.

Pigment Dispersion 2-1

60 parts of C.I. Pigment Black 32, 20 parts of C.I. Pigment Blue 15:6, 20 parts of C.I. Pigment Yellow 139, 80 parts by mass of SOLSPERSE 76500 (manufactured by Lubrication Technology Inc., concentration of solid contents: 50 mass %), 120 parts (concentration of solid contents: 35 mass %) of the solution including the alkali-soluble polymer F-1, and 700 parts of propylene glycol monomethyl ether acetate were mixed with each other, and the obtained mixture was dispersed using a paint shaker for 8 hours. As a result, a colorant dispersion 2-1 was obtained.

Raw materials used in the Red composition, the Green composition, the Blue composition, and the composition for forming an infrared transmitting filter are as follows.

Red Pigment Dispersion 9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2,000 kg/cm$^3$ at a flow rate of 500 g/min. This dispersing treatment was repeated 10 times. As a result, a Blue pigment dispersion was obtained.

Pigment Dispersion 1-1

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, Pigment Dispersion 1-1 was prepared.

Mixed pigment including a red pigment (C.I. Pigment Red 254) and a yellow pigment (C.I. Pigment Yellow 139): 11.8 parts by mass Resin (Disperbyk-111, manufactured by BYK Chemie): 9.1 parts by mass PGMEA: 79.1 parts by mass Pigment Dispersion 1-2

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, Pigment Dispersion 1-2 was prepared.

Mixed pigment including a blue pigment (C.I. Pigment Blue 15:6) and a violet pigment (C.I. Pigment Violet 23): 0.12.6 parts by mass Resin (Disperbyk-111, manufactured by BYK Chemie): 2.0 parts by mass Resin A: 3.3 parts by mass Cyclohexanone: 31.2 parts by mass PGMEA: 50.9 parts by mass Resin A: the following structure (Mw=14,000, a ratio in each constitutional unit is a molar ratio)

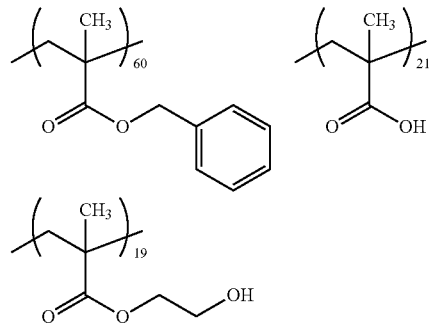

Curable compound 1: KAYARAD DPHA (a mixture of dipentaerythritol hexaacrylate and dipentaerythritol pentaacrylate, manufactured by Nippon Kayaku Co., Ltd.)

Curable Compound 4: the following structure

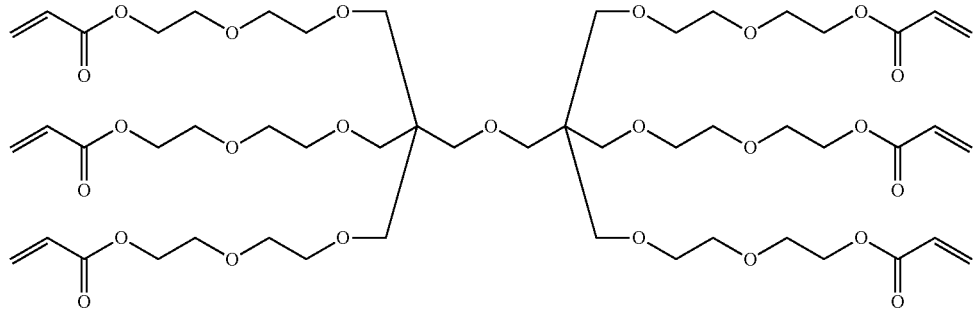 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Curable Compound 5: the following structures (a mixture in which a molar ratio between a left compound and a right compound is 7:3)

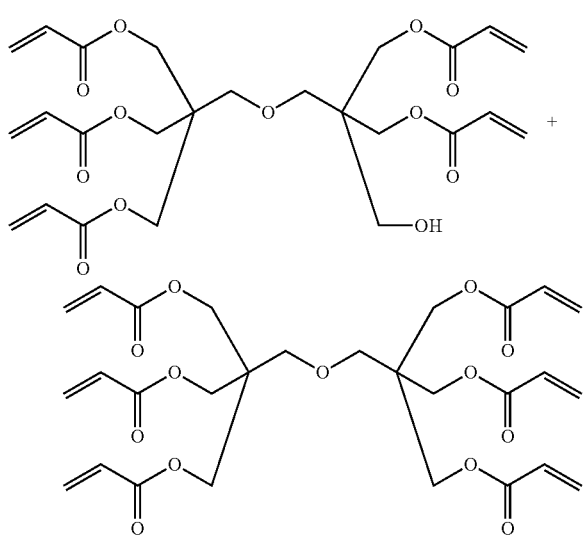

Resin 4: the following structure (acid value: 70 mgKOH/g, Mw=11,000; a ratio in each constitutional unit is a molar ratio)

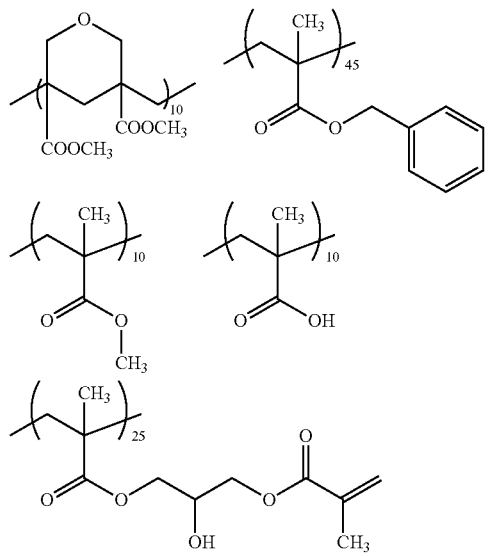

Photopolymerization initiator 1: IRGACURE-OXE01 (1-[4-(phenylthio)]-1,2-octanedione-2-(O-benzoyloxime), manufactured by BASF SE)

Photopolymerization initiator 2: the following structure

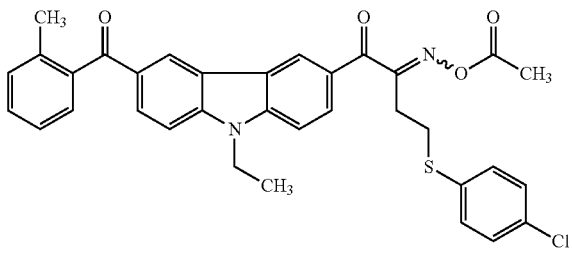 [SMILES: CCn1c2ccc(C(=O)C(CCSc3ccc(Cl)cc3)=NOC(C)=O)cc2c2cc(C(=O)c3ccccc3C)ccc21]

Surfactant 1 (a 1 mass % PGMEA solution of the following mixture (Mw=14,000); in the following formula, "%" (62% and 38%) representing the proportion of a constitutional unit is mass %)

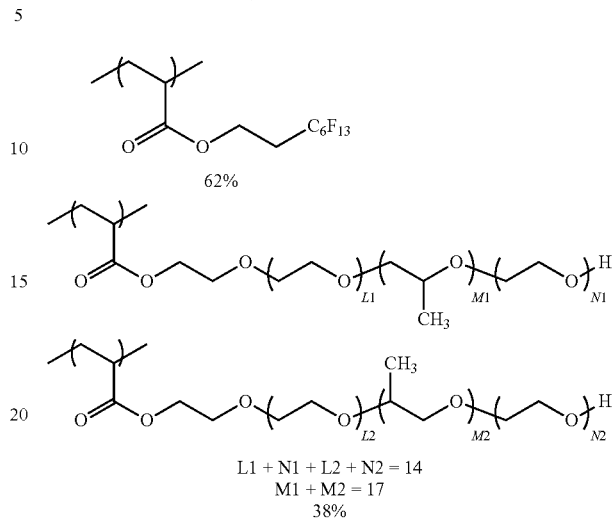

$L1 + N1 + L2 + N2 = 14$
$M1 + M2 = 17$
38%

Silane coupling agent: a compound having the following structure (in the following structural formulae, Et represents an ethyl group)

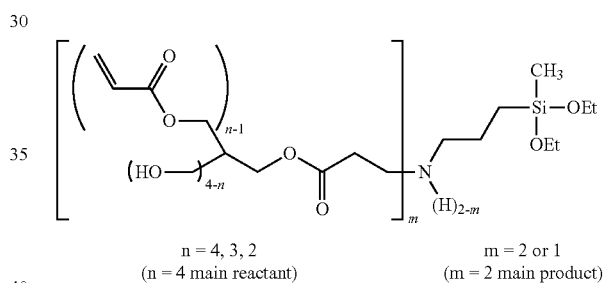

n = 4, 3, 2        m = 2 or 1
(n = 4 main reactant)   (m = 2 main product)

The disclosure of Japanese Patent Application No. 2017-035149 filed on Feb. 27, 2017 is incorporated herein in its entirety.

All publications, patent applications, and technical standards mentioned in this specification are herein incorporated by reference to the same extent as if each individual publication, patent application, or technical standard was specifically and individually indicated to be incorporated by reference.

EXPLANATION OF REFERENCES

110: solid image pickup element
111: infrared cut filter
112: color filter
114: infrared transmitting filter
115: microlens
116: planarizing layer

What is claimed is:
1. A resin composition comprising:
an infrared absorbing pigment; and
a resin having an infrared absorbing group;
wherein the infrared absorbing group is a group having at least one structure selected from the group consisting of a pyrrolopyrrole structure, a diimmonium structure, a rylene structure, a dithiol complex structure, a triaryl- methane structure, an azomethine structure, an anthraquinone structure, a dibenzofuranone structure, an oxonol structure, a squarylium structure, a croconium structure, a phthalocyanine structure, a naphthalocyanine structure, a pyrylium structure, an azulenium structure, a pyrromethene structure, and a cyanine structure.

2. The resin composition according to claim 1, wherein the infrared absorbing pigment is at least one pigment selected from the group consisting of a pyrrolopyrrole compound, a diimmonium compound, a rylene compound, a dithiol complex compound, a triarylmethane compound, an azomethine compound, an anthraquinone compound, a dibenzofuranone compound, an oxonol compound, a squarylium compound, a croconium compound, a phthalocyanine compound, a naphthalocyanine compound, a pyrylium compound, an azulenium compound, a pyrromethene compound, and a cyanine compound.

3. The resin composition according to claim 1, wherein the resin having an infrared absorbing group further includes a steric repulsive group.

4. The resin composition according to claim 1, wherein a weight-average molecular weight of the resin having an infrared absorbing group is 5,000 to 100,000.

5. The resin composition according to claim 1, further comprising:
a curable compound.

6. The resin composition according to claim 5, further comprising:
a photopolymerization initiator.

7. The resin composition according to claim 5, further comprising:
an alkali-soluble resin.

8. A film which is formed using the resin composition according to claim 1.

9. A film which is formed by curing the resin composition according to claim 5.

10. An infrared cut filter comprising:
a film that includes an infrared absorbing pigment and a resin having an infrared absorbing group;
wherein the infrared absorbing group is a group having at least one structure selected from the group consisting of a pyrrolopyrrole structure, a diimmonium structure, a rylene structure, a dithiol complex structure, a triarylmethane structure, an azomethine structure, an anthraquinone structure, a dibenzofuranone structure, an oxonol structure, a squarylium structure, a croconium structure, a phthalocyanine structure, a naphthalocyanine structure, a pyrylium structure, an azulenium structure, a pyrromethene structure, and a cyanine structure.

11. A method of manufacturing an infrared cut filter comprising:
applying the resin composition according to claim 5 to a support to form a composition layer;
exposing the composition layer in a pattern shape; and
forming a pattern by removing a portion that is not exposed during the exposure by development.

12. A method of manufacturing an infrared cut filter comprising:
forming a layer that includes an infrared absorbing pigment and a resin having an infrared absorbing group on a support;
forming a photoresist layer on the layer;
obtaining a resist pattern by patterning the photoresist layer by exposure and development; and
dry-etching the layer by using the resist pattern as an etching mask.

13. A solid image pickup element comprising:
a film that includes an infrared absorbing pigment and a resin having an infrared absorbing group;
wherein the infrared absorbing group is a group having at least one structure selected from the group consisting of a pyrrolopyrrole structure, a diimmonium structure, a rylene structure, a dithiol complex structure, a triarylmethane structure, an azomethine structure, an anthraquinone structure, a dibenzofuranone structure, an oxonol structure, a squarylium structure, a croconium structure, a phthalocyanine structure, a naphthalocyanine structure, a pyrylium structure, an azulenium structure, a pyrromethene structure, and a cyanine structure.

14. An infrared sensor comprising:
a film that includes an infrared absorbing pigment and a resin having an infrared absorbing group;
wherein the infrared absorbing group is a group having at least one structure selected from the group consisting of a pyrrolopyrrole structure, a diimmonium structure, a rylene structure, a dithiol complex structure, a triarylmethane structure, an azomethine structure, an anthraquinone structure, a dibenzofuranone structure, an oxonol structure, a squarylium structure, a croconium structure, a phthalocyanine structure, a naphthalocyanine structure, a pyrylium structure, an azulenium structure, a pyrromethene structure, and a cyanine structure.

15. A camera module comprising:
a solid image pickup element; and
the infrared cut filter according to claim 10.

16. The resin composition according to claim 1, wherein the infrared absorbing group is a group having at least one structure selected from the group consisting of a pyrrolopyrrole structure, a squarylium structure, a cyanine structure, a croconium structure, and a naphthalocyanine structure.

17. The resin composition according to claim 1, wherein a resin structure in the resin having an infrared absorbing group has at least one structure selected from the group consisting of an acrylic resin structure, a styrene resin structure, a polyester resin structure, a polyacrylonitrile resin structure, a polycarbonate resin structure, a polyamide resin structure, a polyurethane resin structure, a para-hydroxy styrene resin structure, an epoxy resin structure, a novolac resin structure, and a polyalkylene glycol structure.

18. The resin composition according to claim 1, wherein a resin structure in the resin having an infrared absorbing group has at least one structure selected from the group consisting of an acrylic resin structure, a styrene resin structure, a polyester resin structure, and a polyalkylene glycol structure.

19. The resin composition according to claim 1, wherein the resin having an infrared absorbing group further includes a steric repulsive group that is a polyester resin structure.

20. The resin composition according to claim 1, wherein the resin having an infrared absorbing group further includes a steric repulsive group, and the steric repulsive group is a polyester resin structure or a polyalkylene glycol structure.

21. The resin composition according to claim 1, wherein the infrared absorbing pigment is at least one pigment selected from the group consisting of a pyrrolopyrrole compound, a squarylium compound, a cyanine compound, a croconium compound, and a naphthalocyanine compound.

22. The resin composition according to claim 1,
wherein the resin having an infrared absorbing group is a resin that includes a constitutional unit having an infrared absorbing group.

23. The resin composition according to claim 1,
wherein the infrared absorbing pigment is a pyrrolopyrrole compound having a diarylborane structure.

24. The resin composition according to claim 1,
wherein the resin having an infrared absorbing group has a pyrrolopyrrole structure having a diarylborane structure.

25. The resin composition according to claim 1,
wherein the infrared absorbing group is a group that has the same π-conjugated plane structure as that of the infrared absorbing pigment.

26. The resin composition according to claim 1,
wherein a content of the infrared absorbing pigment is from 1 mass % to 50 mass % with respect to a total solid content of the resin composition.

27. The resin composition according to claim 1,
wherein a content of the resin having an infrared absorbing group is from 0.1 mass % to 30 mass % with respect to a total solid content of the resin composition.

28. The resin composition according to claim 7,
wherein the alkali-soluble resin is at least one resin selected from the group consisting of a polyhydroxystyrene resin, a polysiloxane resin, an acrylic resin, an acrylamide resin, an acryl/acrylamide copolymer resin, and a resin that includes a constitutional unit represented by the following Formula (ED):

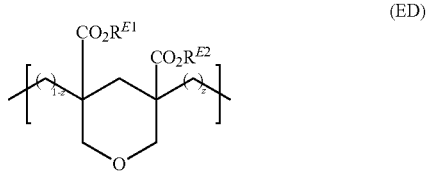

(ED)

wherein, in Formula (ED), $R^{E1}$ and $R^{E2}$ each independently represent a hydrogen atom or a hydrocarbon group having 1 to 25 carbon atoms which may have a substituent; and z represents 0 or 1.

29. The resin composition according to claim 5,
wherein the curable compound is an ethylenically unsaturated compound.

* * * * *